US011674080B2

(12) United States Patent
Leung et al.

(10) Patent No.: US 11,674,080 B2
(45) Date of Patent: Jun. 13, 2023

(54) TRANSITION METAL COMPLEX, POLYMER, MIXTURE, FORMULATION AND USE THEREOF

(71) Applicant: GUANGZHOU CHINARAY OPTOELECTRONIC MATERIALS LTD., Guangdong (CN)

(72) Inventors: Chi Ming Leung, Guangdong (CN); Hong Huang, Guangdong (CN); Junyou Pan, Guangdong (CN)

(73) Assignee: GUANGZHOU CHINARAY OPTOELECTRONIC MATERIALS LTD., Guangdong (CN)

( * ) Notice: Subject to any disclaimer, the term of this patent is extended or adjusted under 35 U.S.C. 154(b) by 293 days.

(21) Appl. No.: 16/772,688

(22) PCT Filed: Dec. 6, 2018

(86) PCT No.: PCT/CN2018/119619
§ 371 (c)(1),
(2) Date: Jun. 12, 2020

(87) PCT Pub. No.: WO2019/114608
PCT Pub. Date: Jun. 20, 2019

(65) Prior Publication Data

US 2020/0325393 A1 Oct. 15, 2020

(30) Foreign Application Priority Data

Dec. 14, 2017 (CN) ......................... 201711342791.6

(51) Int. Cl.
*C09K 11/06* (2006.01)
*C07F 15/00* (2006.01)
*H01L 51/00* (2006.01)

(52) U.S. Cl.
CPC .............. *C09K 11/06* (2013.01); *C07F 15/00* (2013.01); *H01L 51/0085* (2013.01);
(Continued)

(58) Field of Classification Search
None
See application file for complete search history.

(56) References Cited

U.S. PATENT DOCUMENTS 6,824,895 B1 11/2004 Sowinski et al.
6,830,828 B2 12/2004 Thompson et al.
(Continued)

FOREIGN PATENT DOCUMENTS

CN 1554128 A 12/2004
CN 1589307 A 3/2005
(Continued)

OTHER PUBLICATIONS

Khamylov et al. (Russian J. Gen. Chem. 2009, 79(1), pp. 31-36).*
(Continued)

*Primary Examiner* — Jay Yang
(74) *Attorney, Agent, or Firm* — PV IP PC; Wei Te Chung; Zhigang Ma

(57) ABSTRACT

Disclosed are a transition metal complex, a polymer, a mixture, a composition and the use thereof, wherein the
(Continued)

transition metal complex has a structure of the general formula as shown in formula (1):

(1)

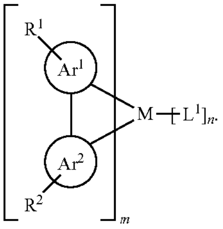

The transition metal complex has a novel structure, and is an iridium (III) complex comprising rigid cycloalkyl groups. Since this type of auxiliary ligand increases the rigidity and symmetry of a molecule, the rigidity of a molecule is increased relative to a common ligand without the cycloalkyl groups, and as such, the whole complex has better chemical, optical, electrical and thermal stabilities. At the same time, since the modification occurs on the auxiliary ligand, the effect on the wavelength of the luminous maximum peak caused by a main ligand is relatively low, and therefore, a saturated luminous color may be retained. Therefore, the use of the transition metal complex according to the present invention in OLEDs, in particular as a doping material of a luminous layer, can provide a relatively high luminous efficiency and a relatively long lifetime of the device.

19 Claims, 1 Drawing Sheet

(52) U.S. Cl.
CPC ...... *H01L 51/0087* (2013.01); *H01L 51/0088* (2013.01); *C09K 2211/183* (2013.01); *C09K 2211/185* (2013.01); *C09K 2211/187* (2013.01); *C09K 2211/188* (2013.01)

(56) References Cited

U.S. PATENT DOCUMENTS

| | | | |
|---|---|---|---|
| 6,835,469 | B2 | 12/2004 | Kwong et al. |
| 7,029,766 | B2 | 4/2006 | Huo et al. |
| 7,396,598 | B2 | 7/2008 | Takeuchi et al. |
| 7,470,928 | B2 | 12/2008 | Jeong et al. |
| 8,269,317 | B2 | 9/2012 | Alleyne et al. |
| 8,608,986 | B2 | 12/2013 | Akino et al. |
| 9,169,282 | B2 | 10/2015 | Stoessel et al. |
| 9,217,004 | B2 | 12/2015 | Ma et al. |
| 9,455,409 | B2 | 9/2016 | Lee et al. |
| 9,660,198 | B2 | 5/2017 | Nakagawa et al. |
| 9,660,199 | B2 | 5/2017 | Shizu et al. |
| 9,929,353 | B2 | 3/2018 | Kottas et al. |
| 10,270,046 | B2 | 4/2019 | Boudreault et al. |
| 10,454,038 | B2 | 10/2019 | Nakagawa et al. |
| 10,522,768 | B2 | 12/2019 | Egen et al. |
| 11,374,180 | B2 | 6/2022 | Xia et al. |
| 2001/0019782 | A1 | 9/2001 | Igarashi et al. |
| 2001/0053462 | A1 | 12/2001 | Mishima |
| 2004/0214038 | A1 | 10/2004 | Kwong et al. |
| 2005/0186443 | A1 | 8/2005 | Marrocco, III et al. |
| 2005/0258742 | A1 | 11/2005 | Tsai et al. |
| 2005/0260441 | A1 | 11/2005 | Thompson et al. |
| 2007/0087219 | A1 | 4/2007 | Ren et al. |
| 2007/0252517 | A1 | 11/2007 | Owczarczyk et al. |
| 2008/0018221 | A1 | 1/2008 | Egen et al. |
| 2008/0027220 | A1 | 1/2008 | Stossel et al. |
| 2009/0061681 | A1 | 3/2009 | McMunigal et al. |
| 2009/0134784 | A1 | 5/2009 | Lin et al. |
| 2012/0004407 | A1 | 1/2012 | Stoessel et al. |
| 2012/0217869 | A1 | 8/2012 | Adachi et al. |
| 2013/0299795 | A1 | 11/2013 | Xia et al. |
| 2014/0131663 | A1 | 5/2014 | Beers et al. |
| 2015/0141642 | A1 | 5/2015 | Adachi et al. |
| 2015/0287933 | A1* | 10/2015 | Kottas ................ H01L 51/0085 257/40 |
| 2016/0133859 | A1 | 5/2016 | Boudreault et al. |

FOREIGN PATENT DOCUMENTS

| | | | |
|---|---|---|---|
| CN | 101160370 | A | 4/2008 |
| CN | 102282150 | A | 12/2011 |
| CN | 103130835 | A | 6/2013 |
| CN | 103298907 | A | 9/2013 |
| CN | 103483332 | A | 1/2014 |
| CN | 103965253 | A | 8/2014 |
| CN | 103965260 | A | 8/2014 |
| CN | 104277075 | A | 1/2015 |
| CN | 104293342 | A | 1/2015 |
| CN | 104974166 | A | 10/2015 |
| CN | 105936640 | A | 9/2016 |
| EP | 1191613 | B1 | 3/2006 |
| EP | 1709840 | A2 | 10/2006 |
| EP | 1191614 | B1 | 5/2009 |
| EP | 1191612 | B1 | 9/2009 |
| EP | 3632921 | B1 | 12/2021 |
| JP | 2008179617 | A | 8/2008 |
| JP | 2016219490 | A | 12/2016 |
| KR | 1020140057418 | A | 5/2014 |
| TW | 201309696 | A | 3/2013 |
| TW | 201309778 | A | 3/2013 |
| TW | 201329199 | A | 7/2013 |
| TW | 201343874 | A | 11/2013 |
| TW | 201350558 | A | 12/2013 |
| WO | 2001041512 | A1 | 6/2001 |
| WO | 2002015645 | A1 | 2/2002 |
| WO | 2002002714 | A3 | 10/2002 |
| WO | 2000070655 | A3 | 5/2004 |
| WO | 2005033244 | A1 | 4/2005 |
| WO | 2005019373 | A3 | 5/2005 |
| WO | 2007028417 | A1 | 3/2007 |
| WO | 2007095118 | A2 | 8/2007 |
| WO | 2008054584 | A1 | 5/2008 |
| WO | 2009118087 | A1 | 10/2009 |
| WO | 2009146770 | A2 | 12/2009 |
| WO | 2010015307 | A1 | 2/2010 |
| WO | 2010031485 | A1 | 3/2010 |
| WO | 2010054728 | A1 | 5/2010 |
| WO | 2010054731 | A1 | 5/2010 |
| WO | 2010086089 | A1 | 8/2010 |
| WO | 2010099852 | A1 | 9/2010 |
| WO | 2010102709 | A1 | 9/2010 |
| WO | 2010135519 | A1 | 11/2010 |
| WO | 2011110277 | A1 | 9/2011 |
| WO | 2011057339 | A1 | 12/2011 |
| WO | 2012007086 | A1 | 1/2012 |
| WO | 2012007087 | A1 | 1/2012 |
| WO | 2012007088 | A1 | 1/2012 |
| WO | 2011141110 | A3 | 5/2013 |
| WO | 2013094620 | A1 | 6/2013 |
| WO | 2013107487 | A1 | 7/2013 |
| WO | 2013133359 | A1 | 9/2013 |
| WO | 2013154064 | A1 | 10/2013 |
| WO | 2013174471 | A1 | 11/2013 |
| WO | 2014007565 | A1 | 1/2014 |
| WO | 2014008982 | A1 | 1/2014 |
| WO | 2014024131 | A1 | 2/2014 |
| WO | 2014031977 | A1 | 2/2014 |
| WO | 2014038456 | A1 | 3/2014 |

(56) References Cited

FOREIGN PATENT DOCUMENTS

| | | | |
|---|---|---|---|
| WO | 2014112450 | A1 | 7/2014 |
| WO | 2014023377 | A3 | 9/2014 |

OTHER PUBLICATIONS

PCT/CN2018/119619, "International Search Report", dated Mar. 6, 2019, 2 pages.
Adachi et al., "High-efficiency red electrophosphorescence devices", Applied Physics Letters vol. 78 (2001), pp. 1622-1624.
Baldo et al., "High-efficiency fluorescent organic light-emitting devices using a phosphorescent sensitizer", Nature, vol. 403, (Feb. 17, 2000), pp. 750-753.
Bulovic et al. "Transparent light-emitting devices", Nature, vol. 380, (Mar. 7, 1996) p. 29.
Dias et al., "Triplet Harvesting with 100% Efficiency by Way of Thermally Activated Delayed Fluorescence in Charge Transfer OLEO Emitters", Advanced Materials, vol. 25, 2013, pp. 3707-3714.
Endo et al., "Efficient up-conversion of triplet excitons into a singlet state and its application for organic light emitting diodes", Applied Physics Letters, vol. 98, (2011), pp. 083302-1-083302-3.
Endo et al., "Thermally Activated Delayed Fluorescence from $Sn^{4+}$-Porphyrin Complexes and Their Application to Organic Light-Emitting Diodes—A Novel Mechanism for Electroluminescence", Advanced Materials, vol. 21, (2009), pp. 4802-4806.
Goushi et al., "Organic light-emitting diodes employing efficient reverse intersystem crossing for triplet-to-singlet state conversion", Nature Photonics, vol. 6, (Apr. 2012), pp. 253-258.
Gu et al., "Transparent organic light emitting devices", Applied Physics Letters, vol. 68 (1996), pp. 2606-2608.
Kipphan (Handbook of Print Media: Technologies and Production Methods), ISBN 3-540-67326-1, Chapter 1.3, pp. 40-67, Chapter 1.5, pp. 117-144, Chapter 5.5, pp. 711-730.
Ishimatsu et al., "Solvent Effect on Thermally Activated Delayed Fluorescence by 1,2,3,5-Tetrakis(carbazol-9-yl)-4,6-dicyanobenzene", The Journal of Physical Chemistry A, vol. 117, (2013), pp. 5607-5612.
Johnson et al., "Luminescent Iridium(I), Rhodium(I), and Platinum(II) Dithiolate Complexes", J. Am. Chem. Soc., vol. 105, (1983), pp. 1795-1802.
Kido et al., "Bright red lightemitting organic electroluminescent devices having a europium complex as an emitter", Applied Physics Letters, vol. 65, No. 17, (Oct. 24, 1994), pp. 2124-2126.
Kido et al., "Electroluminescence in a Terbium Complex", Chemistry Letters, (1990), pp. 657-660.
Komino et al., "Suppression of Efficiency Roll-Off Characteristics in Thermally Activated Delayed Fluorescence Based Organic Light-Emitting Diodes Using Randomly Oriented Host Molecules", Chemistry Materials, vol. 25, (2013), pp. 3038-3047.
Lee et al., "High-efficiency organic light-emitting diodes utilizing thermally activated delayed fluorescence from triazine-based donor-acceptor hybrid molecules", Applied Physics Letters, vol. 101, (2012), pp. 093306-1-093306-4.
Lee et al., "Oxadiazole- and triazole-based highly-efficient thermally activated delayed fluorescence emitters for organic light-emitting diodes", Journal Materials Chemistry C, vol. 1, (2013), pp. 1-6.
Li et al., "Highly Efficient Organic Light-Emitting Diode Based on a Hidden Thermally Activated Delayed Fluorescence Channel in a Heptazine Derivative", Advanced Materials, vol. 25, (2013), pp. 1-5.
Ma et al., "Electroluminescence from triplet metal-ligand charge-transfer excited state of transition metal complexes", Synthetic Metals, vol. 94, (1998), pp. 245-248.
Mehes et al., "Enhanced Electroluminescence Efficiency in a Spiro-Acridine Derivative through Thermally Activated Delayed Fluorescence", Angew. Chem. Int. Ed., vol. 51, (2012), pp. 11311-11315.
Nakagawa et al., "Electroluminescence based on thermally activated delayed fluorescence generated by a spirobifluorene donor-acceptor structure" Chem. Commun., vol. 48, (2012), pp. 9580-9582.
Nasu et al., "A highly luminescent spiro-anthracenone-based organic light-emitting diode exhibiting thermally activated delayed fluorescence", Chem. Commun., vol. 48, (2013), pp. 1-3.
Tanaka et al., "Efficient green thermally activated delayed fluorescence (TADF) from a phenoxazine-triphenyltriazine (PXZ-TRZ) derivative", Chem Commun, vol. 48, (2012), pp. 11392-11394.
Tanaka et al., "Twisted Intramolecular Charge Transfer State for Long-Wavelength Thermally Activated Delayed Fluorescence", Chemistry of Materials, vol. 25, (2013), pp. 3766-3771.
Uoyama et al., "Highly efficient organic light-emitting diodes from delayed fluorescence", Nature, vol. 492, (Dec. 13, 2012), pp. 234-238.
Wrighton et al., "The Nature of the Lowest Excited State in Tricarbonylchloro-1, 10-phenanthrolinerhenium( I) and Related Complexes", Journal of the American Chemistry Society, vol. 96, (Feb. 20, 1974), pp. 998-1003.
Zhang et al., "Design of Efficient Thermally Activated Delayed Fluorescence Materials for Pure Blue Organic Light Emitting Diodes", Journal of the American Chemistry Society, vol. 134, (2012), pp. 14706-14709.
First Office Action for Chinese Patent Application No. 201880068653.X, dated May 31, 2022, 30 pages.

* cited by examiner

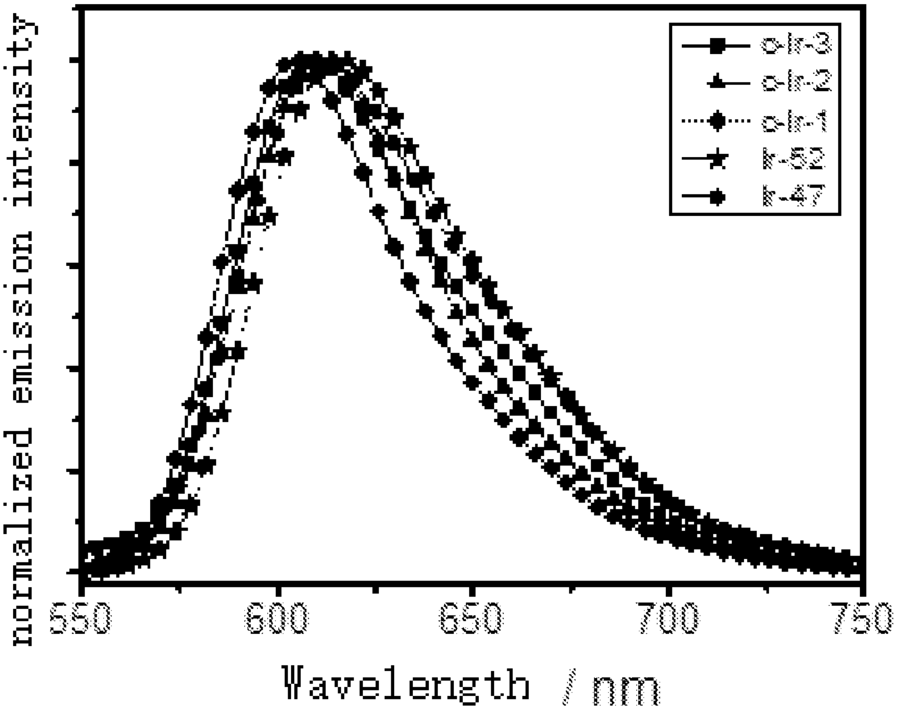
normalized emission intensity
550
600
650
700
750
Wavelength / nm
o-Ir-3
o-Ir-2
o-Ir-1
Ir-52
Ir-47

TRANSITION METAL COMPLEX, POLYMER, MIXTURE, FORMULATION AND USE THEREOF

The present disclosure claims priority to Chinese Patent Application No. 201711342791.6, entitled "A transition metal complex material and use thereof in electronic devices", filed on Dec. 14, 2017, the entire contents of which are incorporated by reference herein in its entirety.

TECHNICAL FIELD

The present disclosure relates to the technical field of optoelectronic materials, and in particular to a transition metal complex, polymer, mixture, formulation and a use thereof.

BACKGROUND

In flat-panel display and lighting applications, organic light-emitting diodes (OLEDs) have become the most promising display technology, due to their advantages of low cost, light weight, low operating voltage, high brightness, color adjustability, wide viewing angle, easy of assembly onto flexible substrates, and low energy consumption. In order to improve the luminescence efficiency of the organic light-emitting diode, various light-emitting material systems based on fluorescence and phosphorescence have been developed. The organic light-emitting diodes using fluorescent materials have high reliability, but their internal electroluminescence quantum efficiency under electric field excitation is limited to 25%. In contrast, since the branch ratio of singlet excited state to triplet excited state of the exciton is 1:3, the organic light-emitting diodes using phosphorescent materials can achieve an internal luminescence quantum efficiency of almost 100%. For small molecule OLEDs, the triplet excitation is effectively obtained by doping heavy metal centers, which improves spin orbital coupling and thus intersystem crossing to the triplet state.

Complexes based on the metal iridium (III) are a class of materials widely used for high efficiency OLEDs, which have relatively high efficiency and stability. Baldo et al. reported an OLED with high quantum efficiency using fac-tris(2-phenylpyridine)iridium(III) [Ir(ppy)3] as the phosphorescent material, and 4,4'-N, N'-dicarbazole-biphenyl (CBP) as the matrix material (Appl. Phys. Lett. 1999, 75, 4). Another example of phosphorescent materials is the sky blue complex, bis[2-(4',6'-difluorophenyl)pyridinato-N,$C^2$]-picolinate iridium (III) (FIrpic), which exhibits an extremely high photoluminescence quantum efficiency of approximately 60% in solution and almost 100% in solid film when it is doped into a high triplet energy matrix (Appl. Phys. Lett. 2001, 79, 2082). Although iridium (III) systems based on 2-phenylpyridine and its derivatives have been widely used for the preparation of OLEDs, the device performance, particularly the lifetime, still needs to be improved.

One of the effective ways to improve the luminescence efficiency and stability of complexes is to use ligands with rigid structures. Thompson group reported a rigid ligand-based iridium complex $Ir(BZQ)_2(acac)$ in 2001, which has not been widely used due to its poor emitting color and the like. Thereafter, the rigid ligand-based iridium complexes such as $Ir(DBQ)_2$ (acac) and $Ir(MDQ)_2$ (acac) have been reported, and electroluminescent devices prepared by these iridium complexes with rigid ligands as the guest light-emitting material have very high luminescence efficiency and brightness. On the other hand, when the iridium complexes $Ir(DBA)^2(acac)$ and $Ir(BA)_2(acac)$ based on the rigid ligands DBA and BA are used for preparing light-emitting devices, the maximum brightness and the maximum external quantum efficiency of the devices are only 9,540 cd·$m^{-2}$ and 4.66%, respectively. Although saturated red light emission is achieved, the efficiency and brightness of the devices are quite different from the expectation.

Therefore, how to improve the stability of metal organic complexes and increase the lifetime of organic light-emitting devices has become an urgent problem to be solved in the art.

SUMMARY

Based on the above, it is necessary to provide a transition metal complex, polymer, mixture, formulation and a use thereof, in order to improve the stability of the metal organic complexes and improve the lifetime of the organic light-emitting devices.

The technical solutions of the present disclosure are described below.

A transition metal complex having a general structural formula represented by Chemical Formula (1) is provided:

Chemical Formula (1)

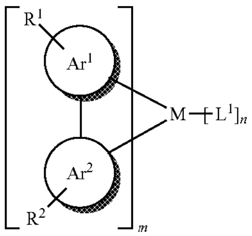

M is selected from the group consisting of iridium, ruthenium, gold, platinum, chromium, molybdenum, rhodium, osmium, rhenium, nickel, copper, silver, zinc, tungsten and palladium;

m is 1, 2 or 3;

$L^1$ is an auxiliary ligand coordinated to the M; when a plurality of $L^1$ exist, the plurality of $L^1$ are the same or different from each other; and the $L^1$ is a group containing at least one non-aromatic ring system or alkane molecular cage;

n is 0, 1 or 2;

when a plurality of $Ar^1$ exist, the plurality of $Ar^1$ are the same or different from each other; the $Ar^1$ is selected from the group consisting of an aromatic ring system containing 5 to 20 ring atoms, a heteroaromatic ring system containing 5 to 20 ring atoms, and a non-aromatic ring system containing 5 to 20 ring atoms;

the $Ar^1$ may be substituted by one or a plurality of $R^1$ groups, and when the $Ar^1$ is substituted by the plurality of $R^1$ groups, the plurality of $R^1$ groups are the same or different from each other;

when a plurality of $Ar^2$ exist, the plurality of $Ar^2$ are the same or different from each other; the $Ar^2$ is selected from the group consisting of an aromatic ring system containing 5 to 20 ring atoms, a heteroaromatic ring system containing 5 to 20 ring atoms, and a non-aromatic ring system containing 5 to 20 ring atoms;

the $Ar^2$ may be substituted by one or a plurality of $R^2$ groups, and when the $Ar^2$ is substituted by the plurality of $R^2$ groups, the plurality of $R^2$ groups are the same or different from each other;

$R^1$ and $R^2$ are each independently selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group.

A transition metal polymer of which the repeating unit includes at least the structure of the above transition metal complex is also provided.

A transition metal mixture comprising at least the transition metal complex or the transition metal polymer as described above and at least one organic functional material is also provided. The organic functional material is selected from the group consisting of hole injection materials, hole transport materials, electron transport materials, electron injection materials, electron blocking materials, hole blocking materials, emitters, host materials, and doping materials.

A transition metal formulation comprising the transition metal complex or the transition metal polymer as described above, and at least one organic solvent is further provided.

A use of the transition metal complex or the transition metal polymer as described above in an organic electronic device is further provided.

An organic electronic device comprising the transition metal complex or the transition metal polymer as described above is further provided.

The above transition metal complexes have a novel structure and are iridium (III) complexes containing rigid cycloalkyl groups. Since such auxiliary ligands increase the rigidity and symmetry of the molecule, and increase the rigidity of the molecule relative to the ligands without rigid cycloalkyl groups, the whole complex has better chemical, optical, electrical and thermal stabilities. Meanwhile, since the modification occurs on the auxiliary ligand, thereby having a low influence on the wavelength of the maximum luminescence peak caused by the main ligand, thus a saturated emitting color can be retained. Therefore, the use of the transition metal complex according to the present invention in OLEDs, in particular as a doping material of a light-emitting layer, can provide higher luminescence efficiency and longer lifetime of the device.

BRIEF DESCRIPTION OF THE DRAWINGS

The FIGURE is the normalized emission spectra of complexes Ir-47, Ir-52, c-Ir-1, c-Ir-2 and c-Ir-3 in dichloromethane solution.

DETAILED DESCRIPTION

The present disclosure provides a novel metal organic complex, corresponding mixture and formulation and a use in an organic electronic device. In order to make the purpose, technical solution and effects of the present disclosure clearer and more specific, the present disclosure will be further described in detail below. It should be noted that, the specific embodiment illustrated herein is merely for the purpose of explanation, and should not be deemed to limit the disclosure.

In the present disclosure, formulation and printing ink, or ink, have the same meaning and are interchangeable.

In the present disclosure, host material and matrix material have the same meaning and are interchangeable.

In the present disclosure, metal organic clathrate, metal organic complex, and organometallic complex have the same meaning and are interchangeable.

In the present disclosure, $C_1$-$C_6$ alkyl refers to an alkyl group containing 1 to 6 carbon atoms. Non-limiting examples include methyl, ethyl, n-propyl, isopropyl, n-butyl, isobutyl, t-butyl, sec-butyl, n-pentyl, 1,1-dimethylpropyl, 1,2-dimethylpropyl, 2,2-dimethylpropyl, 1-ethylpropyl, 2-methylbutyl, 3-methylbutyl, n-hexyl, 1-ethyl-2-methylpropyl, 1,1,2-trimethylpropyl, 1,1-dimethylbutyl, 1,2-dimethylbutyl, 2,2-dimethylbutyl, 1,3-dimethylbutyl, 2-ethylbutyl, 2-methylpentyl, 3-methylpentyl, 4-methylpentyl, and 2,3-dimethylbutyl. The alkyl may be substituted or unsubstituted, and when substituted, the substituent may be substituted at any available connecting position.

"Cycloalkyl" refers to a saturated or partially unsaturated monocyclic or polycyclic cyclic hydrocarbon substituent, 3 to 10-membered cycloalkyl contains 3 to 10 carbon atoms. In one embodiment, 3 to 10-membered monocyclic cycloalkyl is cyclopropyl, cyclobutyl, cyclopentyl, cyclopentenyl, cyclohexyl, cyclohexenyl, cyclohexadienyl, cycloheptyl, cycloheptatrienyl, cyclooctyl, and the like. The polycyclic cycloalkyl includes spiro, fused and bridged cycloalkyls. The cycloalkyl may be optionally substituted with one or more substituents.

The present disclosure relates to a transition metal complex having a general structural formula represented by Chemical Formula (1):

Chemical Formula (1)

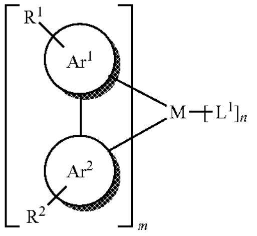

wherein symbols and labels used have the following meanings:

M is selected from the group consisting of iridium, ruthenium, gold, platinum, chromium, molybdenum, rhodium, osmium, rhenium, nickel, copper, silver, zinc, tungsten and palladium, particularly, M is iridium;

m is 1, 2 or 3, further, m is 2 or 3, particularly, m is 2;

$L^1$ is an auxiliary ligand coordinated to the M; when a plurality of $L^1$ exist, the plurality of $L^1$ are the same or different from each other; and the $L^1$ is a group containing at least one non-aromatic ring system or alkane molecular cage;

n is 0, 1 or 2, particularly, n is 1;

when a plurality of $Ar^1$ exist, the plurality of $Ar^1$ are the same or different from each other; the $Ar^1$ is selected from the group consisting of an aromatic ring system containing 5 to 20 ring atoms, a heteroaromatic ring system containing 5 to 20 ring atoms, and a non-aromatic ring system containing 5 to 20 ring atoms;

the $Ar^1$ may be substituted by one or a plurality of $R^1$ groups, and when the $Ar^1$ is substituted by the plurality of $R^1$ groups, the plurality of $R^1$ groups are the same or different from each other;

when a plurality of $Ar^2$ exist, the plurality of $Ar^2$ are the same or different from each other; the $Ar^2$ is selected from the group consisting of an aromatic ring system containing 5 to 20 ring atoms, a heteroaromatic ring system containing 5 to 20 ring atoms, and a non-aromatic ring system containing 5 to 20 ring atoms;

the $Ar^2$ may be substituted by one or a plurality of $R^2$ groups, and when the $Ar^2$ is substituted by the plurality of $R^2$ groups, the plurality of $R^2$ groups are the same or different from each other;

$R^1$ and $R^2$ are each independently selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group.

In certain embodiments, $L^1$ in the Chemical Formula (1) have a general structural formula represented by Chemical Formula (2):

Chemical Formula (2)

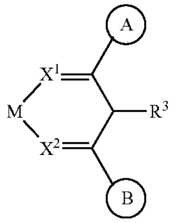

wherein the symbols and tags used have the following meanings:

$X^1$ and $X^2$ are each bonded to the metal atom center of M in the Chemical Formula (2); $X^1$ and $X^2$ are each independently selected from oxygen atom, sulfur atom, nitrogen atom or phosphorus atom, particularly oxygen atom;

when a plurality of $X^1$ exist, the plurality of $X^1$ are the same or different from each other; when a plurality of $X^2$ exist, the plurality of $X^2$ are the same or different from each other;

In one embodiment, $X^1$ and $X^2$ are oxygen atom.

A and B are each independently selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group; and at least one of A and B is a group containing a non-aromatic ring system or an alkane molecular cage. In one embodiment, both A and B contain a non-aromatic ring system or an alkane molecular cage.

$R^3$ is selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group.

In one embodiment, according to the organometallic complex of the Chemical Formula (1), $L^1$ in the Chemical Formula (1) has a general structural formula represented by Chemical Formula (3):

Chemical Formula (3)

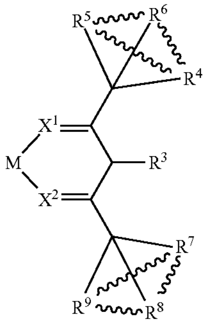

wherein the symbols and tags used have the following meanings:

$X^1$, $X^2$, M and $R^3$ have the same definitions as in the Chemical Formula (2);

$R^4$, $R^5$, $R^6$, $R^7$, $R^8$ and $R^9$ are each independently selected from the group consisting of a linear alkane containing 1 to 20 carbon atoms, a branched alkane containing 1 to 20 carbon atoms, a linear alkene containing 1 to 20 carbon atoms, a branched alkene containing 1 to 20 carbon atoms, and an alkane ether containing 1 to 6 carbon atoms.

When a plurality of $R^4$, $R^5$, $R^6$, $R^7$, $R^8$ or $R^9$ exist, the plurality of $R^4$, $R^5$, $R^6$, $R^7$, $R^8$ or $R^9$ are the same or different from each other;

In one embodiment, at least one pair of $R^4$, $R^5$, and $R^6$ in the Chemical Formula (3) bridges each other; at least two of $R^7$, $R^8$, and $R^9$ bridge each other.

In another embodiment, any two of $R^4$, $R^5$, and $R^6$ bridge each other; any two of $R^7$, $R^8$, and $R^9$ bridge each other.

In one embodiment, at least one of the groups A and B in the Chemical Formula (2) has a molecular cage structure containing 6 to 20 carbon atoms.

In one embodiment, at least one of the groups A and B in the Chemical Formula (2) is a substituent having the following structures:

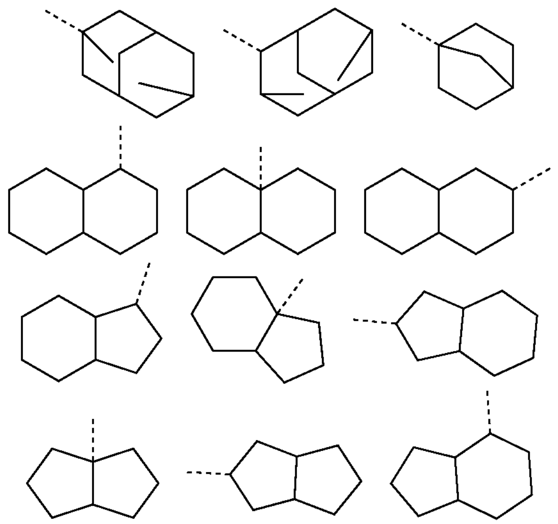

-continued

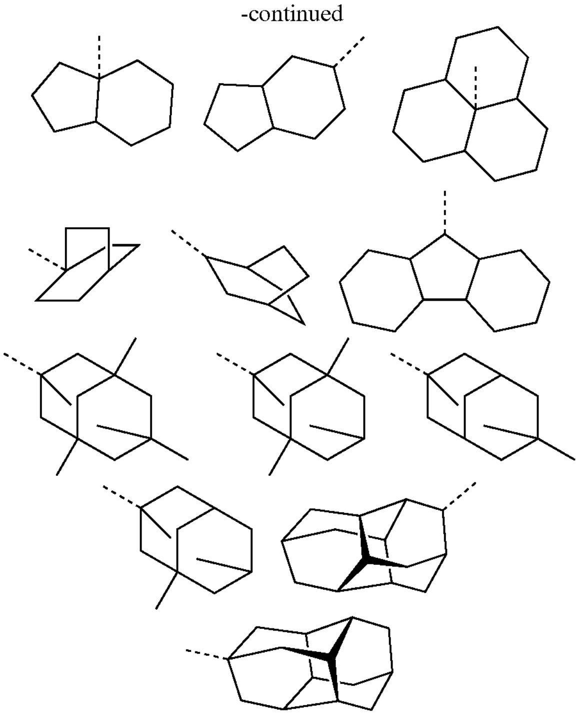

the dashed bond shown in the above groups represents the bonding to the carbon atom of the double bond in the Chemical Formula (2).

In one embodiment, the A and the B are the same or different. When the A and the B are different, one of the A and the B is H, $C_1$-$C_6$ alkyl, 3 to 10-membered cycloalkyl or phenyl.

In one embodiment, A and B are each independently selected from 3 to 10-membered cycloalkyl or an alkane molecular cage.

In one embodiment, A and B are each independently selected from an alkane molecular cage or cyclohexane.

In one embodiment, the alkane molecular cage is selected from

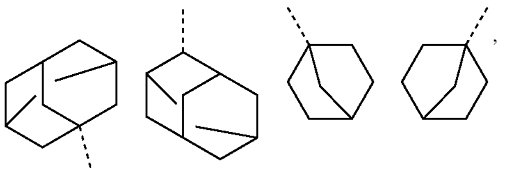

and the dashed bond is defined as above.

In one embodiment, A and B are each independently selected from

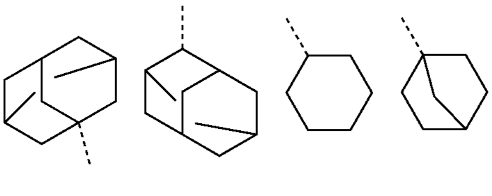

-continued

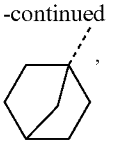

and the dashed bond is defined as above.

In one embodiment, according to the organometallic complex of the Chemical Formula (1), wherein $Ar^1$ is an unsubstituted or substituted aromatic ring containing 5 to 20 ring atoms or heteroaromatic ring containing 5 to 20 ring atoms. In one embodiment, according to the organometallic complex of the Chemical Formula (1), wherein $Ar^1$ is an unsubstituted or substituted aromatic ring containing 5 to 18 ring atoms or heteroaromatic ring containing 5 to 18 ring atoms. In one embodiment, according to the organometallic complex of the Chemical Formula (1), wherein $Ar^1$ is an unsubstituted or substituted aromatic ring containing 5 to 12 ring atoms or heteroaromatic ring containing 5 to 12 ring atoms.

In other embodiments, according to the organometallic complex of the Chemical Formula (1), wherein $Ar^2$ is an unsubstituted or substituted heteroaromatic ring containing at least one ring heteroatom N, which contains 5 to 20 ring atoms, 5 to 18 ring atoms in another embodiment, 5 to 14 ring atoms in another embodiment, 5 to 12 ring atoms in another embodiment.

The aromatic group refers to hydrocarbyl containing at least one aromatic ring, including monocyclic group and polycyclic ring system. The heteroaromatic group refers to hydrocarbyl (containing a heteroatom) containing at least one heteroaromatic ring, including monocyclic group and polycyclic ring system. Such polycyclic rings may have two or more rings, wherein two carbon atoms are shared by two adjacent rings, i.e., a fused ring. At least one ring of these polycyclic rings is aromatic or heteroaromatic. For the purpose of the present disclosure, the aromatic or heteroaromatic ring systems include aromatic or heteroaromatic systems, and further in the system a plurality of aryls or heteroaryls may be interrupted by short non-aromatic units (<10% of non-H atoms, particularly less than 5% of non-H atoms, such as C, N or O atoms). Therefore, systems such as 9,9'-spirobifluorene, 9,9-diarylfluorene, triarylamine, diaryl ether and the like are also considered to be the aromatic ring systems for the purpose of the present disclosure.

Specifically, examples of the aromatic group include: benzene, naphthalene, anthracene, phenanthrene, perylene, tetracene, pyrene, benzopyrene, triphenylene, acenaphthene, fluorene, and derivatives thereof.

Specifically, examples of the heteroaromatic group include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, o-diazonaphthalene, quinoxaline, phenanthridine, perimidine, quinazoline, quinazolinone, and derivatives thereof.

In certain embodiments, $Ar^1$ or $Ar^2$ is selected from unsubstituted or R substituted non-aromatic ring systems containing 5 to 20 ring atoms. One possible benefit of this embodiment is that the triplet energy level of the metal complexes can be increased so as to facilitate the acquisition of green or blue light emitters.

For the purpose of the present disclosure, the non-aromatic ring systems contains 1 to 10, further 1 to 6 carbon atoms in the ring system, and include saturated and partially unsaturated cyclic systems, which may be unsubstituted or monosubstituted or polysubstituted with the group R, the group R may be the same or different at each occurrence, and may further contain one or more heteroatoms, such as Si, N, P, O, S and/or Ge, particularly Si, N, P, O and/or S. These may be, for example, cyclohexyl-like or piperidine-like systems, also may be cyclooctadiene-like cyclic systems. The term is also suitable for the fused non-aromatic ring systems.

R may be selected from the group consisting of: (1) C1-C10 alkyl, which may refers to the following groups: methyl, ethyl, n-propyl, isopropyl, cyclopropyl, n-butyl, isobutyl, sec-butyl, tert-butyl, cyclobutyl, 2-methylbutyl, n-pentyl, n-hexyl, cyclohexyl, n-heptyl, cycloheptyl, n-octyl, cyclooctyl, 2-ethylhexyl, trifluoromethyl, pentafluoromethyl, 2,2,2-trifluoroethyl, propenyl, butenyl, pentenyl, cyclopentenyl hexenyl, cyclohexenyl, heptenyl, cycloheptenyl, octenyl, cyclooctenyl, ethynyl, propynyl, butynyl, pentynyl, hexynyl or octynyl; (2) a C1-C10 alkoxy group, which may refers to methoxyl, ethoxyl, n-propoxyl, isopropoxyl, n-butoxyl, isobutoxyl, or sec-butoxyl, tert-butoxyl or 2-methylbutoxyl; (3) C2-C10 aryl or heteroaryl, which may be monovalent or divalent depending on the use, and may also be substituted by the above-mentioned group $R^{10}$ and may be connected to an aromatic or heteroaromatic ring at any desired position in each case, and particularly refers to the following groups: benzene, naphthalene, anthracene, pyrene, dihydropyrene, chrysene, perylene, fluoranthene, naphthacene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridinimidazole, pyrazinoimidazole, quinoxalinimidazole, oxazole, benzoxazole, naphthoxazole, anthracoxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, 1,5-naphthyridine, nitrocarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole. For the purpose of the present disclosure, the aromatic and heteroaromatic ring systems further refer to biphenylene, triphenylene, fluorene, spirobifluorene, dihydrophenanthrene, tetrahydropyrene and cis- or trans-indenofluorene, in addition to the above-mentioned aryl and heteroaryl groups.

In one embodiment, according to the organometallic complex having the Chemical Formula (1), wherein $Ar^1$-$Ar^2$ may be selected from one of the following general formulas:

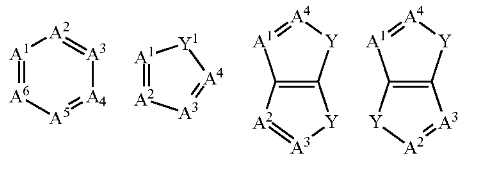

-continued

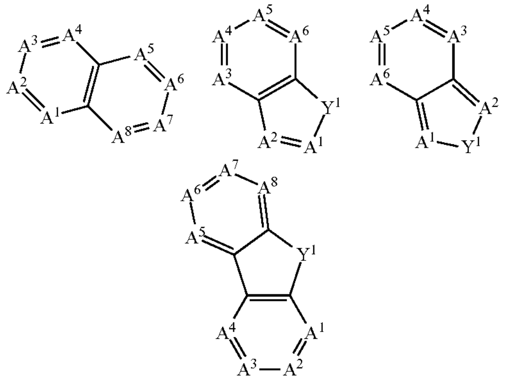

Wherein, $A^1$, $A^2$, $A^3$, $A^4$, $A^5$, $A^6$, $A^7$ and $A^8$ each independently represents $CR^3$ or N;

$Y^1$ is selected from $CR_4R_5$, $SiR_4R_5$, $NR_3$, C(═O), S or O;

$R_3$, $R_4$, and $R_5$ are selected from the group consisting of hydrogen, deuterium, a linear alkyl containing 1 to 20 carbon atoms, a linear alkoxy containing 1 to 20 carbon atoms, a linear thioalkoxy group containing 1 to 20 carbon atoms, a branched or cyclic alkyl containing 3 to 20 carbon atoms, a branched or cyclic alkoxy containing 3 to 20 carbon atoms, a branched or cyclic thioalkoxy group containing 3 to 20 carbon atoms, a branched or cyclic silyl group containing 3 to 20 carbon atoms, a substituted keto group containing 1 to 20 carbon atoms, alkoxycarbonyl group containing 2 to 20 carbon atoms, aryloxycarbonyl group containing 7 to 20 carbon atoms, cyano group (—CN), carbamoyl group (—C(═O)$NH_2$), haloformyl group (—C(═O)—X, wherein X represents halogen atom), formyl group (—C(═))—H), isocyano group, isocyanate group, thiocyanate group, isothiocyanate group, hydroxyl group, nitro group, $CF_3$ group, Cl, Br, F, a cross-linkable group, a substituted or unsubstituted aromatic or heteroaromatic ring system containing 5 to 40 ring atoms, an aryloxy or heteroaryloxy group containing 5 to 40 ring atoms, and combination of these systems, wherein one or more of the groups $R^3$, $R^4$, and $R^5$ may form a monocyclic or polycyclic aliphatic or aromatic ring system with each other and/or with a ring bonded thereto.

In a particular embodiment, $Ar^1$ and $Ar^2$ in the Chemical Formula (1) may be selected from one of the following structural groups, wherein H on the ring may be arbitrarily substituted:

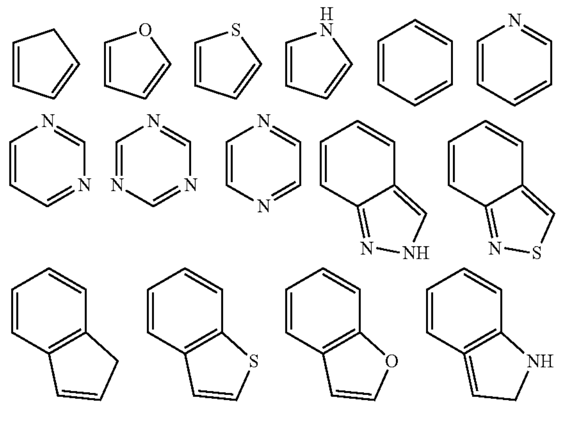

-continued
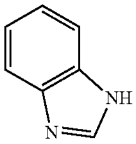 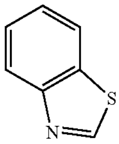 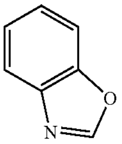 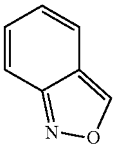
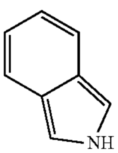 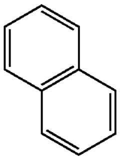 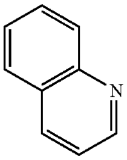 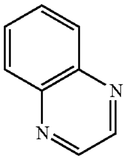
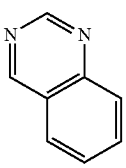 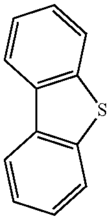 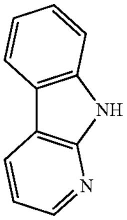 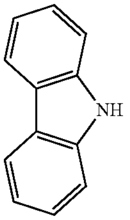
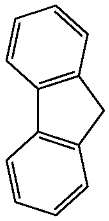 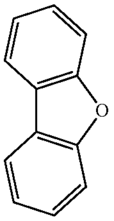 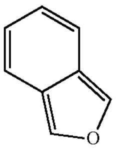 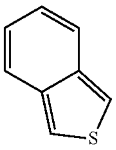
In another embodiment, according to the transition metal complex of the present disclosure, wherein the $Ar^1$ in the Chemical Formula (1) is selected from the following general formulas:
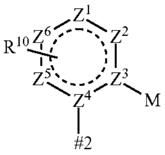 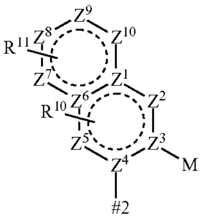
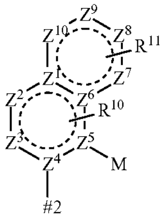 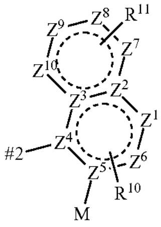
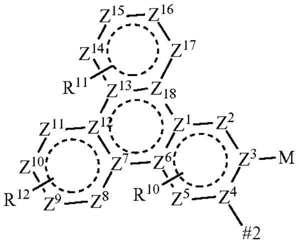 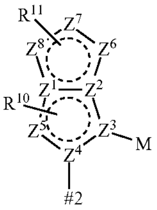
-continued
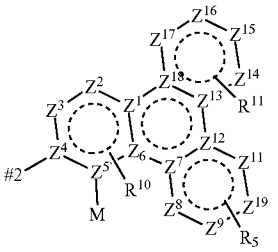 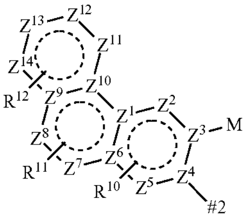
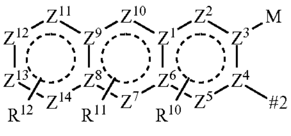 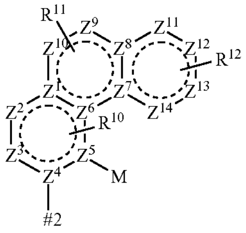
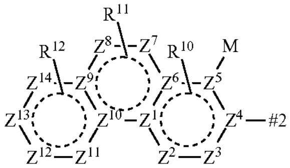
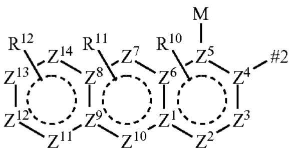
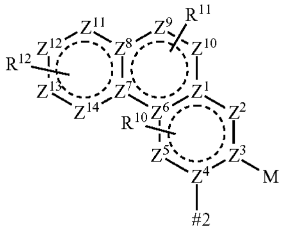 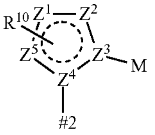
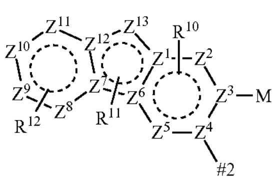 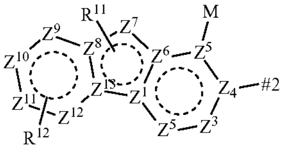
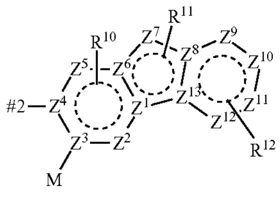 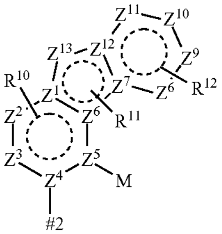
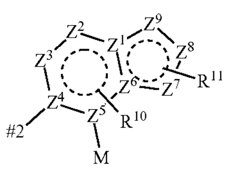 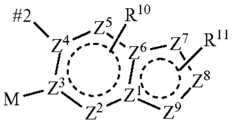

-continued

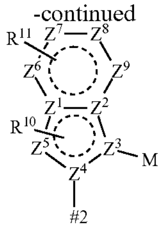

wherein, #2 represents a bonding to any position of the $Ar^2$ in the Chemical Formula (1); M is a metal atom representing iridium, gold, platinum, ruthenium, rhodium, osmium, rhenium, nickel, copper, silver, zinc, tungsten or palladium, particularly, M is iridium;

$Z^1$-$Z^{18}$ are each independently selected from the group consisting of carbon atom, nitrogen atom, oxygen atom, silicon atom, boron atom, sulfur atom and phosphorus atom;

In one embodiment, $Z^1$-$Z^{18}$ are each independently selected from carbon atom or nitrogen atom;

when a plurality of $Z^1$-$Z^{14}$ exist, the plurality of $Z^1$-$Z^{18}$ are the same or different from each other;

$R^{10}$, $R^{11}$ and $R^{12}$ are each independently selected from the group consisting of hydrogen, deuterium, halogen atom, a linear alkane substituent, a branched alkane substituent, a linear alkene substituent, a branched alkene substituent, an alkane ether substituent, an aromatic group, a heteroaromatic group and a non-aromatic group.

In one embodiment, the $Ar^1$ in the Chemical Formula (1) is selected from the following general formulas:

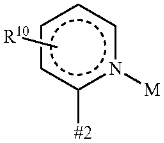

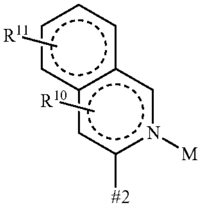

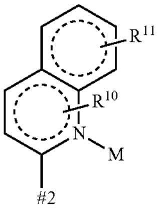

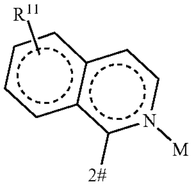

wherein, #2, M, $R^{10}$ and $R^{11}$ are defined as above.

In another embodiment, according to the transition metal complex of the present disclosure, wherein the $Ar^2$ in the Chemical Formula (2) is selected from the following general formulas:

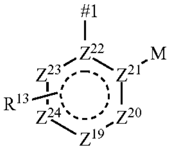

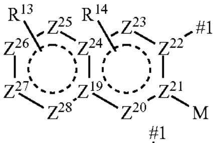

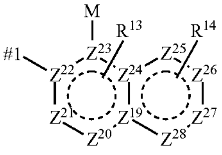

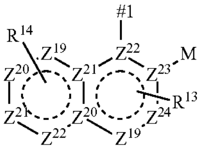

-continued

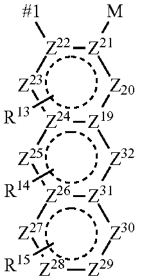

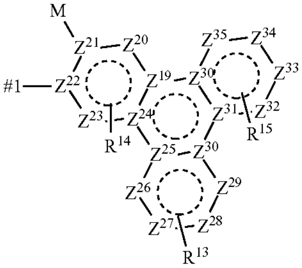

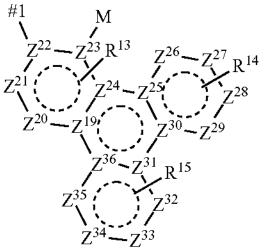

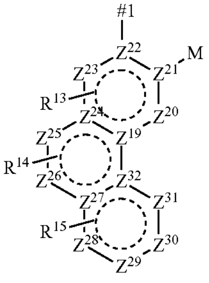

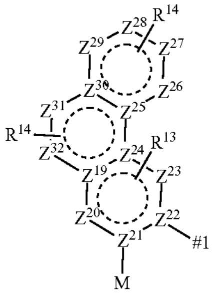

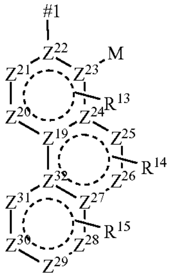

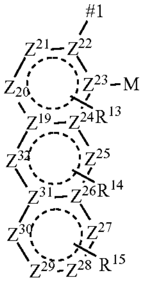

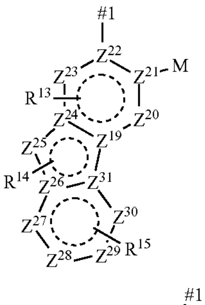

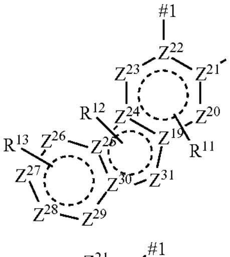

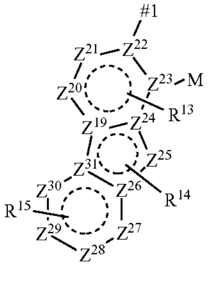

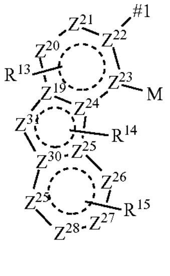

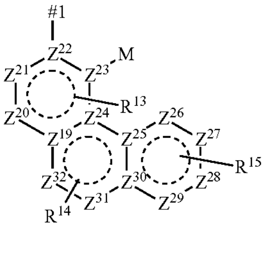

-continued

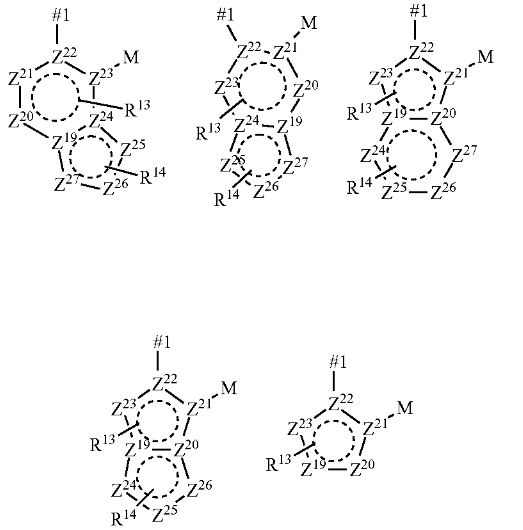

wherein, #1 represents a bonding to any position of the $Ar^1$ in the Chemical Formula (1), respectively;

M is selected from the group consisting of iridium, gold, platinum, ruthenium, rhodium, osmium, rhenium, nickel, copper, silver, zinc, tungsten or palladium, particularly, M is iridium.

$Z^{19}$-$Z^{38}$ are each independently selected from the group consisting of carbon, nitrogen, oxygen, silicon, boron, sulfur and phosphorus atoms;

$R^{13}$, $R^{14}$ and $R^{15}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

In one embodiment, the $Ar^2$ in the Chemical Formula (1) is selected from the following general formulas:

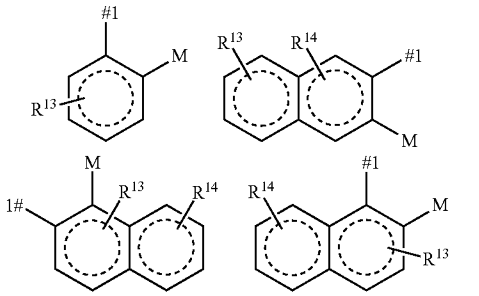

wherein, #1, M, $R^{13}$ and $R^{14}$ are defined as above.

In some particular embodiments, the organometallic complex according to the present disclosure is selected from one of the following general formulas:

Chemical Formula (I-1)

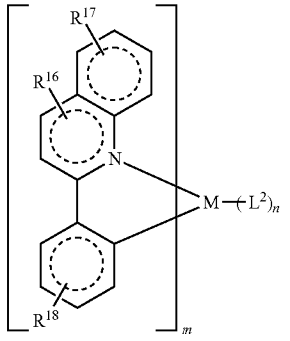

Chemical Formula (I-2)

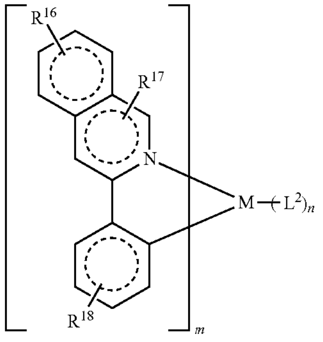

Chemical Formula (I-3)

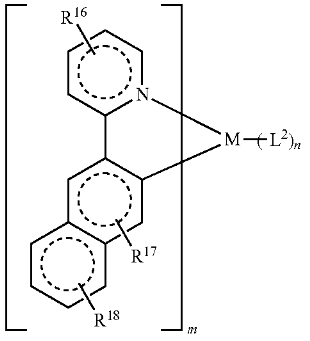

Chemical Formula (I-4)

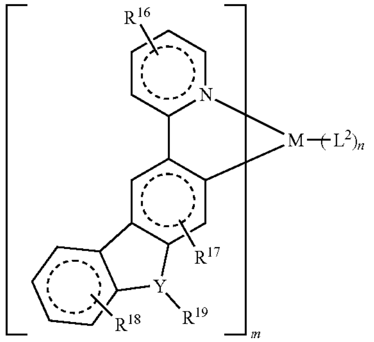

-continued
Chemical Formula (I-5)
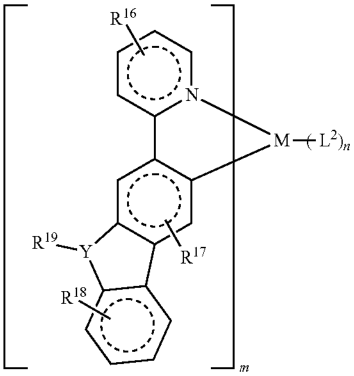
Chemical Formula (I-6)
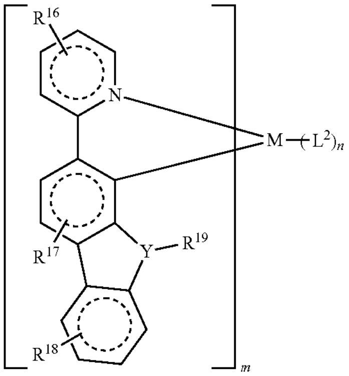
Chemical Formula (I-7)
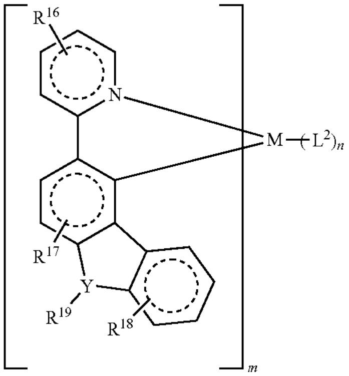
Chemical Formula (I-8)
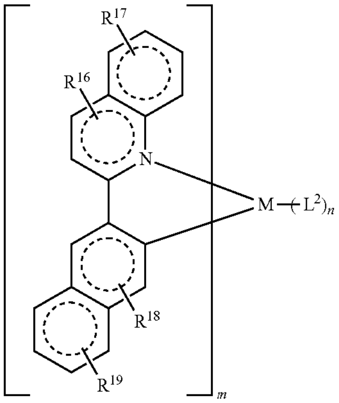
-continued
Chemical Formula (I-9)
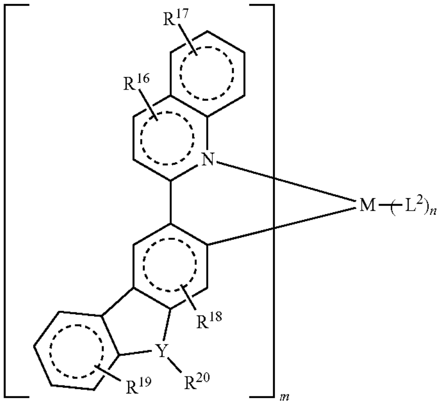
Chemical Formula (I-10)
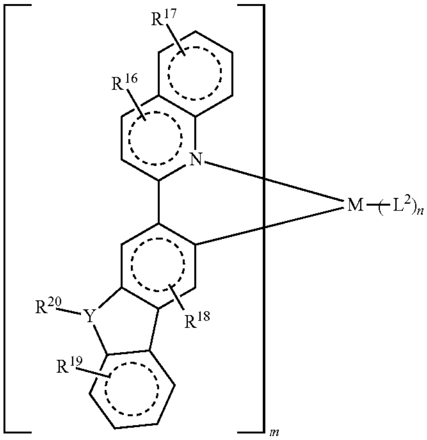
Chemical Formula (I-12)
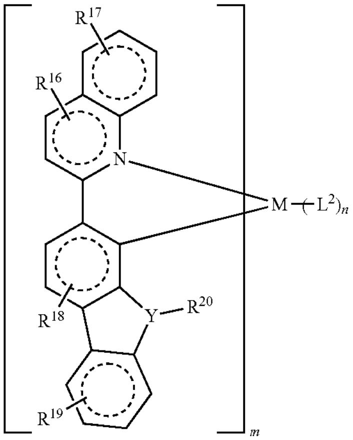

-continued

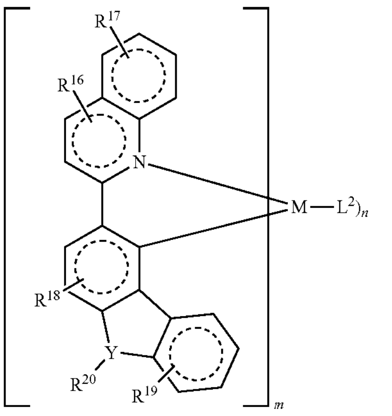

wherein, $L^2$ has the same definition as $L^1$ described above; m is 1, 2 or 3, further, m is 2 or 3, particularly, m is 2; n is 1 or 2, particularly, n is 1;

Y is a two-bridge group containing at least one nitrogen atom, oxygen atom, carbon atom, silicon atom, boron atom, sulfur atom or phosphorus atom.

In one embodiment, the two-bridge group contains at least one oxygen atom, sulfur atom or silicon atom.

In one embodiment, the two-bridge group is selected from the group consisting of a linear alkane containing 0 to 2 carbon atoms, a branched alkane, a linear alkene, a branched alkene an alkane ether, O, S, S═O, $SO_2$, N ($R^{21}$), B ($R^{21}$), Si $(R^{21})_2$, Ge $(R^{21})_2$, P ($R^{21}$), P (═O) $R^{21}$, P $(R^{21})_3$, Sn $(R^{21})_2$, C $(R^{21})_2$, C═O, C═S, C═Se, C═N $(R)_2$ and C═C $(R)_2$.

Wherein, $R^{21}$ is selected from the group consisting of hydrogen, deuterium, halogen atom, a linear alkane containing 1 to 20 carbon atoms, a branched alkane containing 1 to 20 carbon atoms, an alkane ether containing 1 to 20 carbon atoms, an alkane aromatic ring system containing 1 to 20 carbon atoms, an alkane heteroaromatic ring system containing 1 to 20 carbon atoms, and an alkane non-aromatic ring system containing 1 to 20 carbon atoms.

In one embodiment, Y is selected from O, S, $CH_2$, and $C(CH_3)_2$.

$R^{16}$, $R^{17}$, $R^{18}$, $R^{19}$ and $R^{20}$ are each independently selected from the group consisting of hydrogen, deuterium, halogen atom, a linear alkane substituent, a branched alkane substituent, a linear alkene substituent, a branched alkene substituent, an alkane ether substituent, an aromatic group, a heteroaromatic group and a non-aromatic group.

According to the organometallic complex of the present disclosure, wherein the metal element M in the Chemical Formula (1) is a transition metal element.

In one embodiment, the metal element M is selected from the group consisting of chromium (Cr), molybdenum (Mo), tungsten (W), ruthenium (Ru), rhodium (Rh), nickel (Ni), silver (Ag), copper (Cu), zinc (Zn), palladium (Pd), gold (Au), osmium (Os), rhenium (Re), iridium (Ir) and platinum (Pt).

In another embodiment, the metal element M is selected from the group consisting of ruthenium (Ru), rhodium (Rh), palladium (Pd), gold (Au), osmium (Os), rhenium (Re), iridium (Ir) and platinum (Pt).

In a further embodiment, the metal element M is selected from the group consisting of gold (Au), palladium (Pd), iridium (Ir) and platinum (Pt).

In a particular embodiment, the metal element M is Ir.

In terms of heavy atom effect, iridium is particularly used as the central metal M of the above metal organic complex. This is because iridium is chemically stable and has significant heavy atom effects resulting in high luminescence efficiency.

In one embodiment, the transition metal complex has a structure represented by Chemical Formula (I-13):

Chemical Formula (I-13)

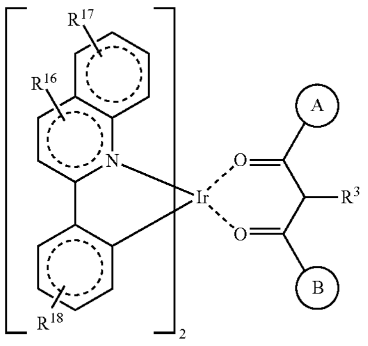

$R^3$, $R^{16}$, $R^{17}$ and $R^{18}$ are each independently selected from H, C1-C6 alkyl or silicyl;

A and B are each independently selected from the following groups:

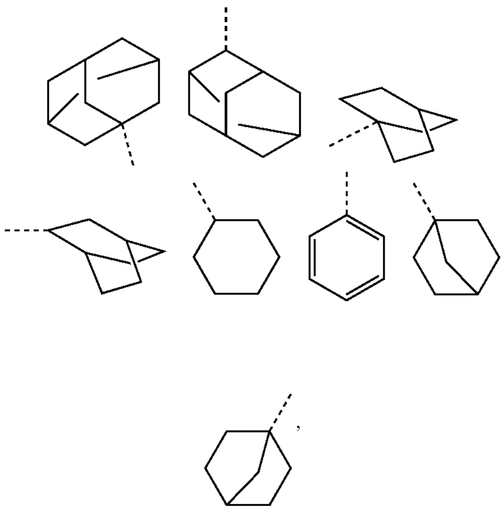

wherein, the dashed bond shown in the above groups represents the bonding to the carbon atom of the double bond in the Chemical Formula (I-13).

In one embodiment, the transition metal complex has a structure represented by the following Formula:

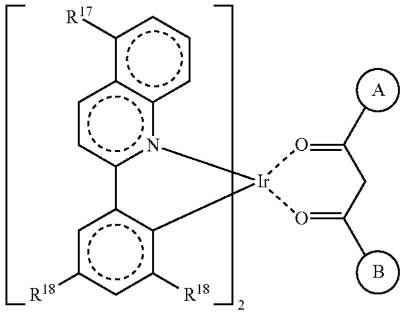

$R^{17}$ and $R^{18}$ are each independently selected from H, C1-C6 alkyl; further, $R^{17}$ and $R^{18}$ are each independently selected from C1-C6 alkyl, A and B are defined as above.

In one embodiment, the transition metal complex has a structure represented by the following Formula:

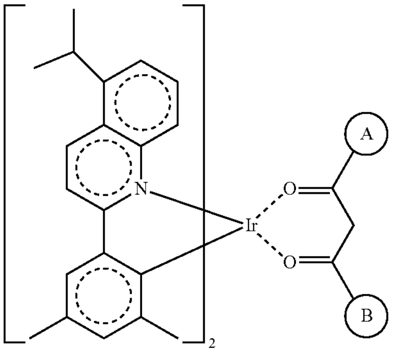

A and B are each independently selected from

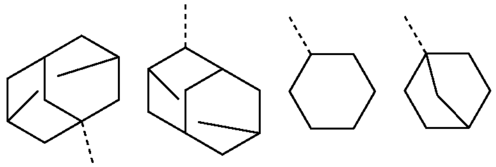

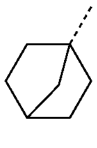

, and the dashed bond is defined as above.

Specific suitable examples of the metal organic complex according to the present disclosure are given below, but are not limited to:

(Ir-1)

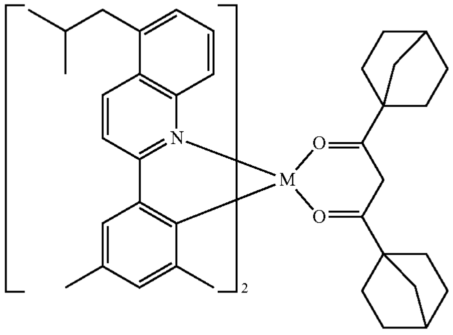

(Ir-2)

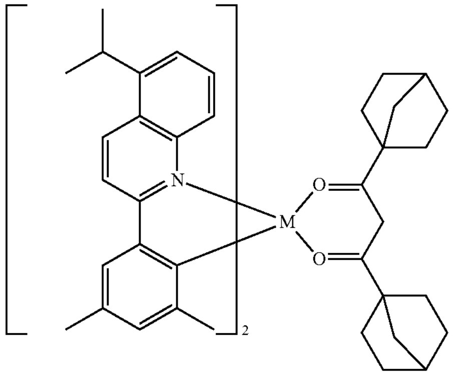

(Ir-3)

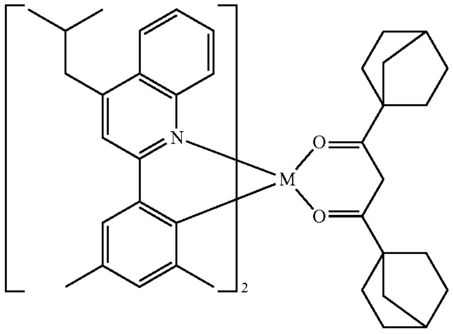

(Ir-4)

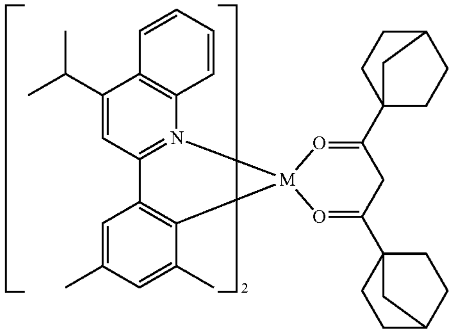

-continued
(Ir-5)
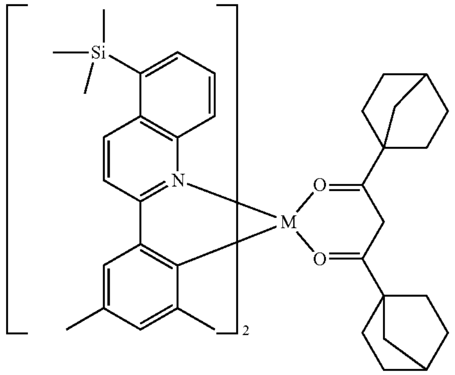
(Ir-6)
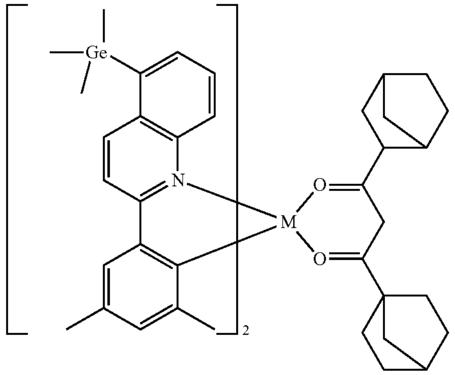
(Ir-7)
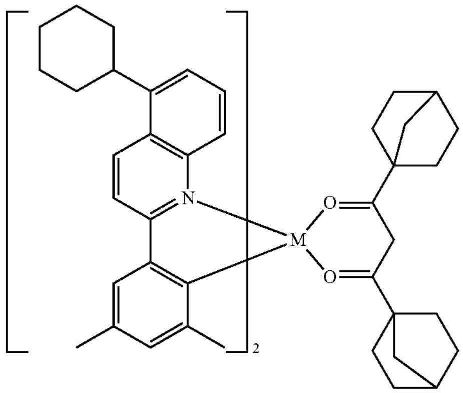
(Ir-8)
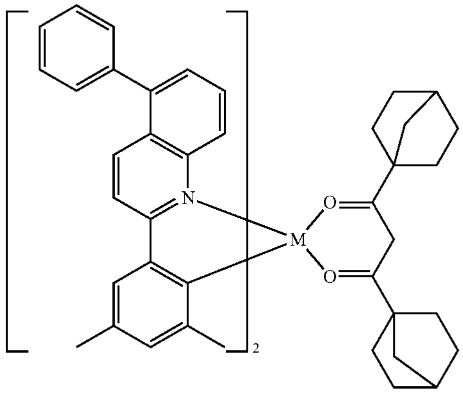
-continued
(Ir-9)
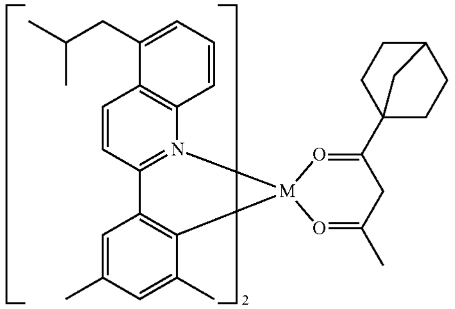
(Ir-10)
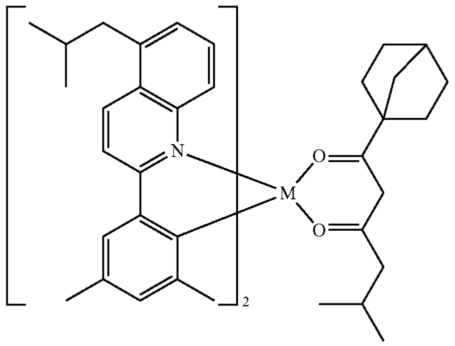
(Ir-11)
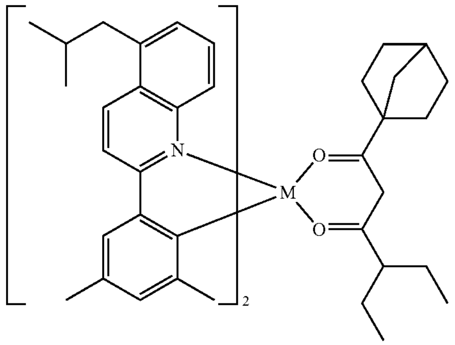
(Ir-12)
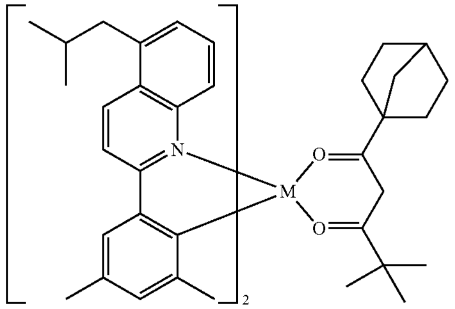

-continued
(Ir-13)
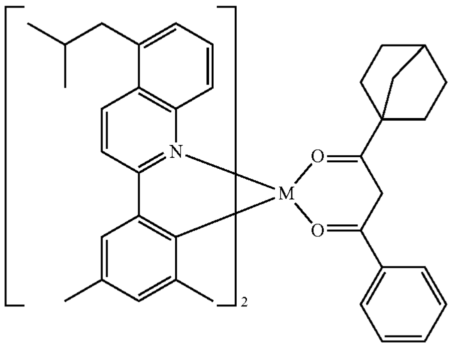
(Ir-14)
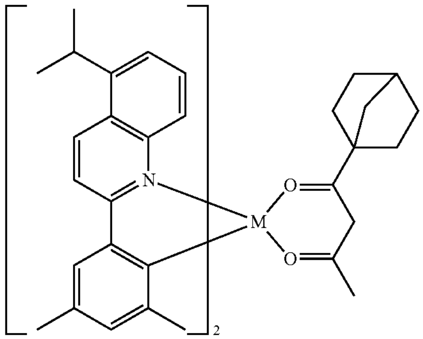
(Ir-15)
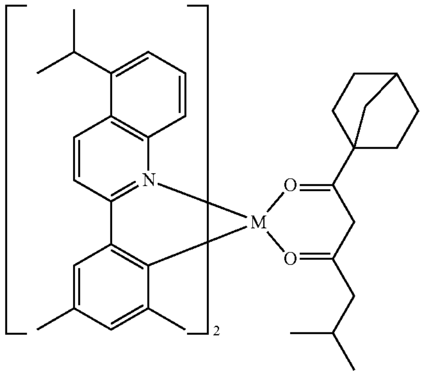
(Ir-16)
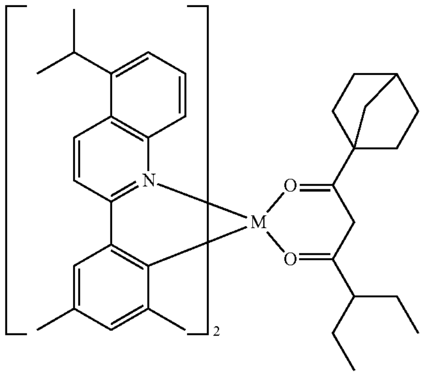
-continued
(Ir-17)
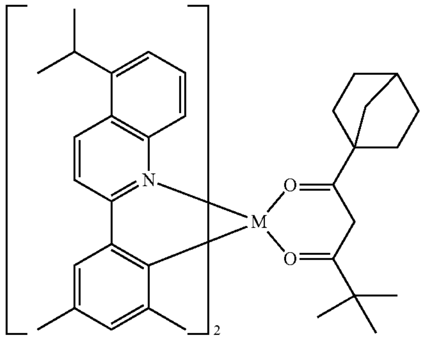
(Ir-18)
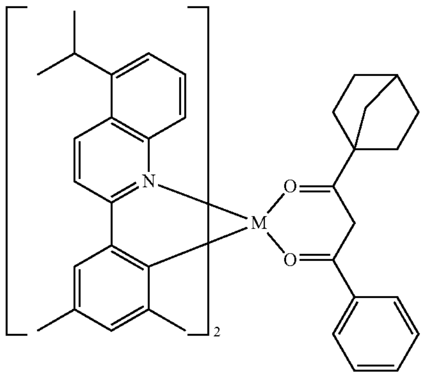
(Ir-19)
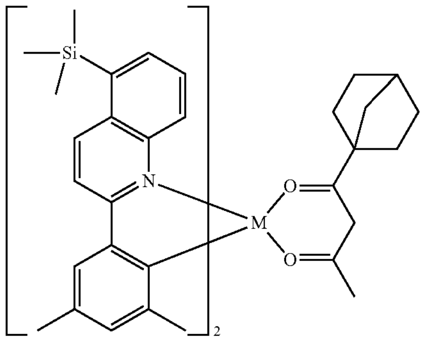
(Ir-20)
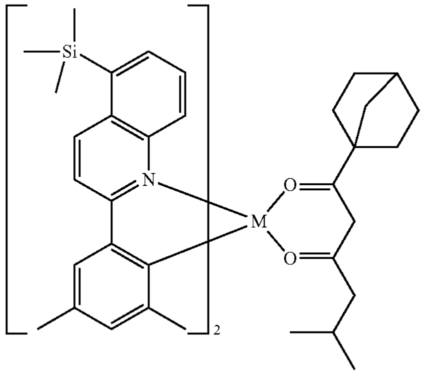

-continued
(Ir-21)
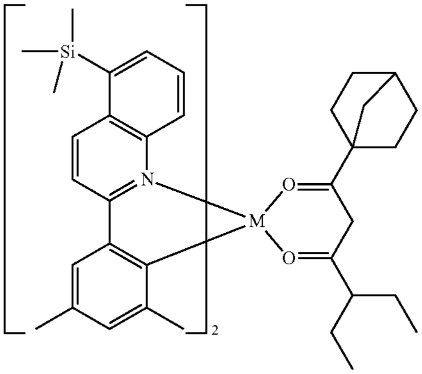
(Ir-22)
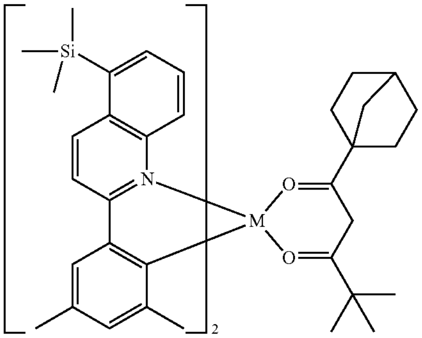
(Ir-23)
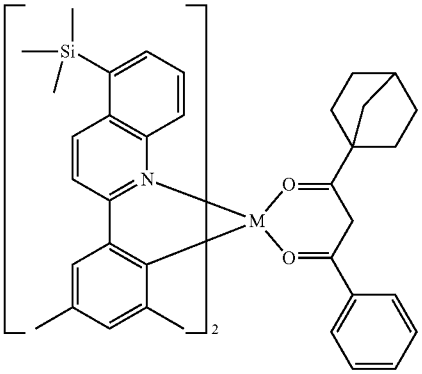
(Ir-24)
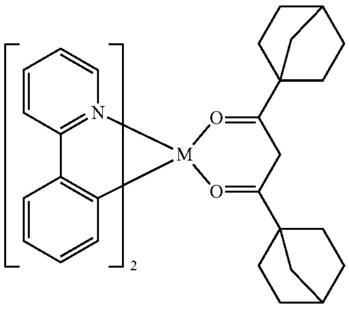
-continued
(Ir-25)
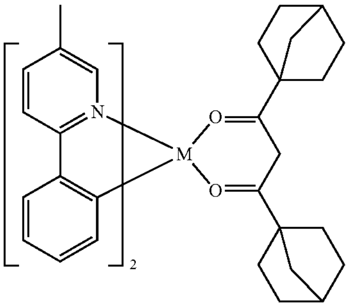
(Ir-26)
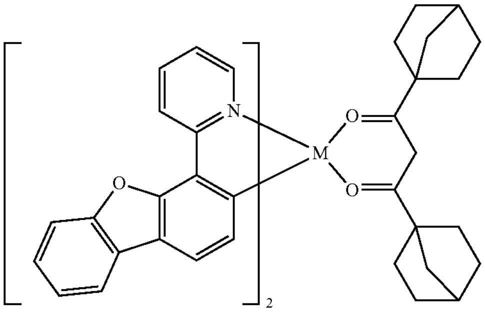
(Ir-27)
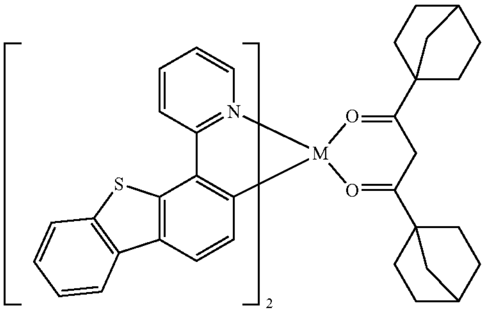
(Ir-28)
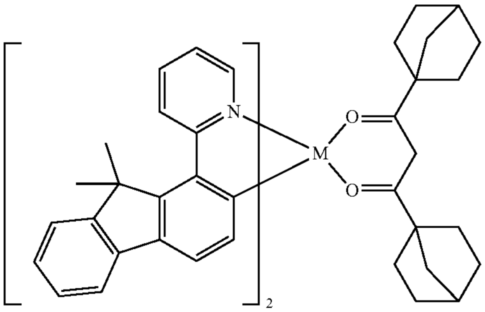
(Ir-29)
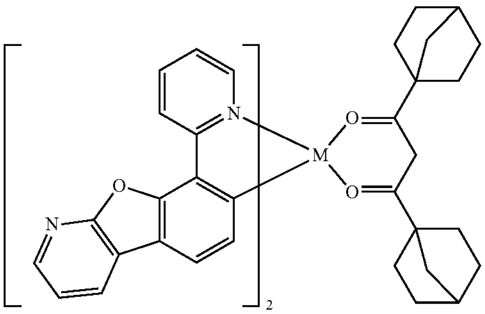

-continued
(Ir-30)
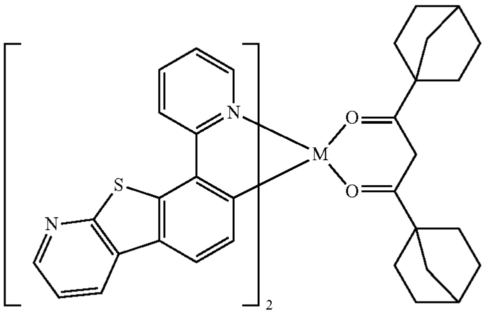
(Ir-31)
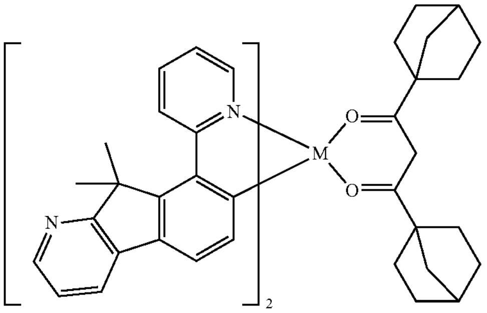
(Ir-32)
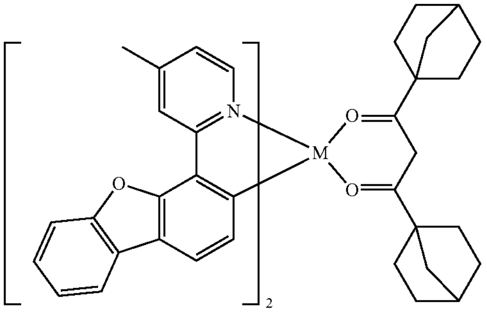
(Ir-33)
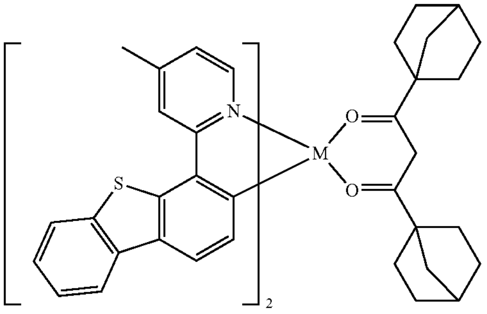
(Ir-34)
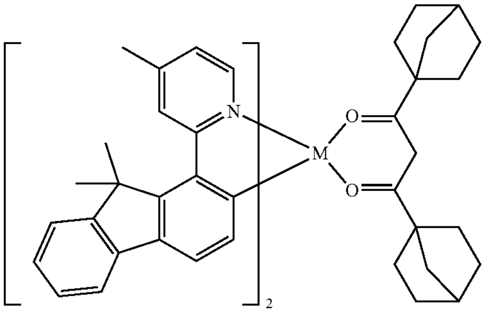
-continued
(Ir-35)
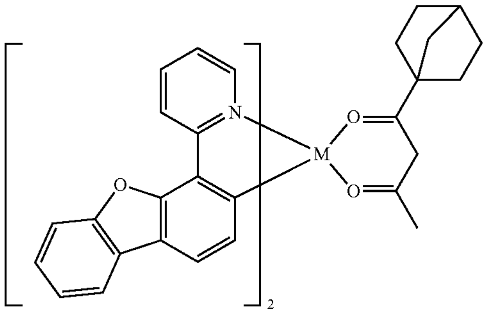
(Ir-36)
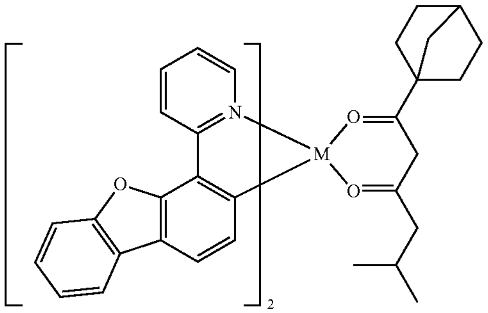
(Ir-37)
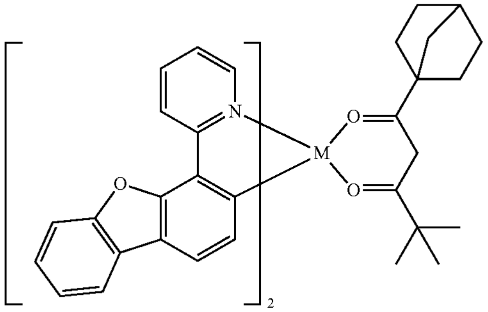
(Ir-38)
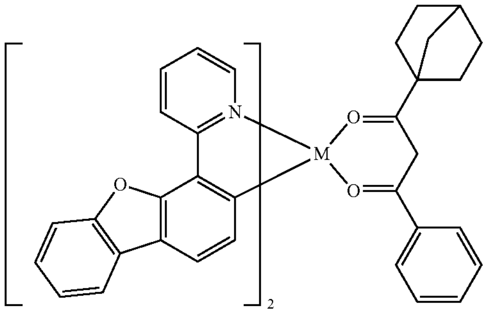
(Ir-39)
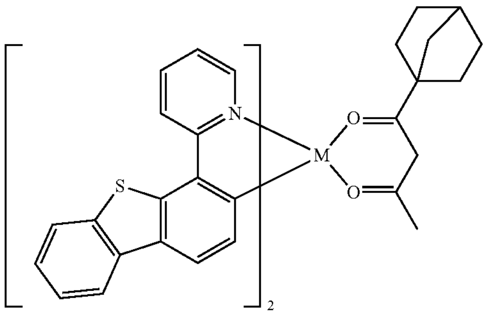

-continued
(Ir-40)
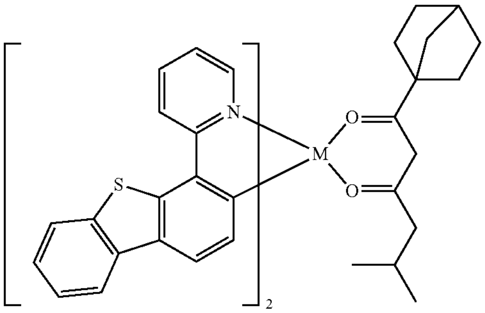
(Ir-41)
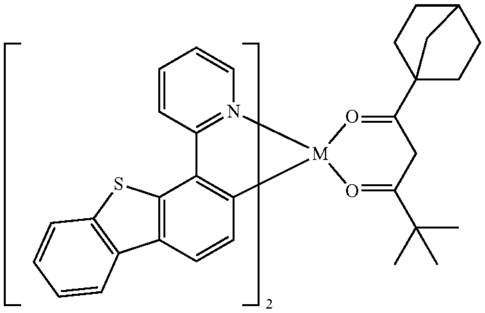
(Ir-42)
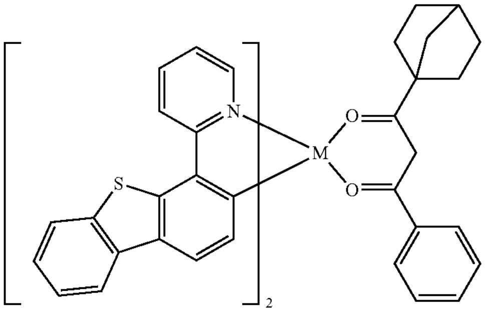
(Ir-43)
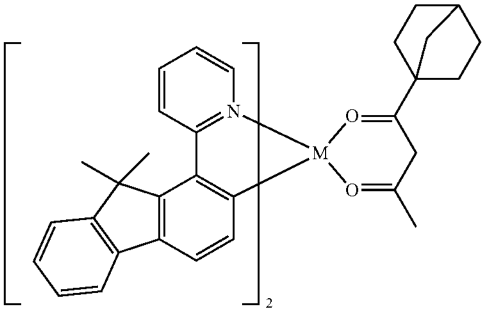
(Ir-44)
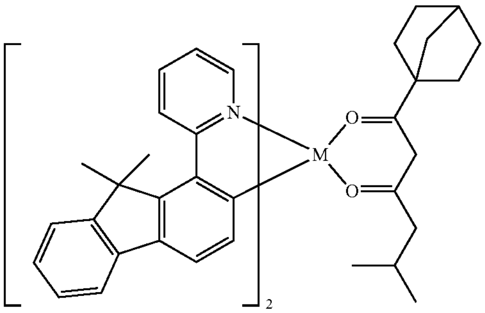
-continued
(Ir-45)
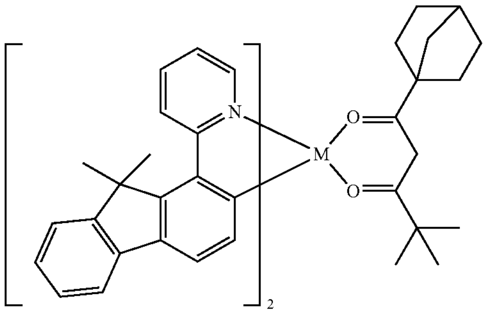
(Ir-46)
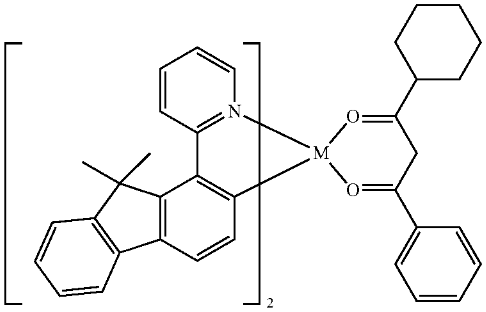
(Ir-47)
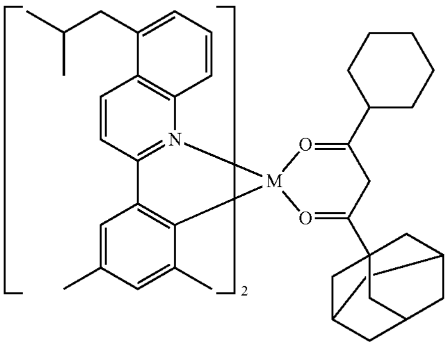
(Ir-48)
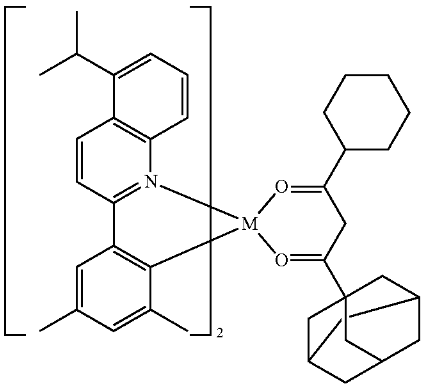

-continued
(Ir-49)
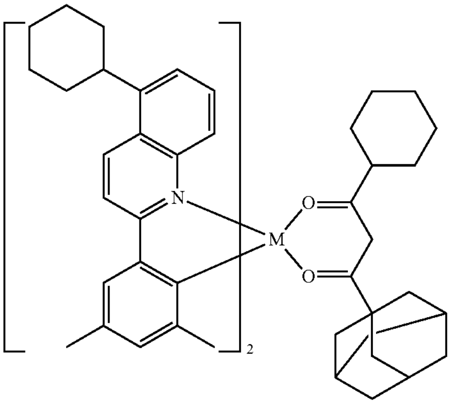
(Ir-50)
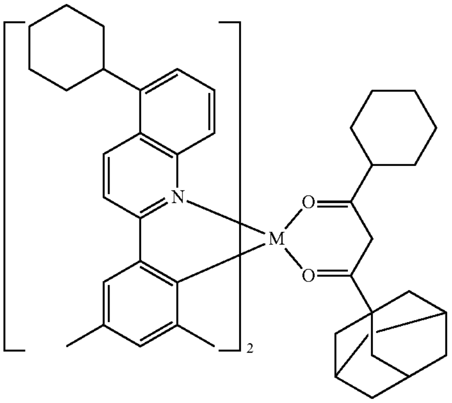
(Ir-51)
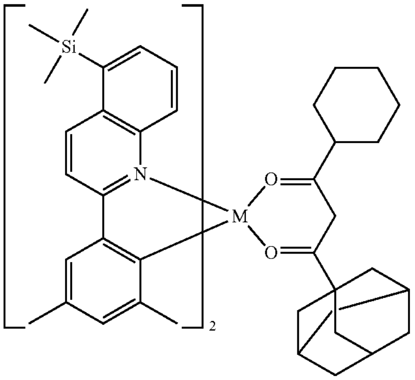
(Ir-52)
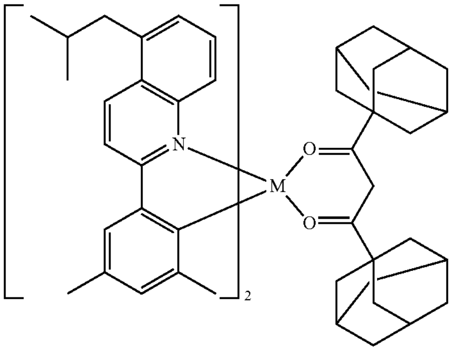
-continued
(Ir-53)
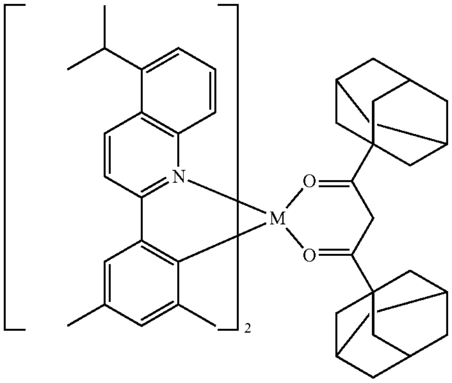
(Ir-54)
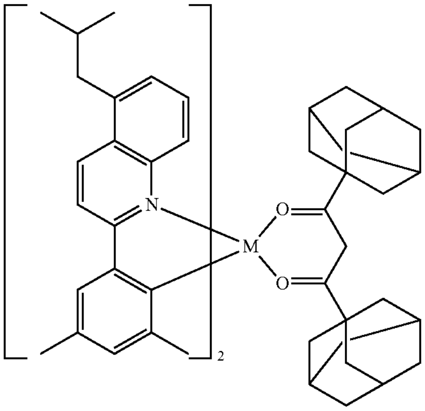
(Ir-55)
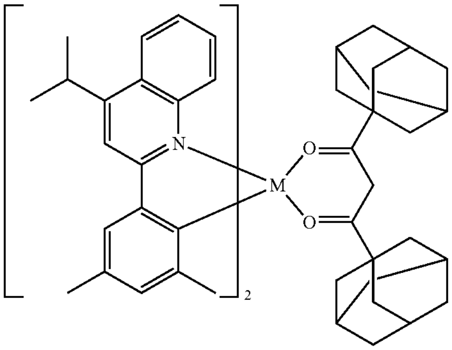
(Ir-56)
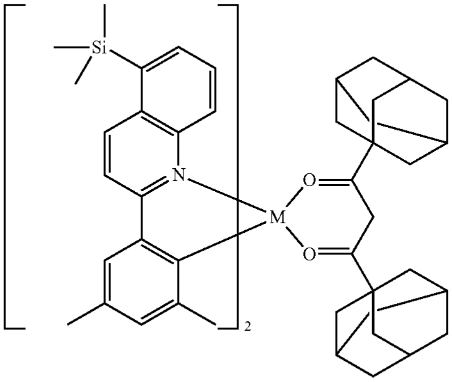

-continued
(Ir-57)
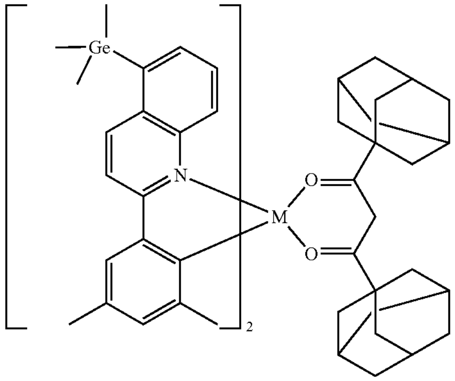
(Ir-58)
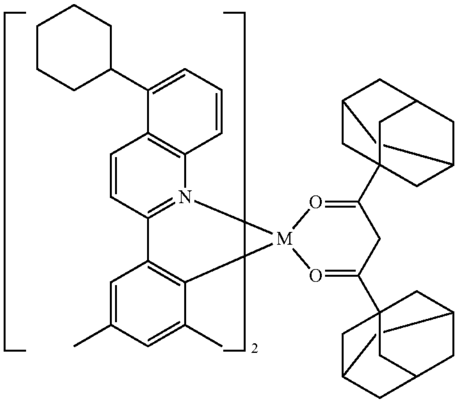
(Ir-59)
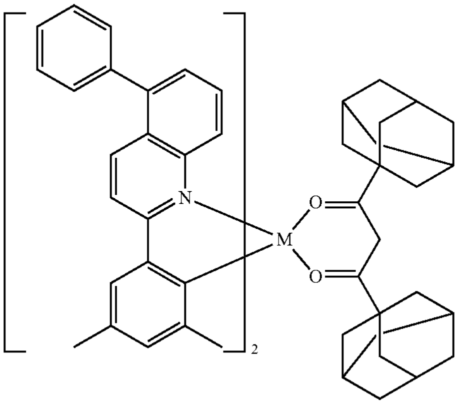
(Ir-60)
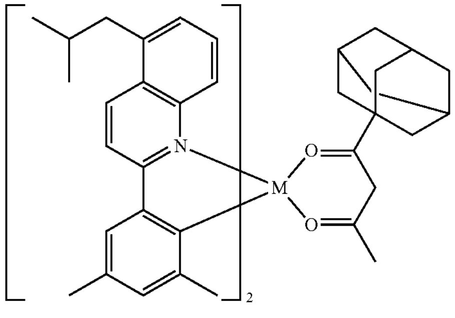
-continued
(Ir-61)
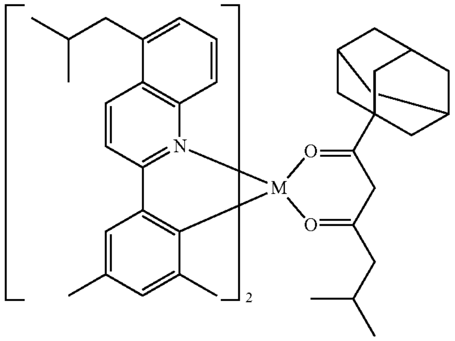
(Ir-62)
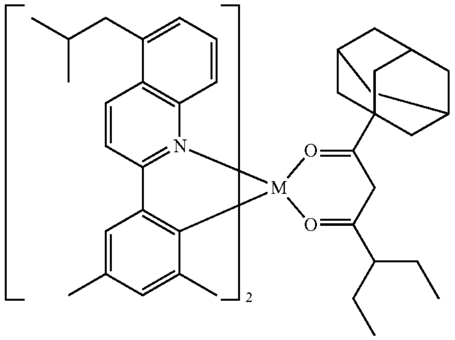
(Ir-63)
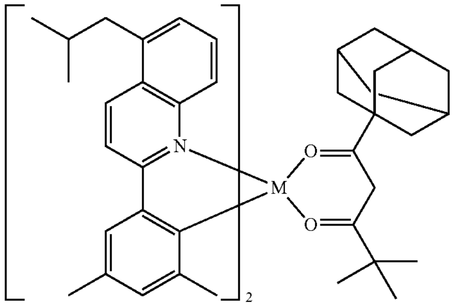
(Ir-64)
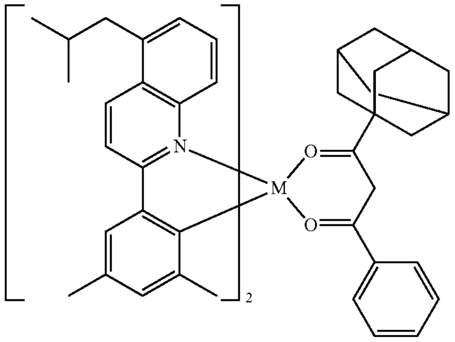

-continued
(Ir-65)
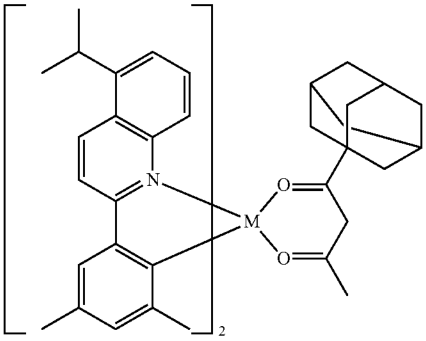
(Ir-66)
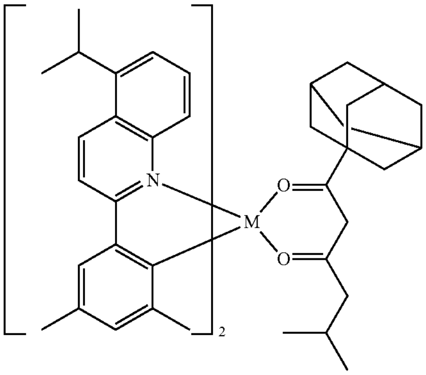
(Ir-67)
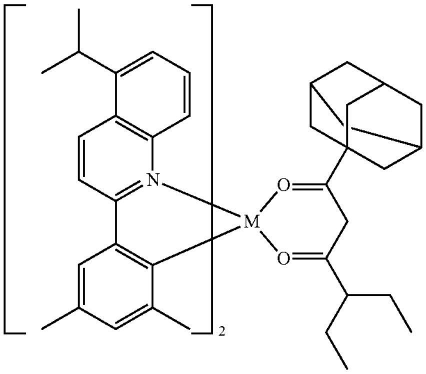
(Ir-68)
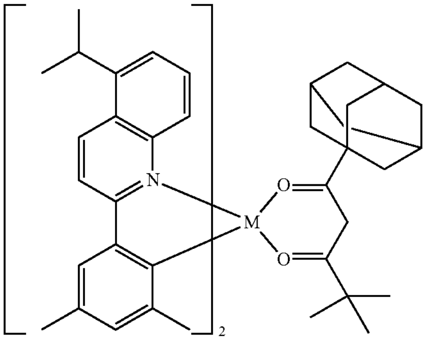
-continued
(Ir-69)
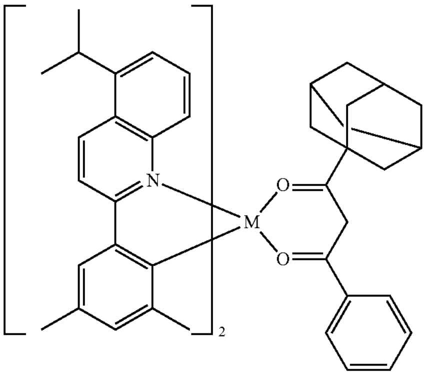
(Ir-70)
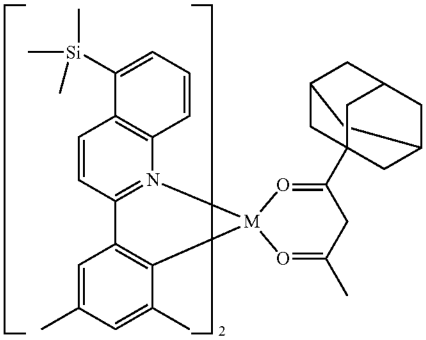
(Ir-71)
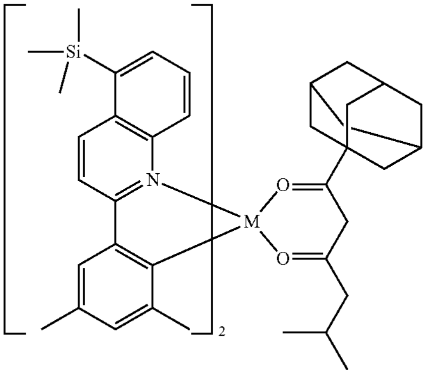
(Ir-72)
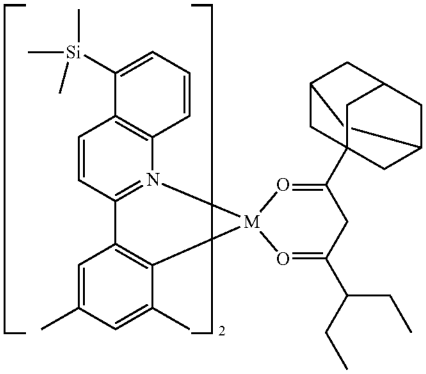

-continued
(Ir-73)
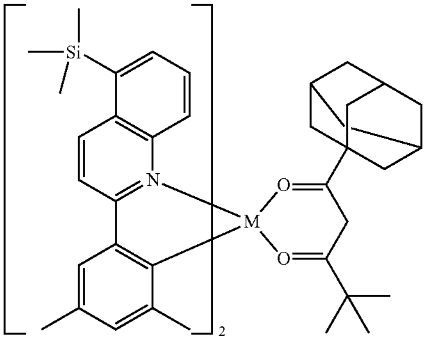
(Ir-74)
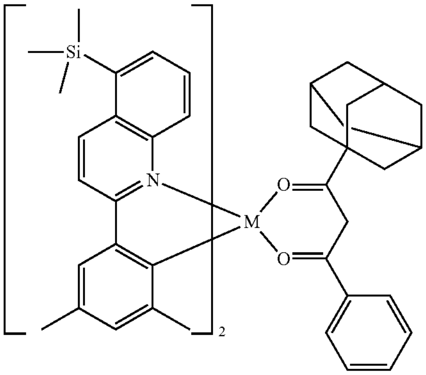
(Ir-75)
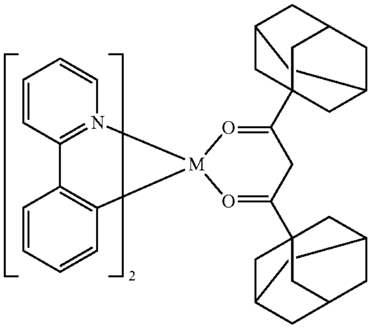
(Ir-76)
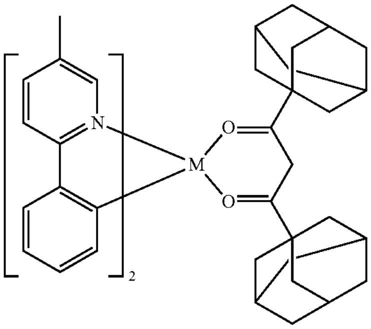
-continued
(Ir-77)
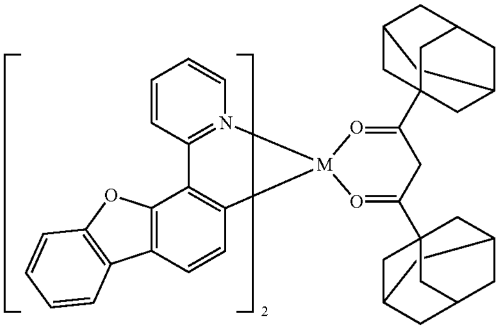
(Ir-78)
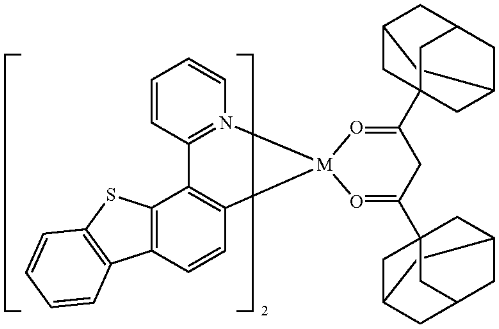
(Ir-79)
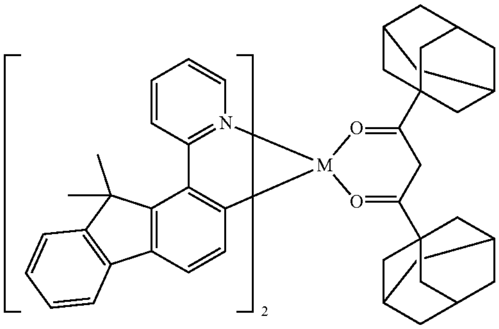
(Ir-80)
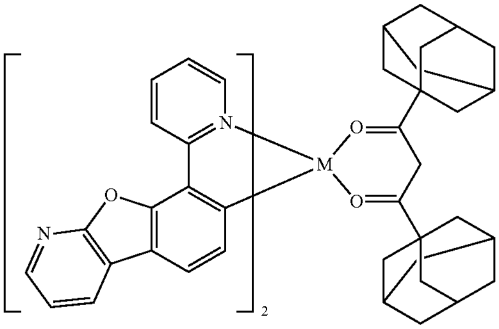

-continued
(Ir-81)
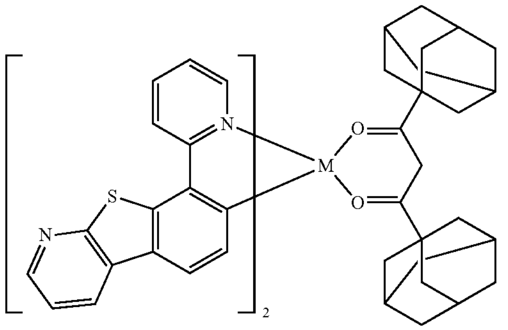
(Ir-82)
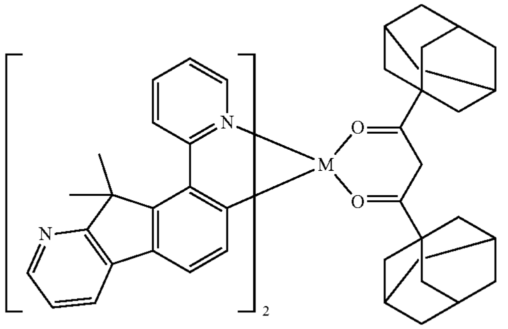
(Ir-83)
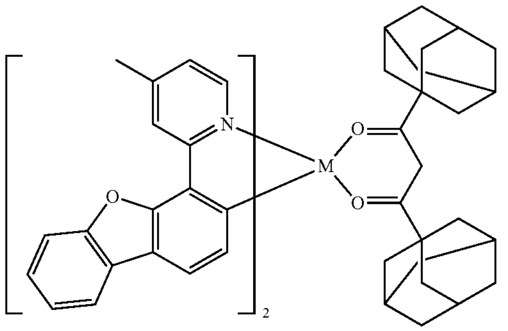
(Ir-84)
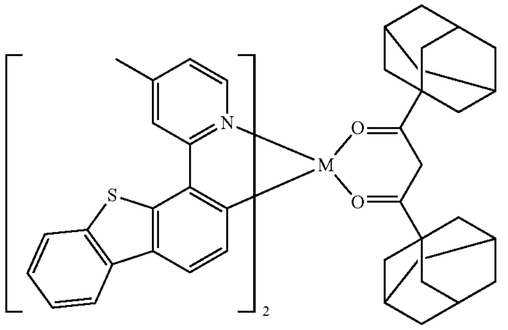
-continued
(Ir-85)
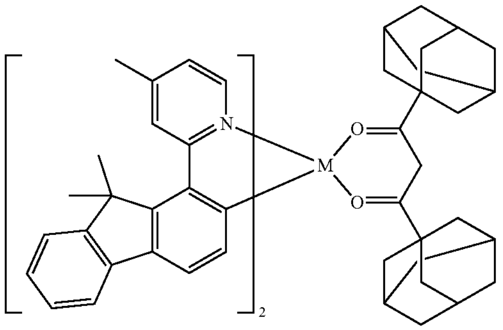
(Ir-86)
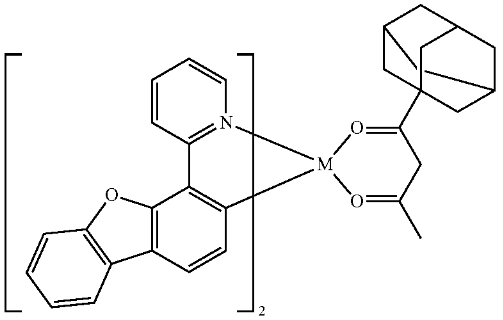
(Ir-87)
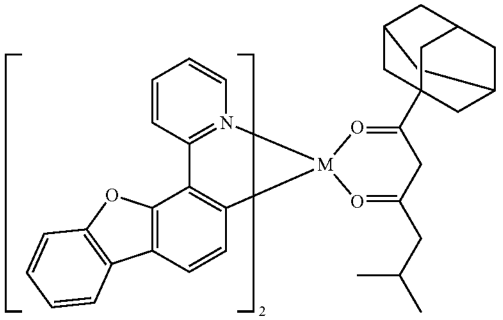
(Ir-88)
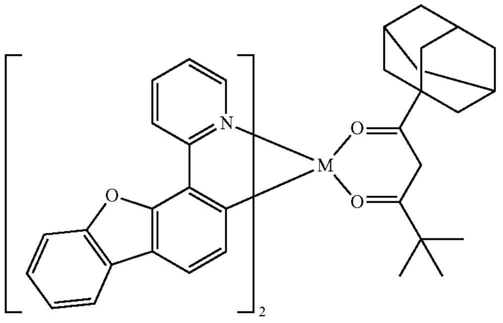

-continued
(Ir-89)
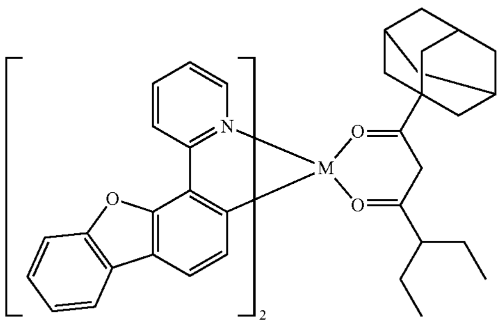
(Ir-90)
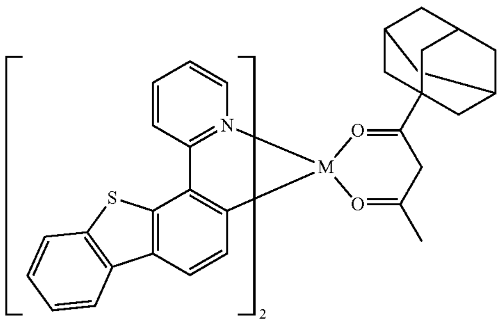
(Ir-91)
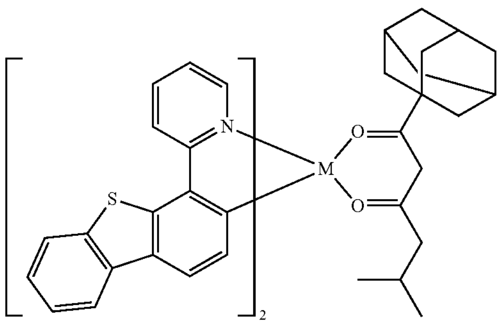
(Ir-92)
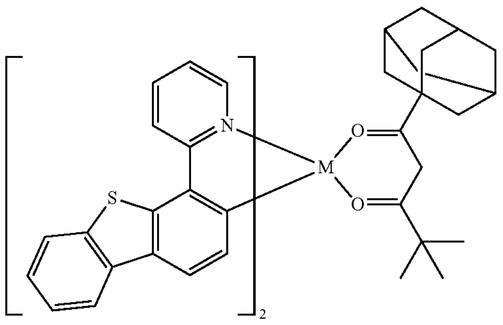
-continued
(Ir-93)
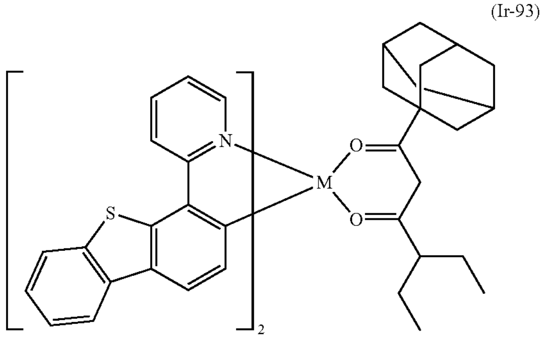
(Ir-94)
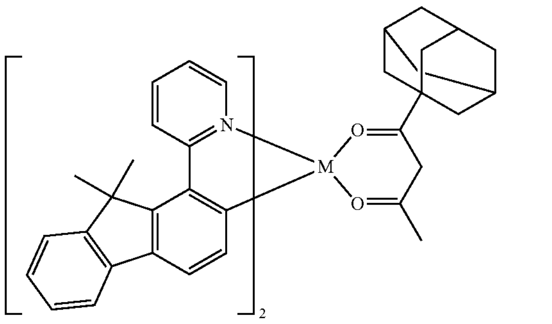
(Ir-95)
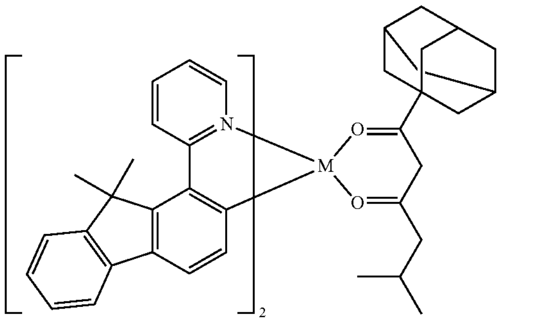
(Ir-96)
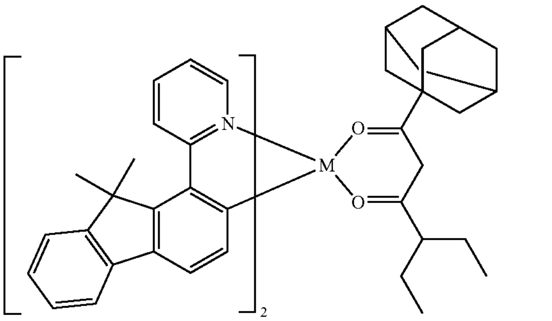

-continued
(Ir-97)
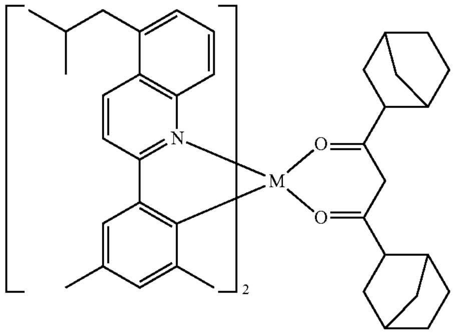
(Ir-98)
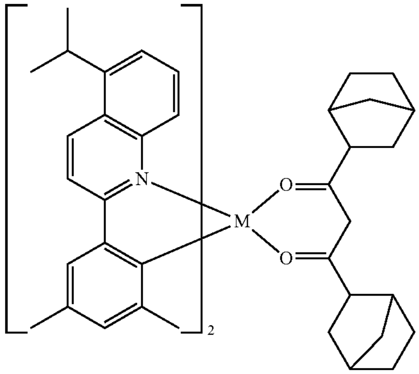
(Ir-99)
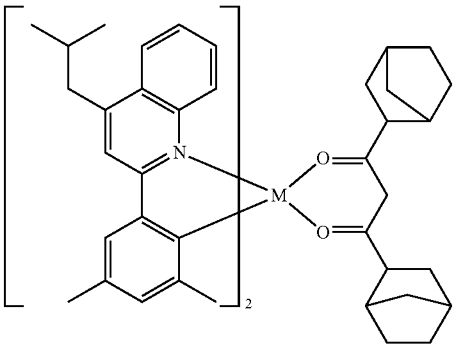
(Ir-100)
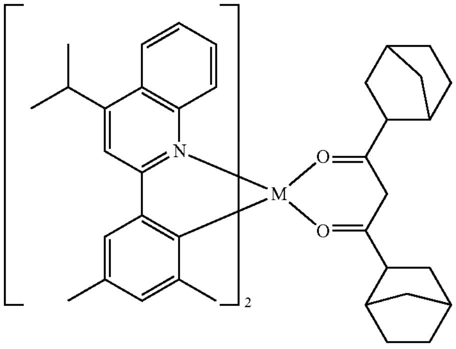
-continued
(Ir-101)
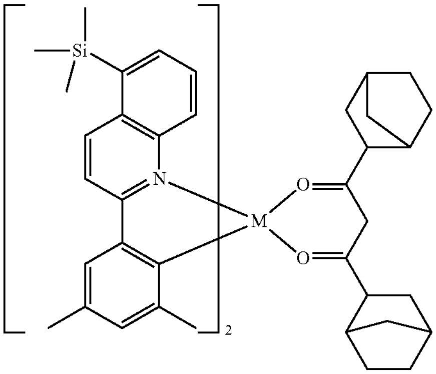
(Ir-102)
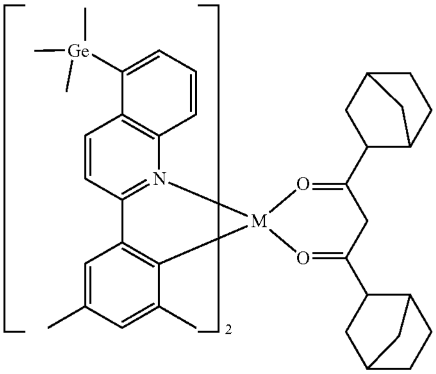
(Ir-103)
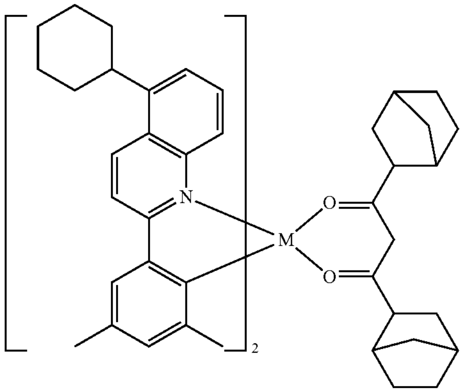
(Ir-104)
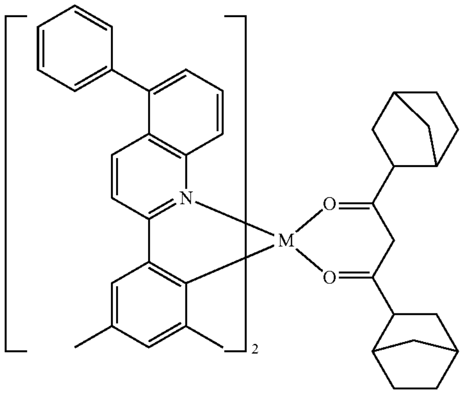

-continued
(Ir-105)
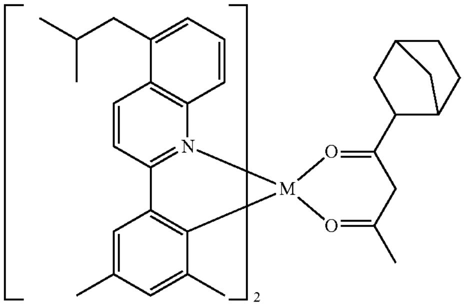
(Ir-106)
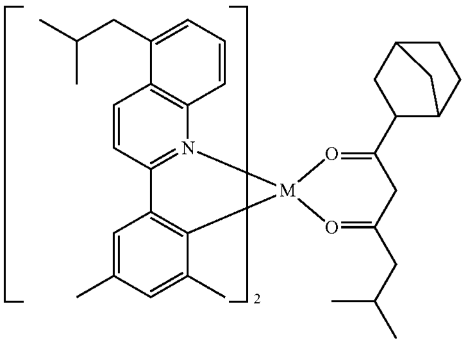
(Ir-107)
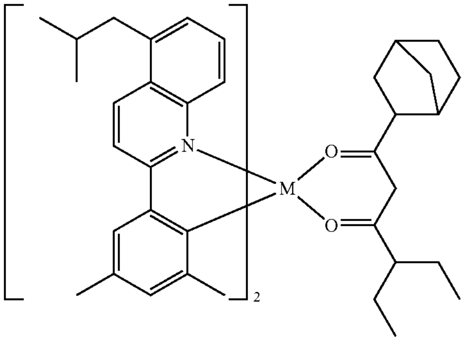
(Ir-108)
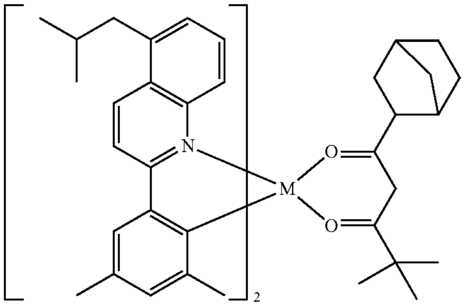
-continued
(Ir-109)
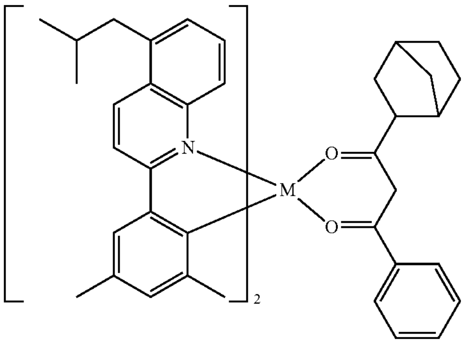
(Ir-110)
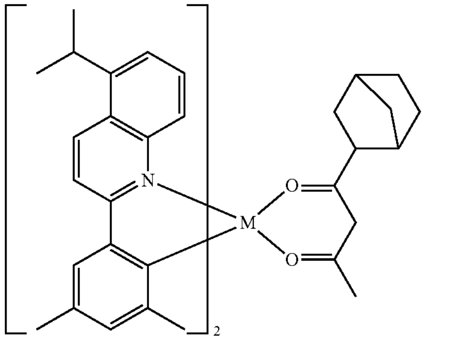
(Ir-111)
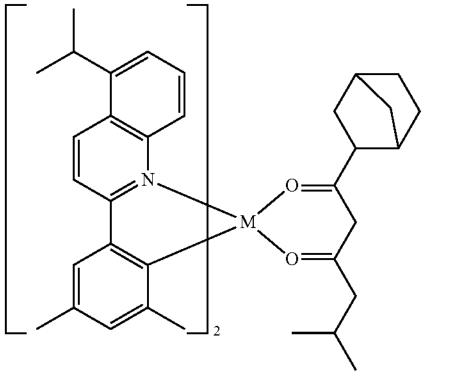
(Ir-112)
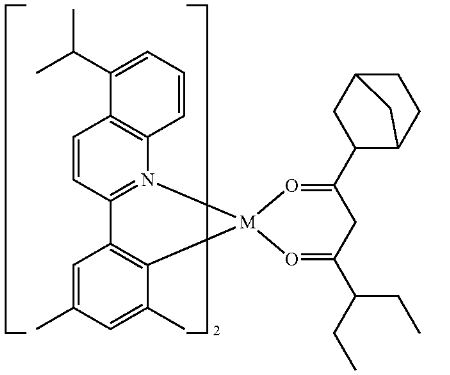

-continued
(Ir-113)
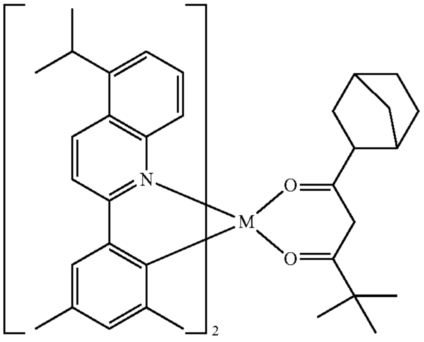
(Ir-114)
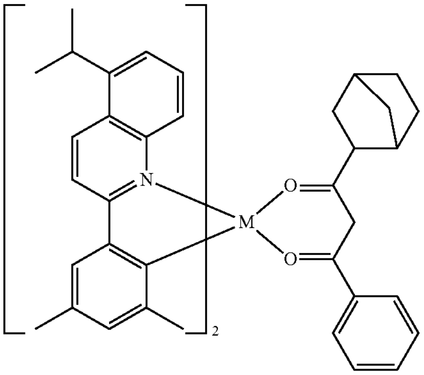
(Ir-115)
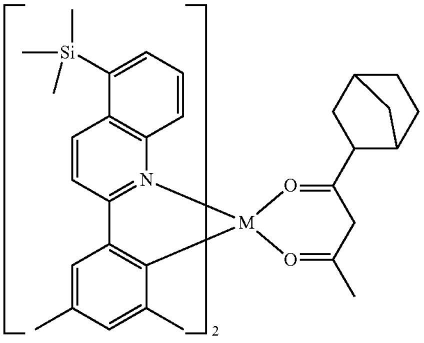
(Ir-116)
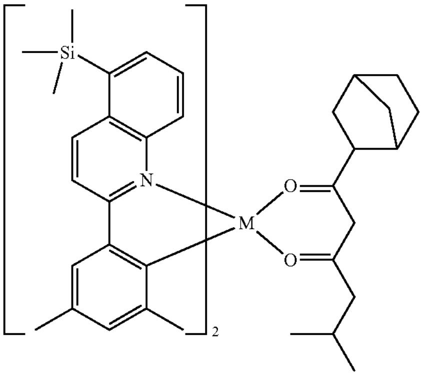
-continued
(Ir-117)
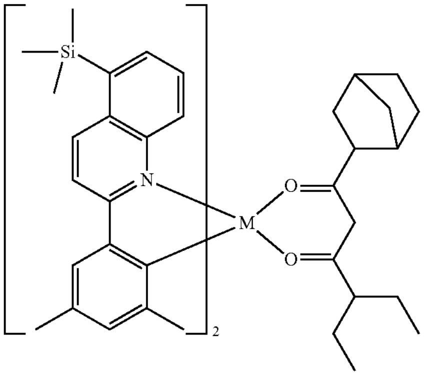
(Ir-118)
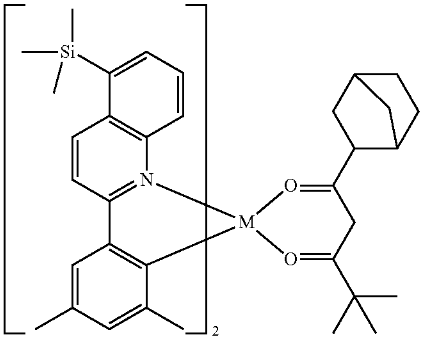
(Ir-119)
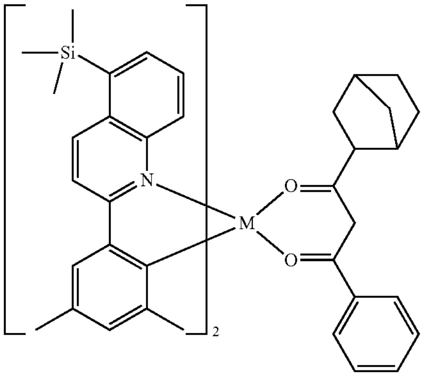
(Ir-120)
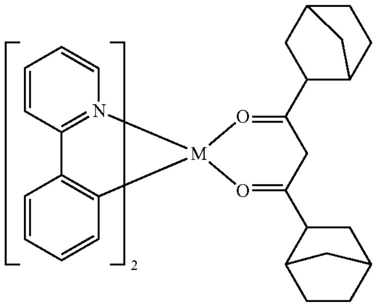

-continued
(Ir-121)
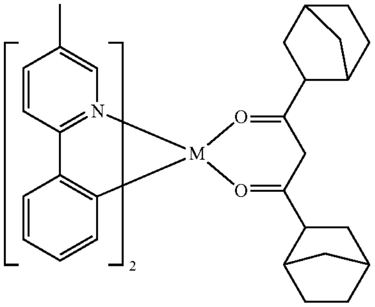
(Ir-122)
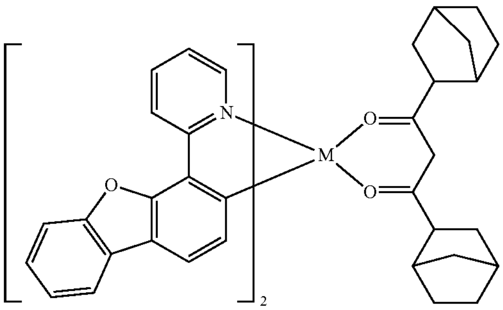
(Ir-123)
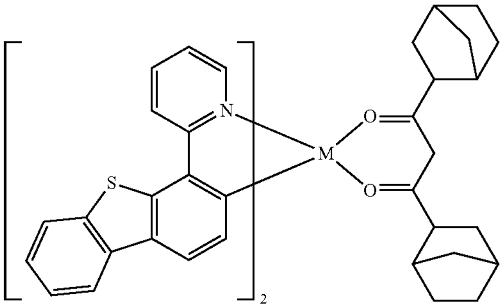
(Ir-124)
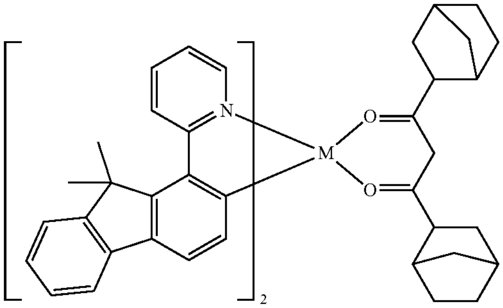
-continued
(Ir-125)
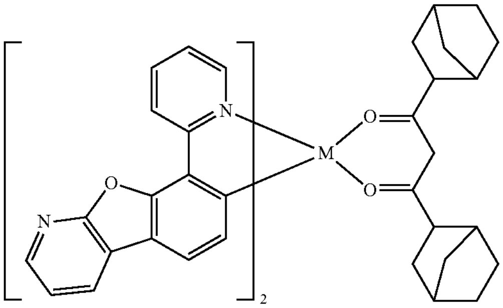
(Ir-126)
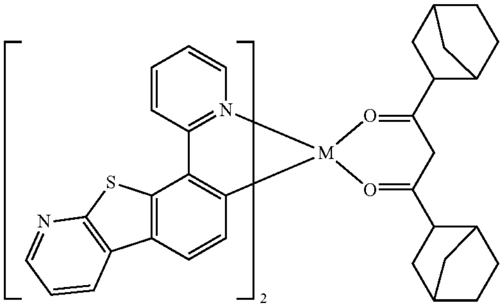
(Ir-127)
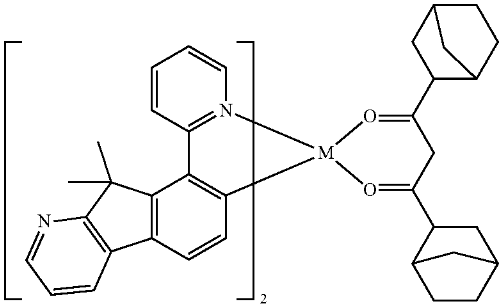
(Ir-128)
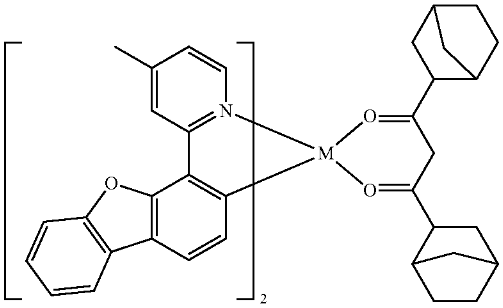

-continued
(Ir-129)
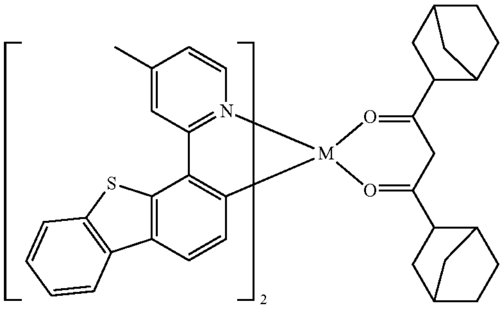
(Ir-130)
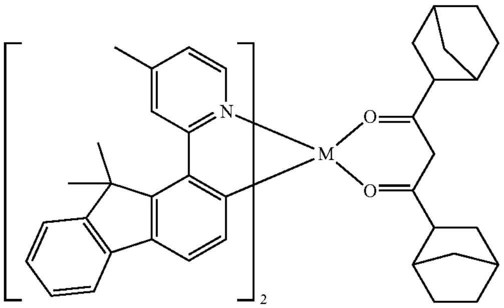
(Ir-131)
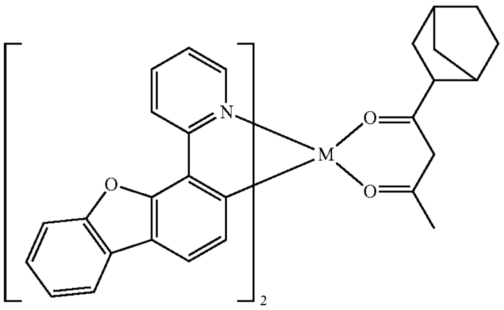
(Ir-132)
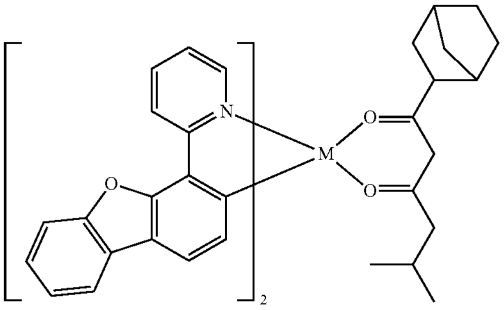
-continued
(Ir-133)
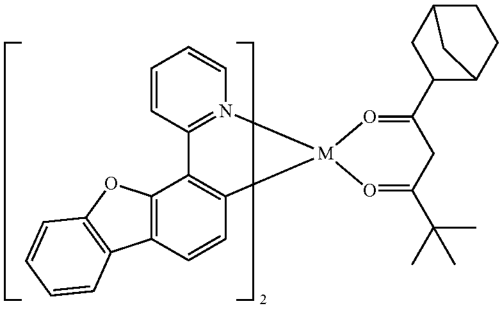
(Ir-134)
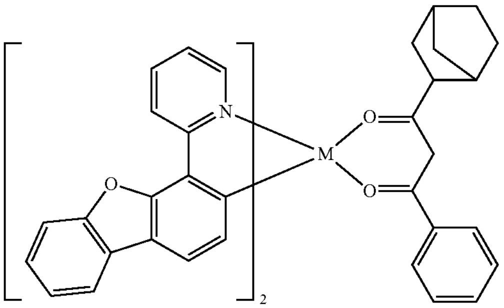
(Ir-135)
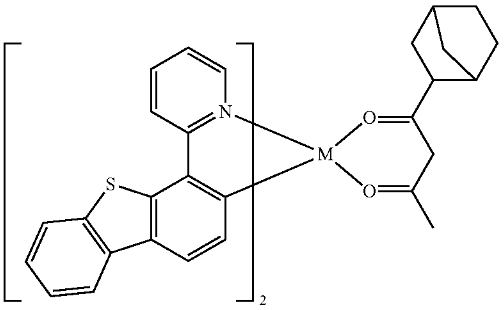
(Ir-136)
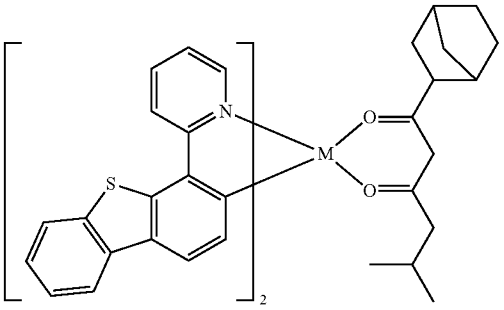

-continued
(Ir-137)
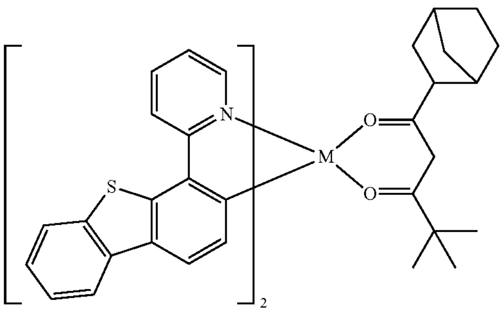
(Ir-138)
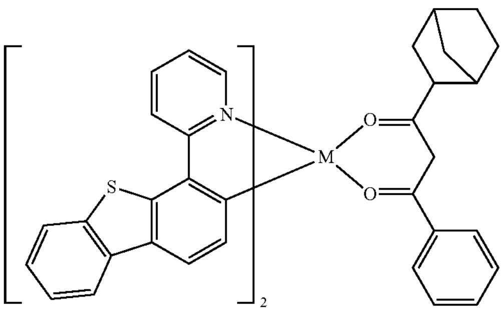
(Ir-139)
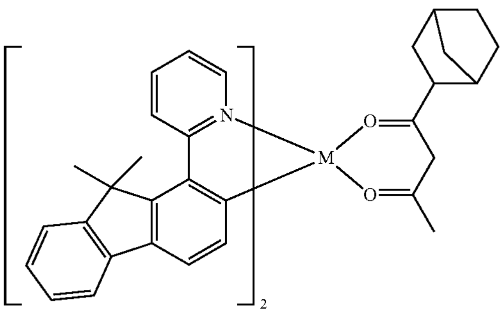
(Ir-140)
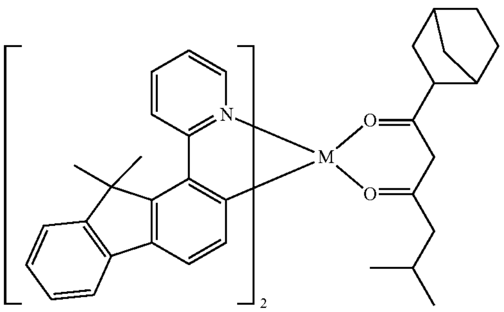
-continued
(Ir-141)
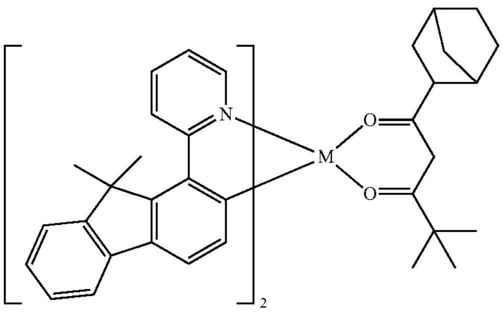
(Ir-142)
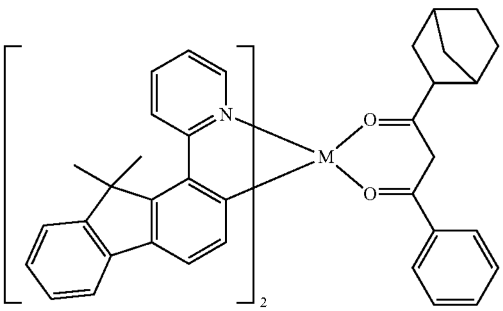
(Ir-143)
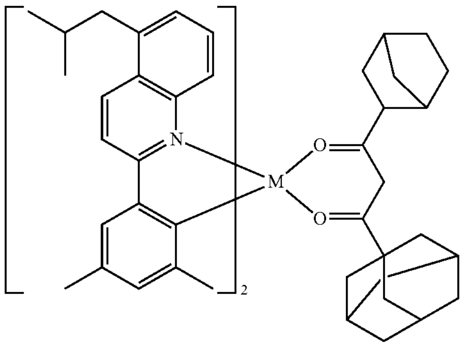
(Ir-144)
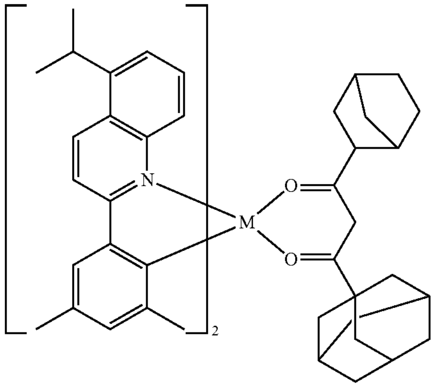

-continued
(Ir-145)
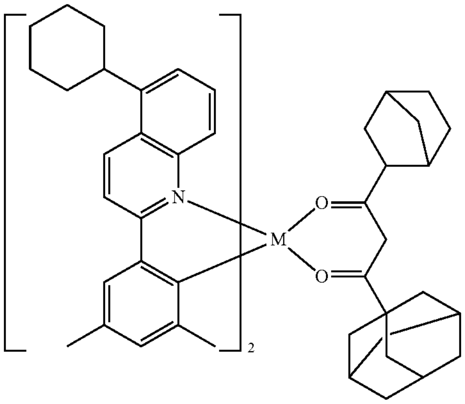
(Ir-146)
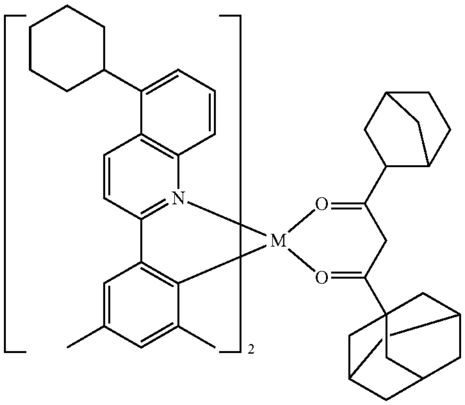
(Ir-147)
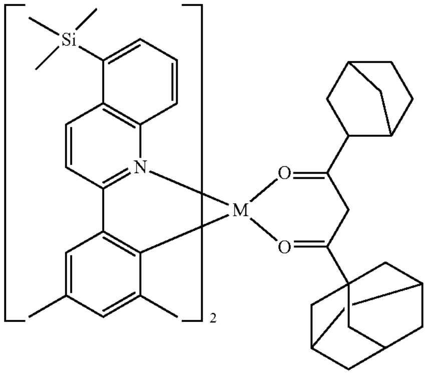
(Ir-148)
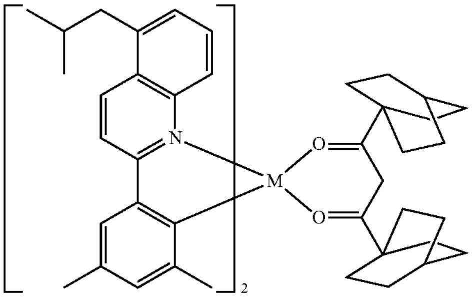
-continued
(Ir-149)
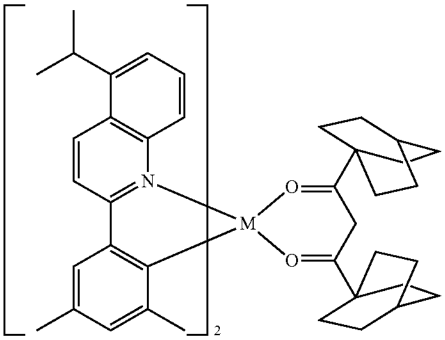
(Ir-150)
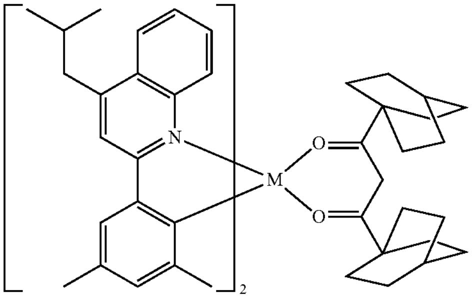
(Ir-151)
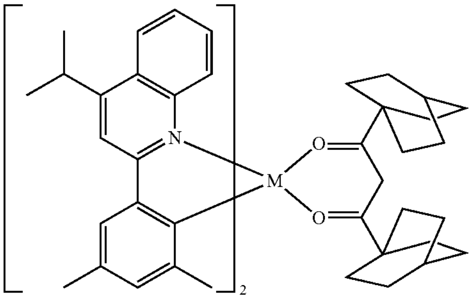
(Ir-152)
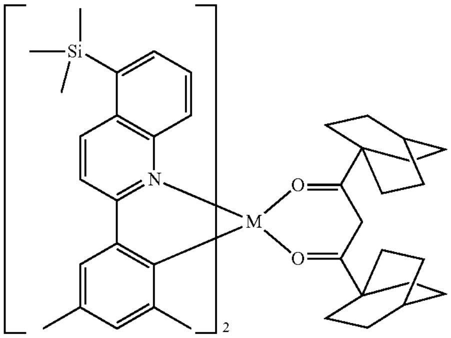

-continued
(Ir-153)
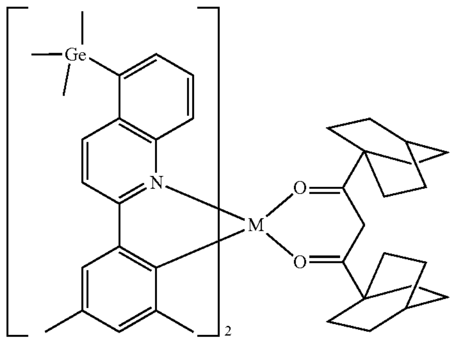
(Ir-154)
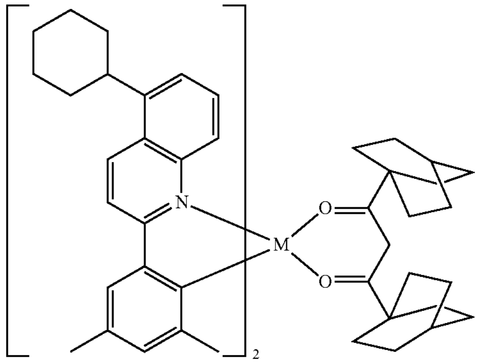
(Ir-155)
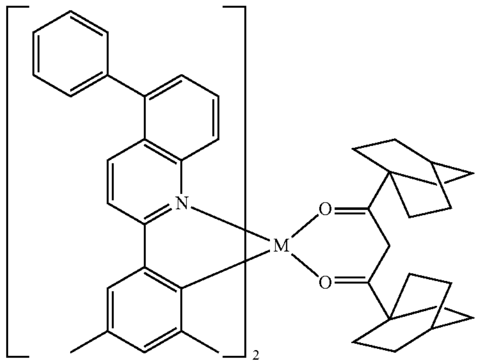
(Ir-156)
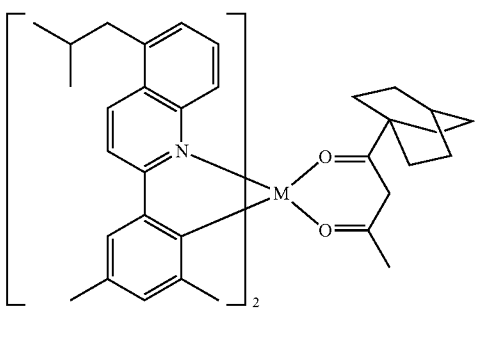
-continued
(Ir-157)
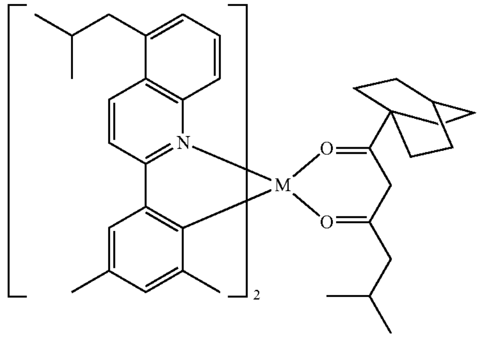
(Ir-158)
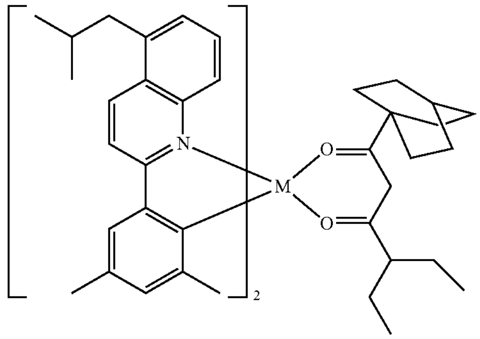
(Ir-159)
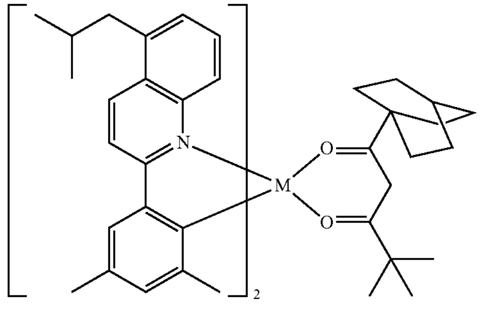
(Ir-160)
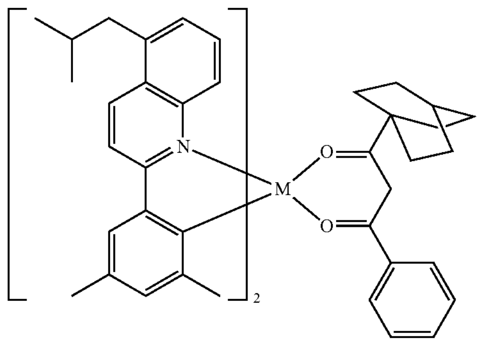

-continued
(Ir-161)
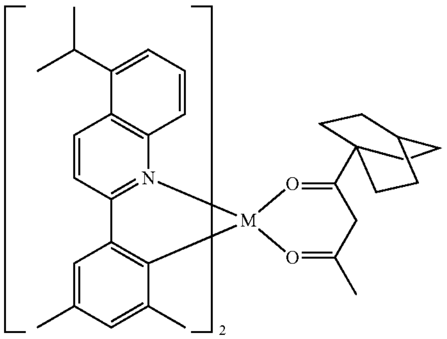
(Ir-162)
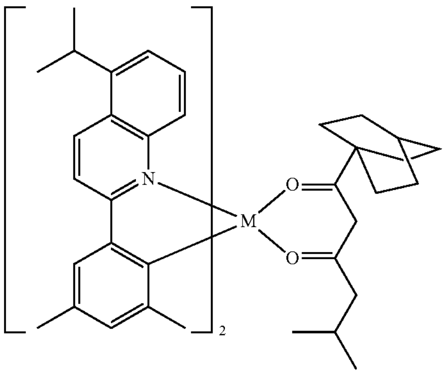
(Ir-163)
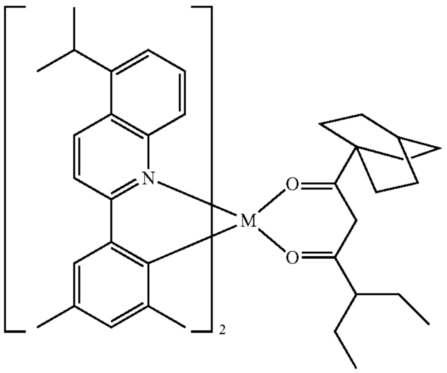
(Ir-164)
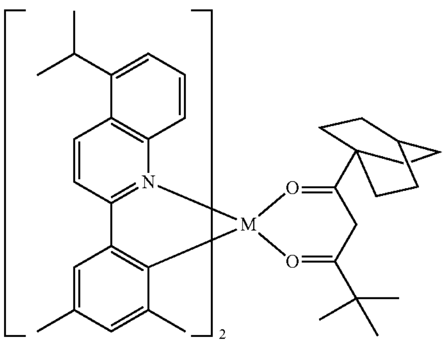
-continued
(Ir-165)
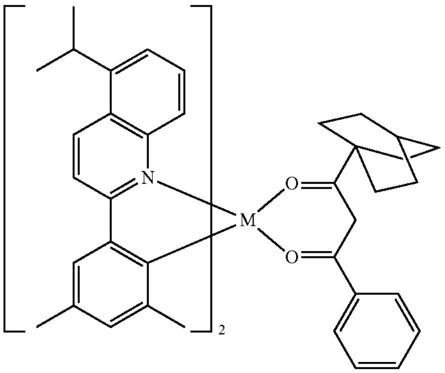
(Ir-166)
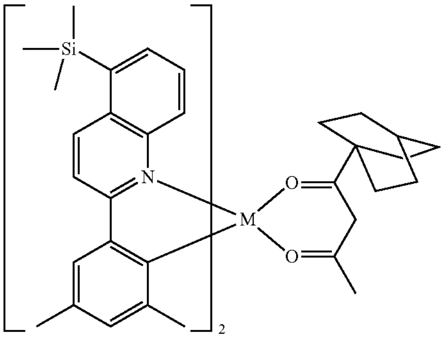
(Ir-167)
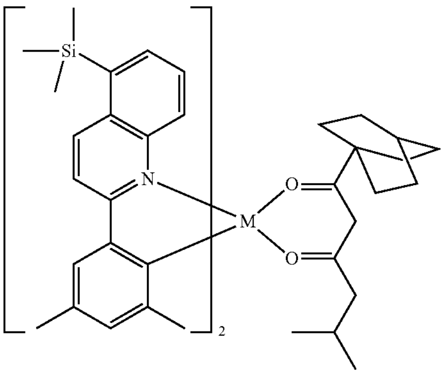
(Ir-168)
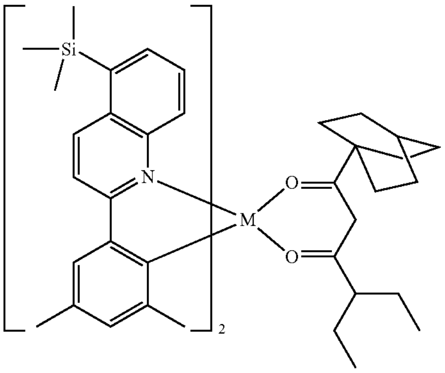

-continued
(Ir-169)
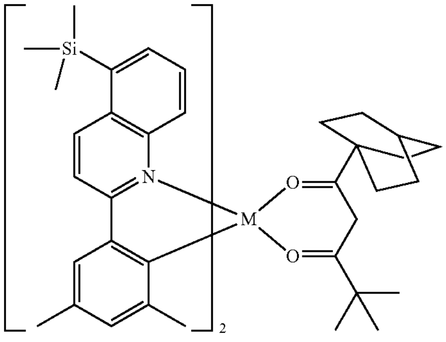
(Ir-170)
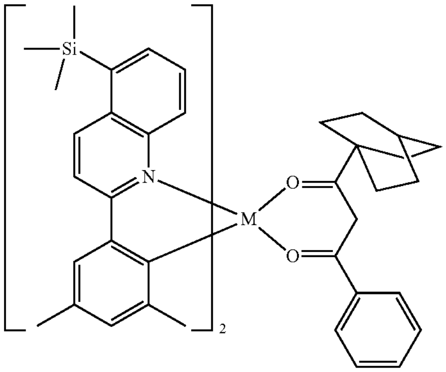
(Ir171)
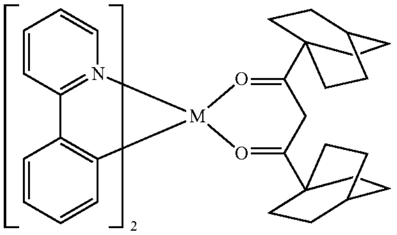
(Ir-172)
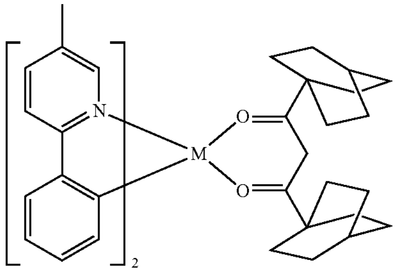
(Ir-173)
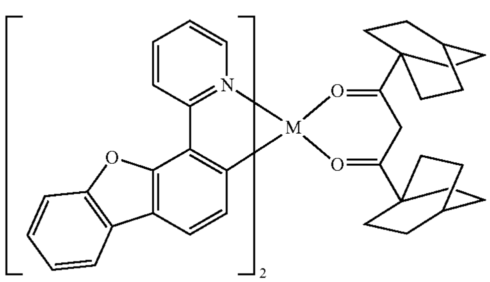
-continued
(Ir-174)
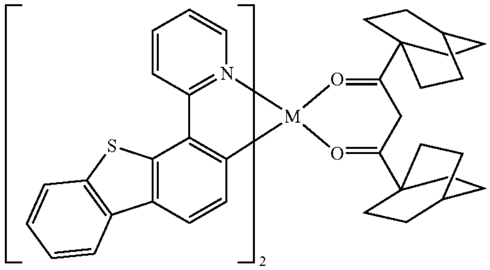
(Ir-175)
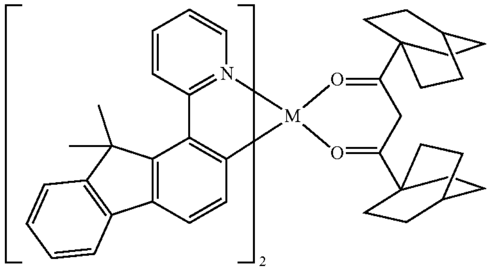
(Ir-176)
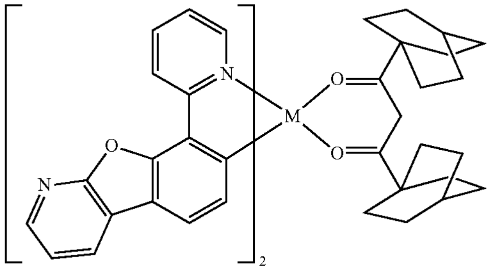
(Ir-177)
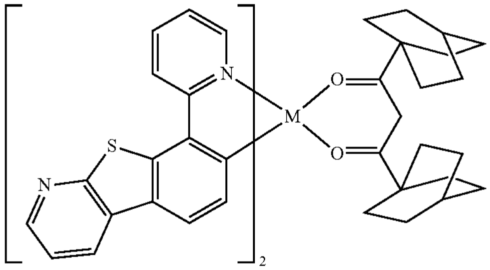
(Ir-178)
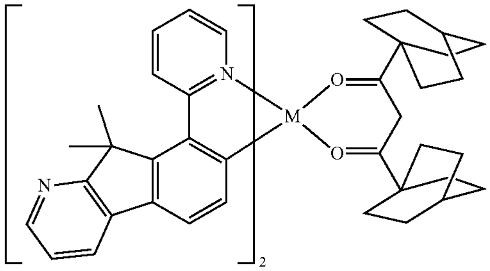

-continued
(Ir-179)
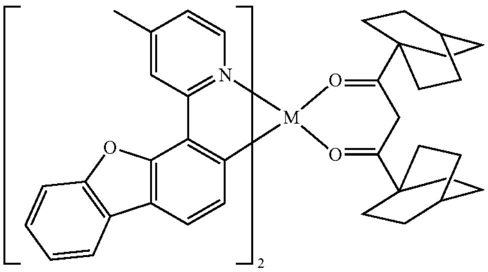
(Ir-180)
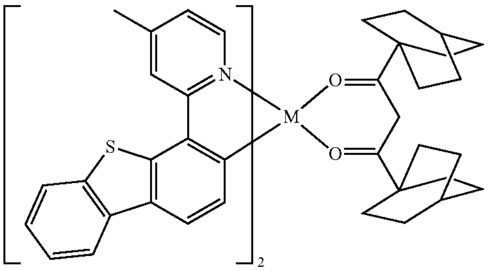
(Ir-181)
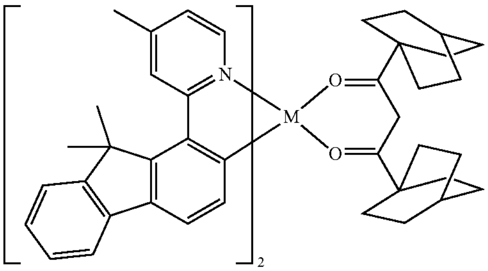
(Ir-182)
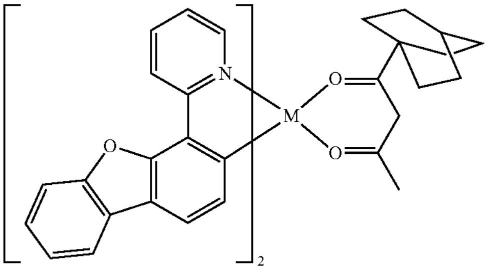
(Ir-183)
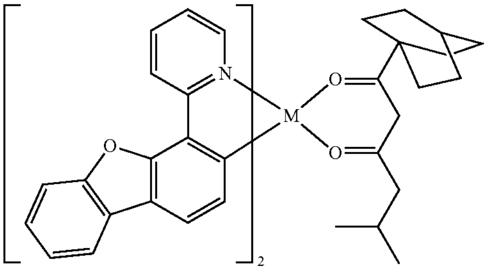
-continued
(Ir-184)
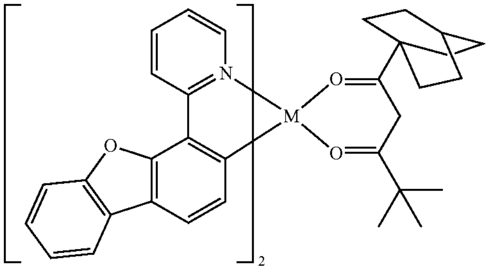
(Ir-185)
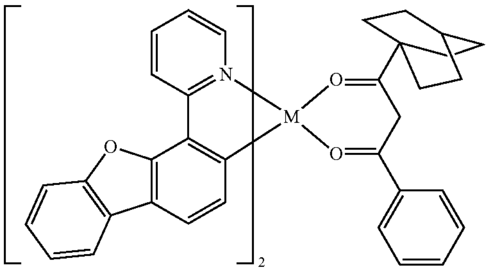
(Ir-186)
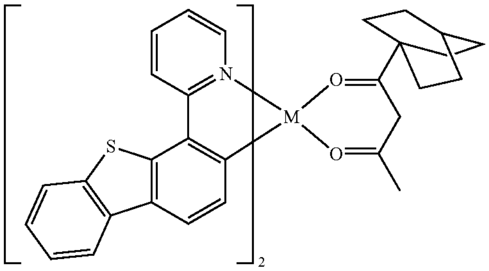
(Ir-187)
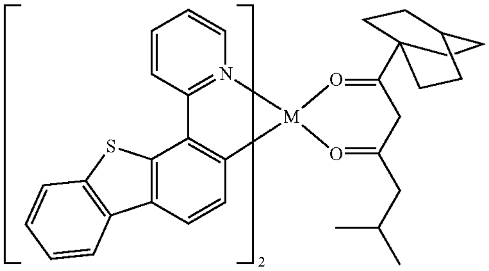
(Ir-188)
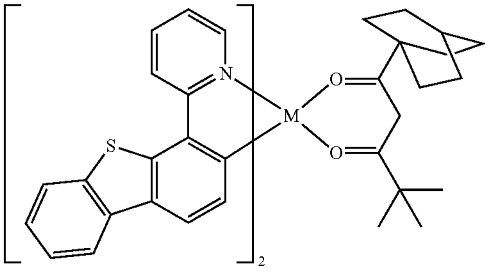

-continued
(Ir-189)
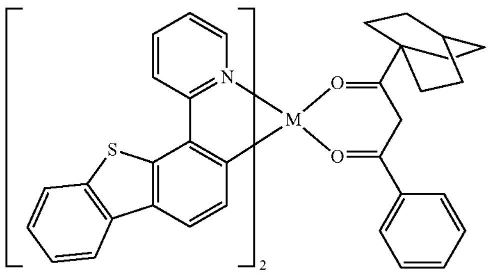
(Ir-190)
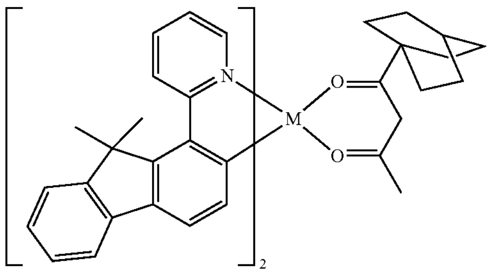
(Ir-191)
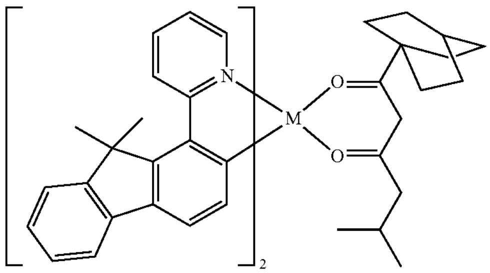
(Ir-192)
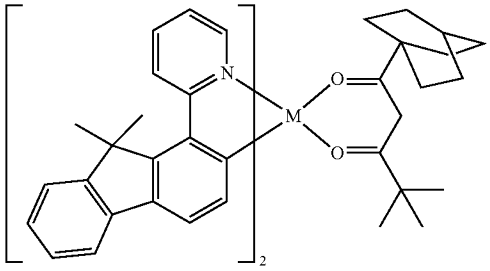
(Ir-193)
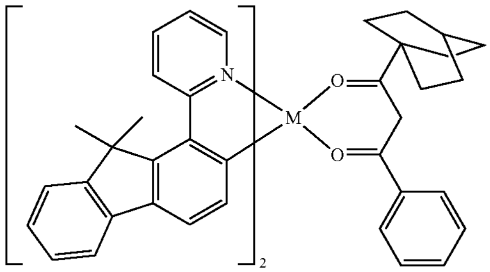
-continued
(Ir-194)
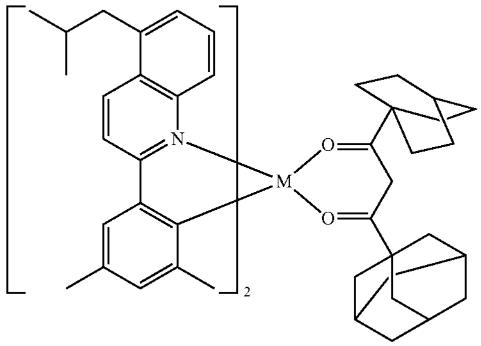
(Ir-195)
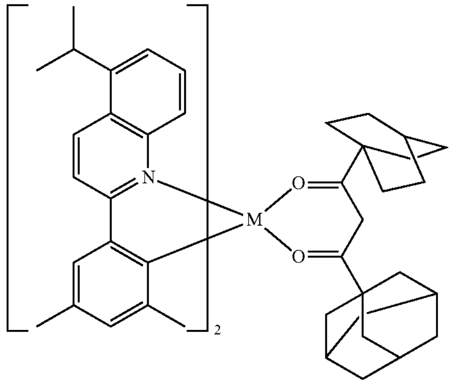
(Ir-196)
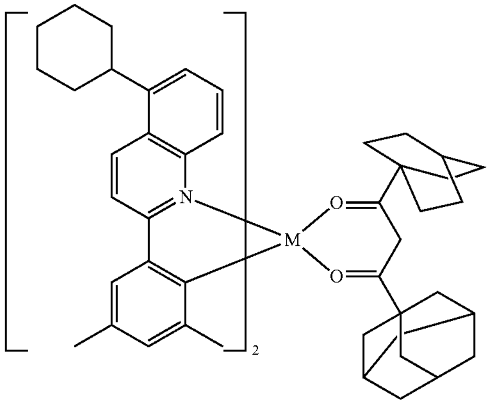
(Ir-197)
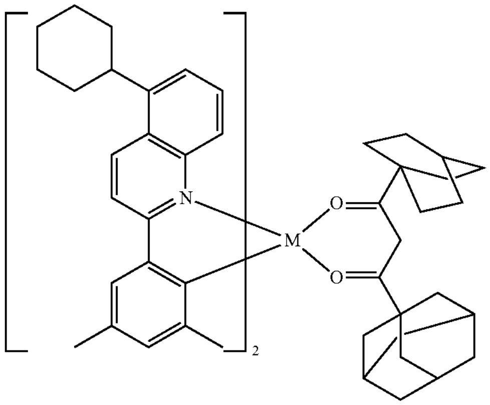

-continued
(Ir-198)
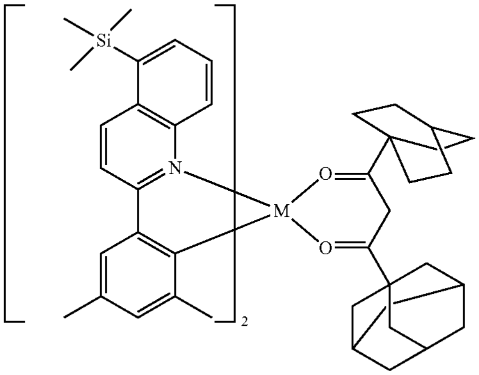
(Ir-199)
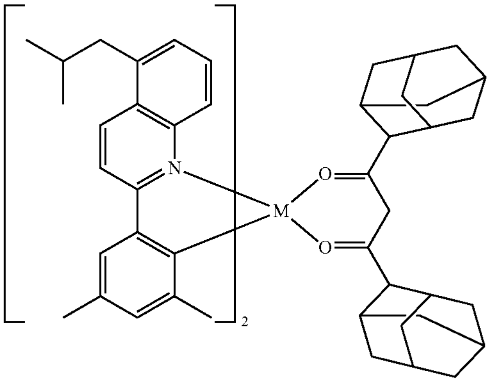
(Ir-200)
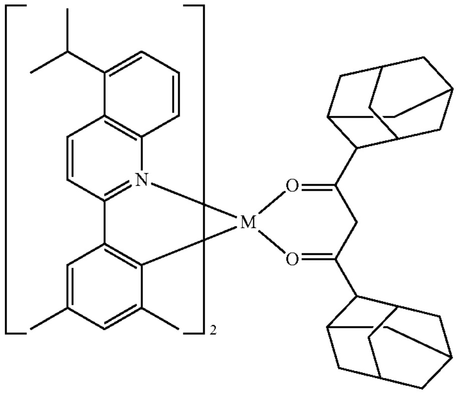
(Ir-201)
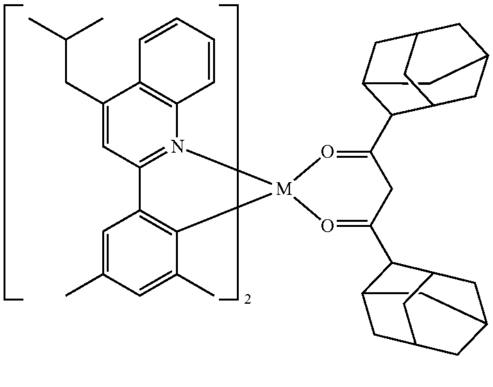
-continued
(Ir-202)
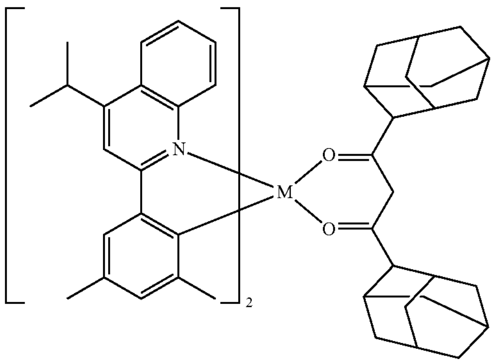
(Ir-203)
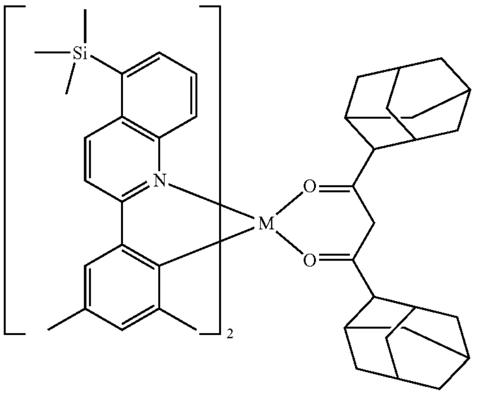
(Ir-304)
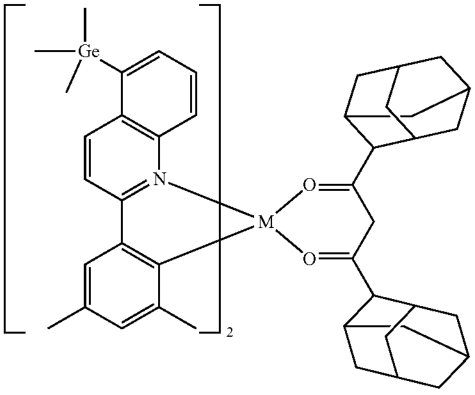
(Ir-205)
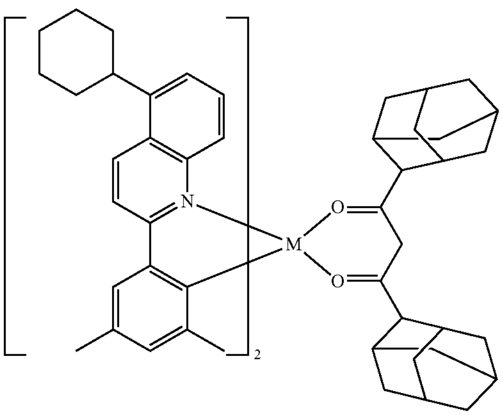

-continued
(Ir-206)
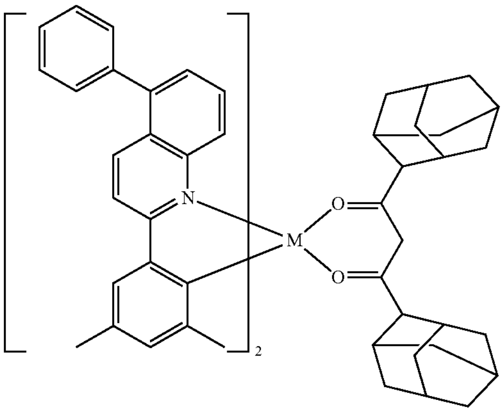
(Ir-207)
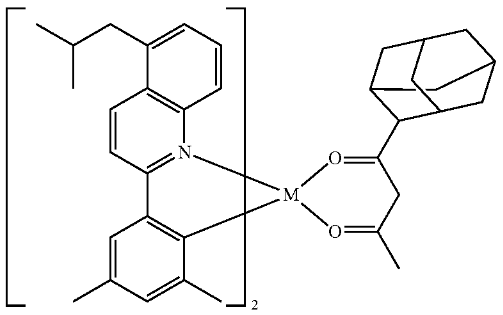
(Ir-208)
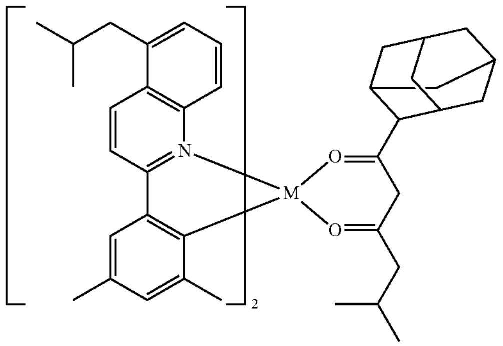
(Ir-209)
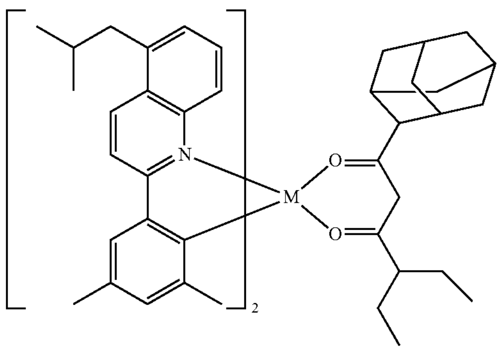
-continued
(Ir-210)
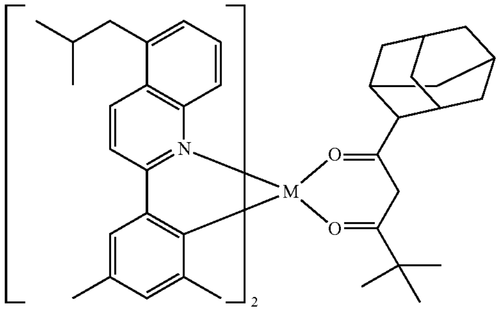
(Ir-211)
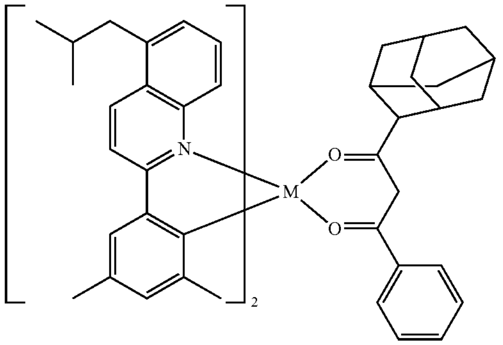
(Ir-212)
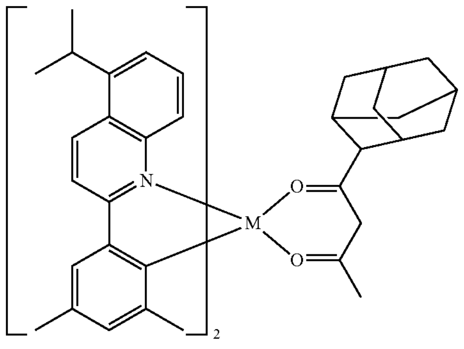
(Ir-213)
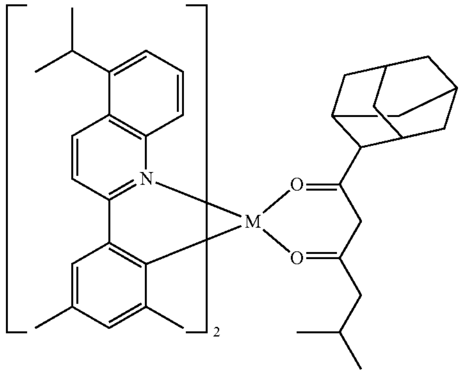

-continued
(Ir-214)
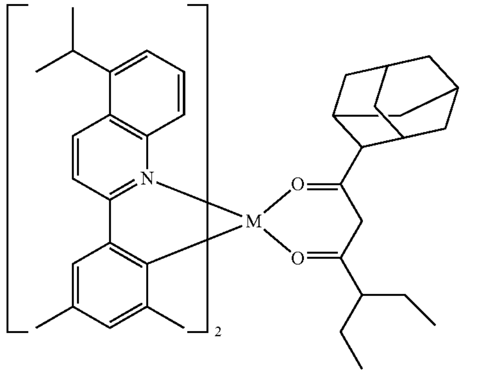
(Ir-215)
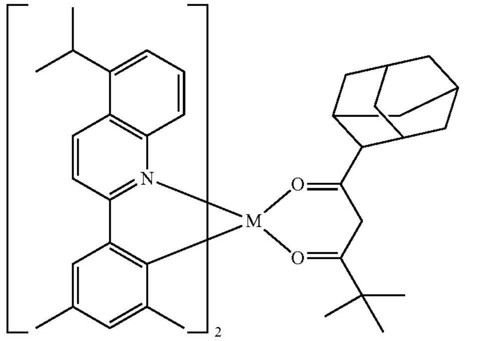
(Ir-216)
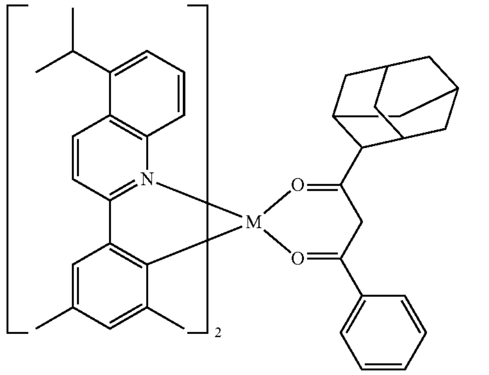
(Ir-217)
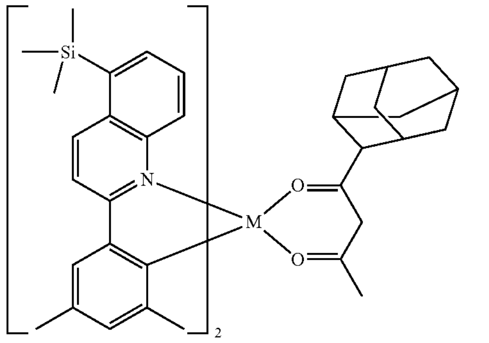
-continued
(Ir-218)
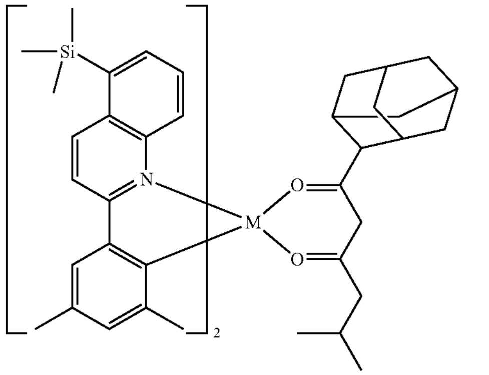
(Ir-219)
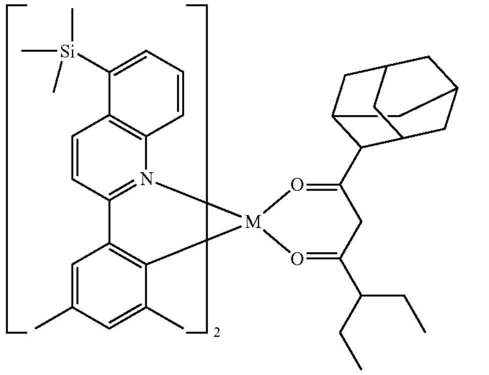
(Ir-220)
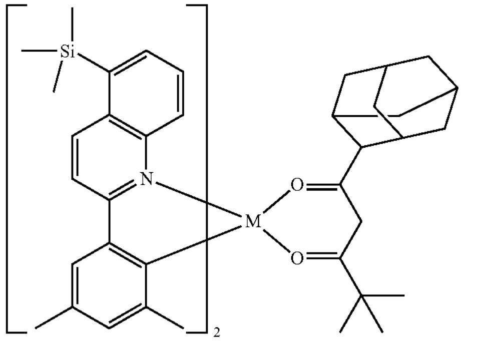
(Ir-221)
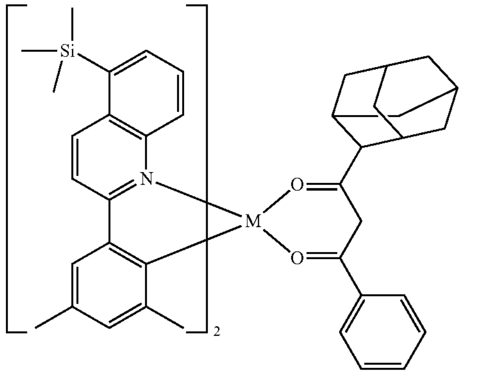

-continued
(Ir-222)
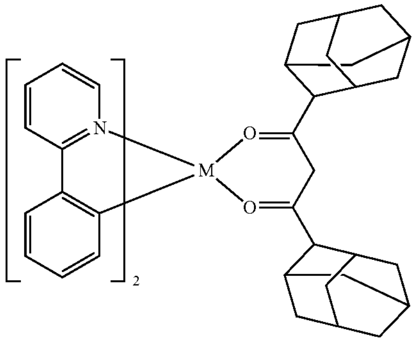
(Ir-223)
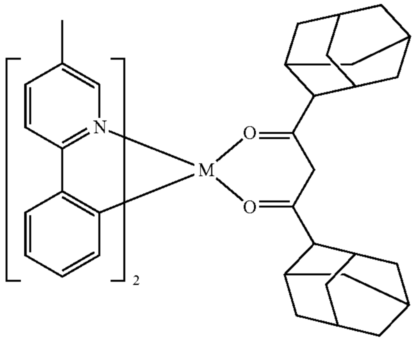
(Ir-224)
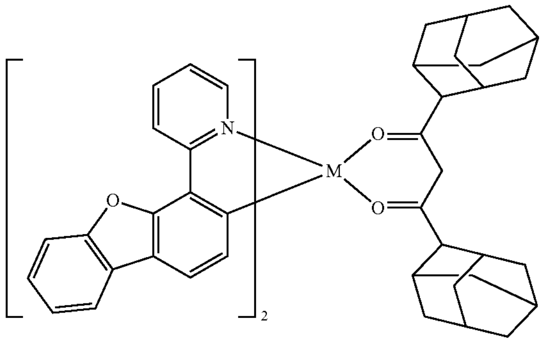
(Ir-225)
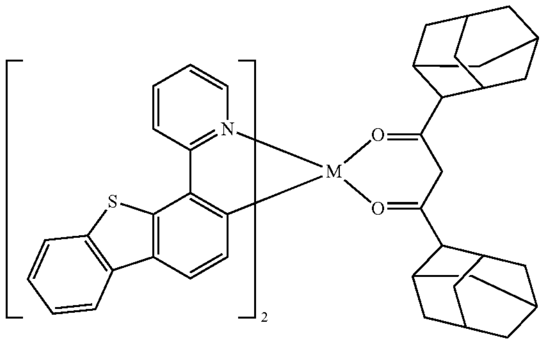
-continued
(Ir-226)
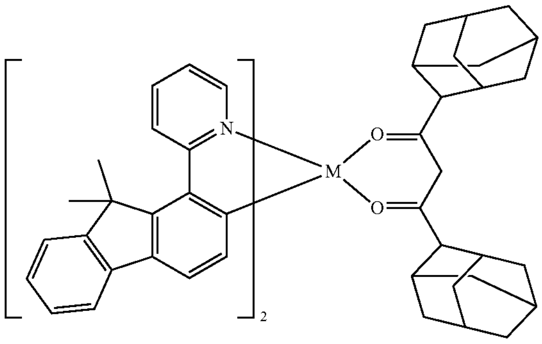
(Ir-227)
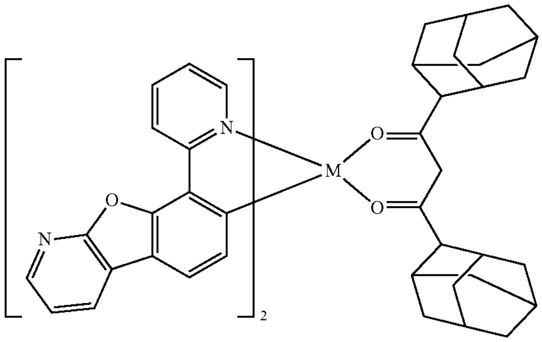
(Ir-228)
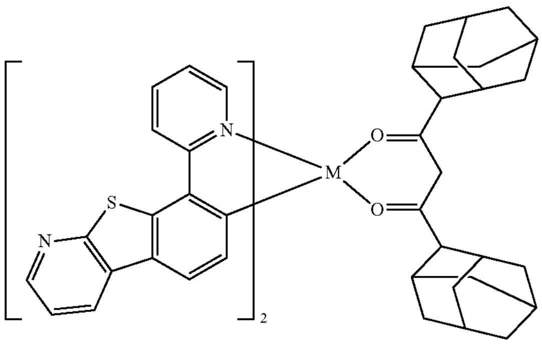
(Ir-229)
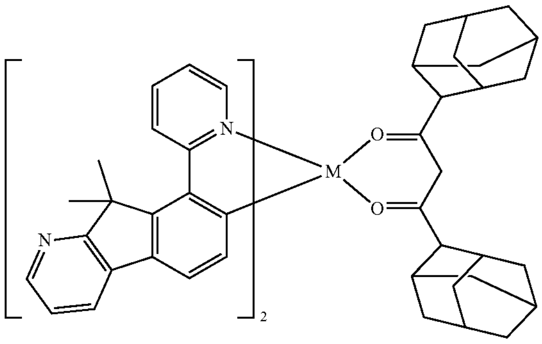

(Ir-230)
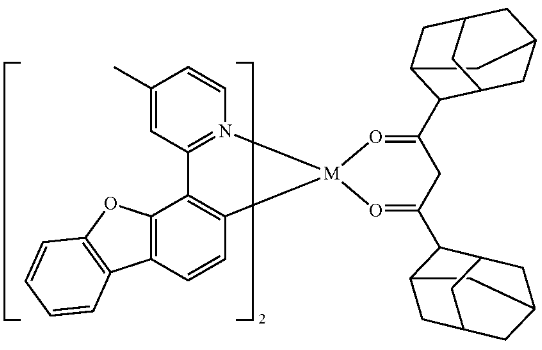
(Ir-231)
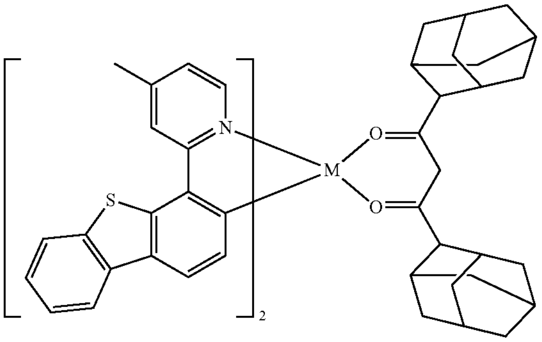
(Ir-232)
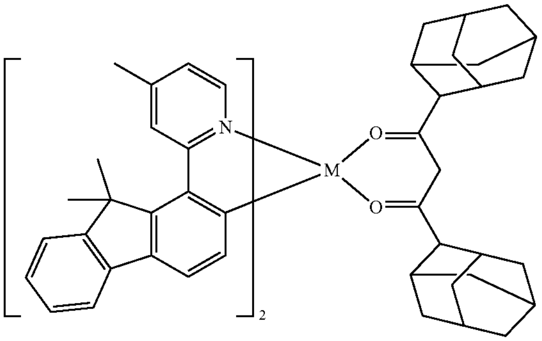
(Ir-233)
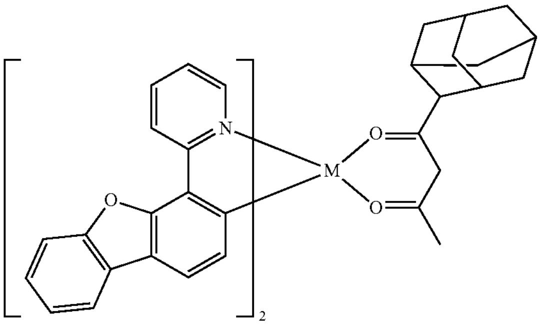
(Ir-234)
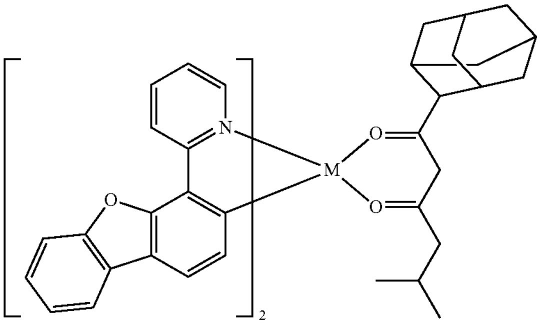
(Ir-235)
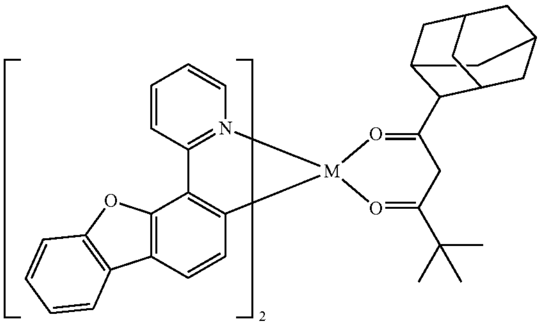
(Ir-236)
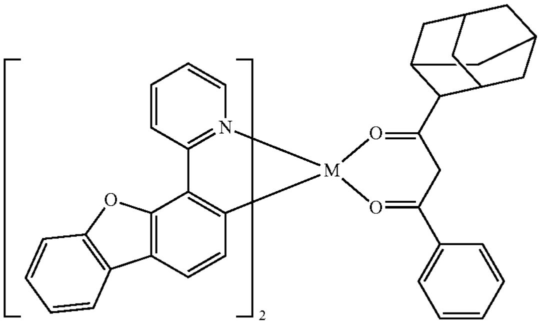
(Ir-237)
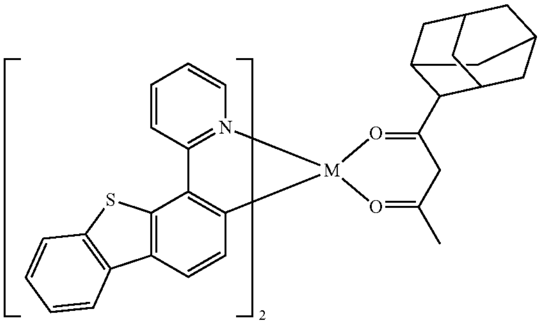

-continued
(Ir-238)
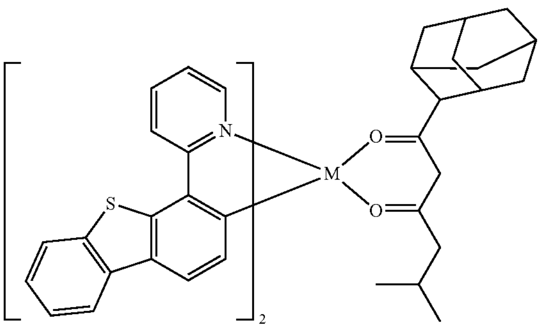
(Ir-239)
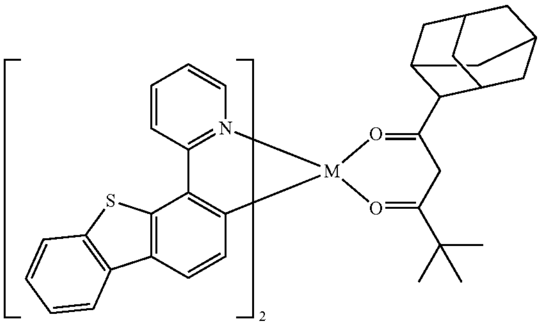
(Ir-240)
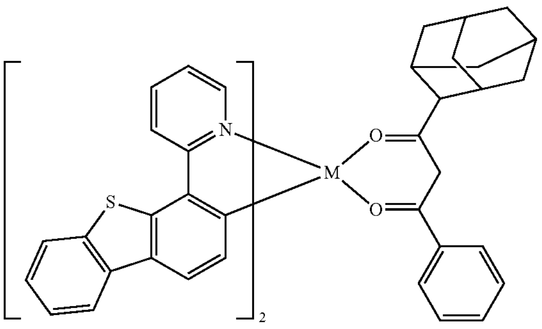
(Ir-241)
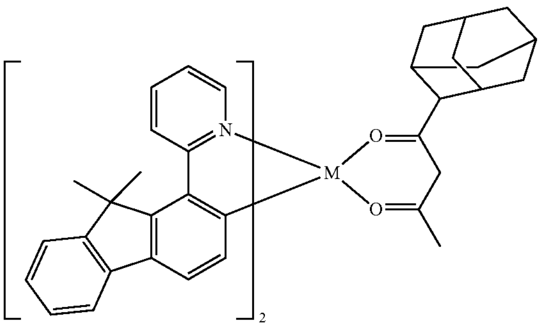
-continued
(Ir-242)
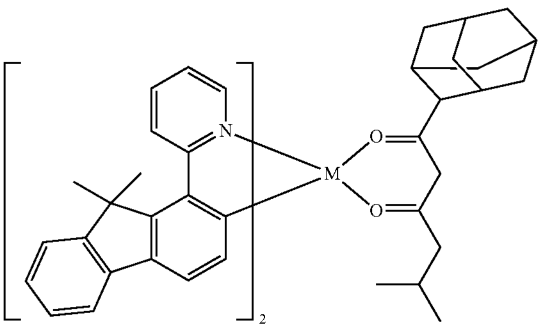
(Ir-243)
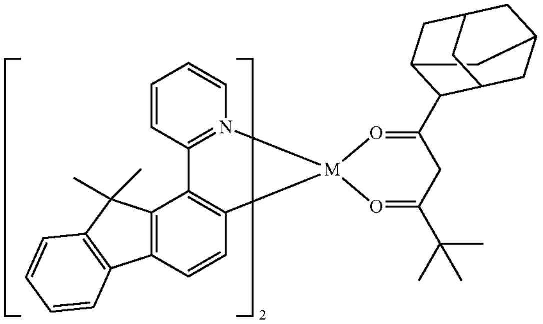
(Ir-244)
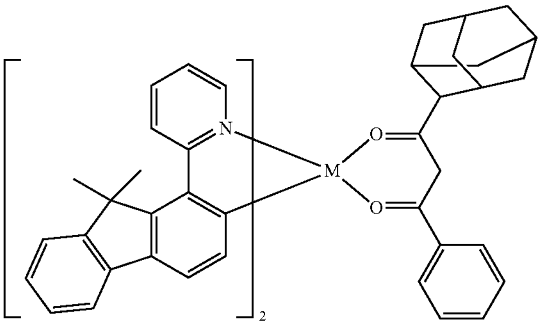
(Ir-245)
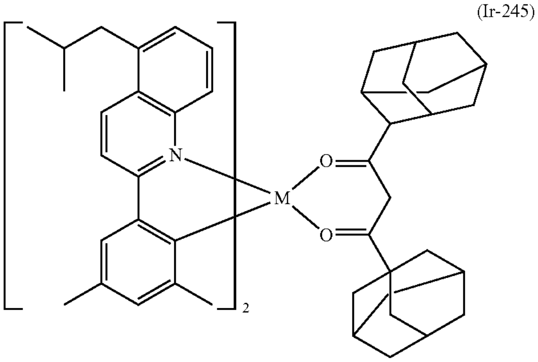

-continued (Ir-246)

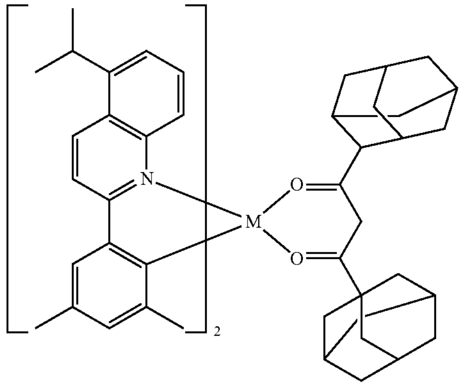

(Ir-247)

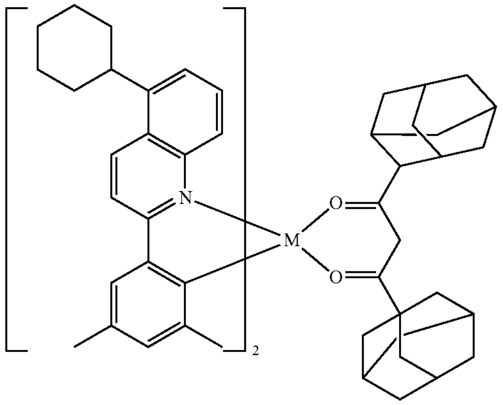

(Ir-248)

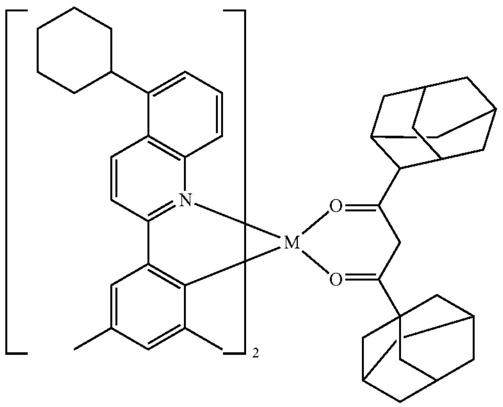

-continued (Ir-249)

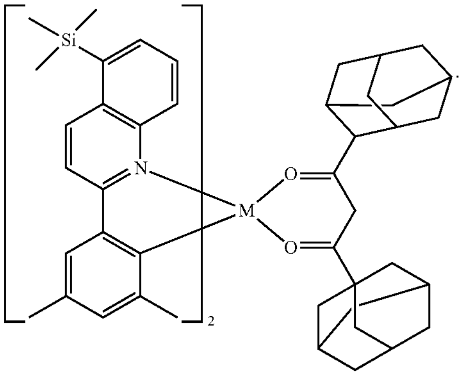

In one embodiment, the transition metal complex according to the present disclosure is a light-emitting material with a light-emitting wavelength between 300 nm and 1000 nm, further, between 350 nm and 900 nm in another embodiment, further, between 400 mu and 800 nm in a particular embodiment. The term luminescence/light-emitting herein refers to photoluminescence or electroluminescence. In some embodiments, the transition metal complex according to the present disclosure has a photoluminescence efficiency no less than 30%, further, no less than 40% in other embodiments, further, no less than 50% in other embodiments, further, no less than 60% in other embodiments.

In some embodiments, the transition metal complex according to the present disclosure may also be a non-light-emitting material.

The present disclosure also relates to a transition metal polymer of which at least one repeating unit has the structure represented by the Chemical Formula (I). In some embodiments, the polymer is a non-conjugated polymer, wherein the structural unit represented by the Chemical Formula (I) is on the side chain. In another embodiment, the polymer is a conjugated polymer.

In one embodiment, the synthesis method of the transition metal polymer is selected from the group consisting of SUZUKI-, YAMAMOTO-, STILLE-, NIGESHI-, KUMADA-, HECK-, SONOGASHIRA-, HIYAMA-, FUKUYAMA-, HARTWIG-BUCHWALD- and ULLMAN.

In one embodiment, the transition metal polymer according to the present disclosure has a glass transition temperature ($T_g$)≥100° C. In one embodiment, the transition metal polymer according to the present disclosure has a $T_g$≥120° C. In one embodiment, the transition metal polymer according to the present disclosure has a $T_g$≥140° C. In one embodiment, the transition metal polymer according to the present disclosure has a $T_g$≥160° C. In one embodiment, the transition metal polymer according to the present disclosure has a $T_g$≥180° C.

In one embodiment, the polymer according to the present disclosure has a molecular weight distribution (Polymer dispersity index, PDI) in the range of 1 to 5. In one embodiment, the polymer according to the present disclosure has a molecular weight distribution (Polymer dispersity index, PDI) in the range of 1 to 4. In one embodiment, the polymer according to the present disclosure has a molecular weight distribution (Polymer dispersity index, PDI) in the range of 1 to 3. In one embodiment, the polymer according to the present disclosure has a molecular weight distribution (Polymer dispersity index, PDI) in the range of 1 to 2. In one embodiment, the polymer according to the present disclosure has a molecular weight distribution (Polymer dispersity index, PDI) in the range of 1 to 1.5.

In one embodiment, the transition metal polymer according to the present disclosure has a weight average molecular weight (Mw) in the range of 10,000 to 1,000,000, and 50,000 to 500,000 in another embodiment, 100,000 to 400,000 in another embodiment, 150,000 to 300,000 in another embodiment, 200,000 to 250,000 in a particular embodiment.

The present disclosure further relates to a mixture comprising at least the transition metal complex or the transition metal polymer according to the present disclosure, and at least another organic functional material. The organic functional materials described include hole (also known as electronic hole) injection or transport materials (HIM/HTM), hole blocking materials (HBM), electron injection or transport materials (EIM/ETM), electron blocking materials (EBM), organic host materials, singlet emitters (fluorescent emitters), triplet emitters (phosphorescent emitters), particularly luminescent organometallic complexes, and doping materials (dopants). Various organic functional materials are described in detail, for example, in WO2010135519A1, US20090134784A1, and WO2011110277A1, the entire contents of which are hereby incorporated herein by reference. The organic functional material may be a small molecule material or a polymer material.

In some embodiments, the content of the transition metal complex in the transition metal mixture according to the present disclosure is 0.01 wt % to 30 wt %, 0.5 wt % to 20 wt % in other embodiments, 2 wt % to 15 wt % in other embodiments, 5 wt % to 15 wt in other embodiments.

In one embodiment, the mixture according to the present disclosure comprises the transition metal complex or the transition metal polymer according to the present disclosure and a triplet matrix material.

In another embodiment, the mixture according to the present disclosure comprises the transition metal complex or the transition metal polymer according to the present disclosure, a triplet matrix material and another triplet emitter.

In another embodiment, the mixture according to the present disclosure comprises the transition metal complex or the transition metal polymer according to the present disclosure and a thermally activated delayed fluorescence (TADF) light-emitting material.

In another embodiment, the transition metal mixture according to the present disclosure comprises the transition metal complex or the transition metal polymer according to the present disclosure, a triplet matrix material and a thermally activated delayed fluorescence (TADF) light-emitting material.

The triplet matrix materials, triplet emitters and TADF materials are described in more detail below (but are not limited thereto).

1. Triplet Host Materials

Examples of triplet host materials are not particularly limited, and any metal complex or organic compound may be used as a host as long as it has higher triplet energy than the emitter, particularly the triplet emitter or the phosphorescent emitter. Examples of the metal complexes that can be used as the triplet host include, but are not limited to the following general structure:

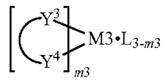

M3 is a metal; ($Y^3$-$Y^4$) is a bidentate ligand, $Y^3$ and $Y^4$ are independently selected from the group consisting of C, N, O, P and S; L is an auxiliary ligand; m3 is an integer from 1 to the maximum coordination number of the metal. In one embodiment, the metal complex that may be used as a triplet host has the following forms:

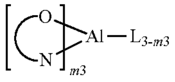 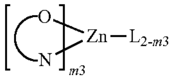

(O—N) is a bidentate ligand, wherein the metal is coordinated with O and N atoms, m3 is an integer from 1 to the maximum coordination number of the metal.

In a certain embodiment, M3 may be selected from Ir and Pt.

Examples of the organic compounds that may be used as a triplet host are selected from the group consisting of: compounds containing cyclic aromatic hydrocarbon group, such as benzene, biphenyl, triphenylbenzene, benzofluorene; compounds containing aromatic heterocyclic groups, such as dibenzothiophene, dibenzofuran, dibenzoselenophen, furan, thiophene, benzofuran, benzothiophene, benzoselenophen, carbazole, dibenzocarbazole, indolocarbazole, pyridine indole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, benzofuropyridine, furopyridine, benzothiophene pyridine, thiophene pyridine, benzoselenophene pyridine and selenophenbenzodipyridine; or groups containing 2 to 10 ring structure, which may be the same or different type of cyclic aromatic hydrocarbon groups or aromatic heterocyclic groups and are connected to each other directly or through at least one of the following groups, such as oxygen atom, nitrogen atom, sulfur atom, silicon atom, phosphorus atom, boron atom, chain structure unit, and aliphatic ring group. Wherein, each Ar may be further substituted, and the substituent may be selected from the group consisting of hydrogen, deuterium, cyano group, halogen, alkyl, alkoxy group, amino group, alkenyl, alkynyl, aralkyl, heteroalkyl, aryl and heteroaryl.

In one embodiment, the triplet host materials may be selected from compounds containing at least one of the following groups:

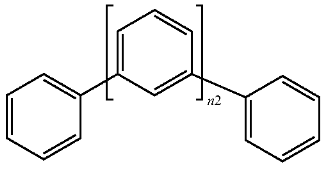

-continued
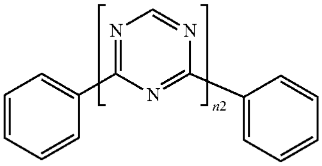
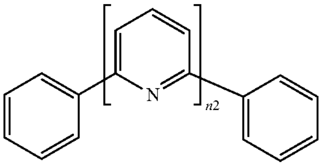
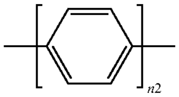
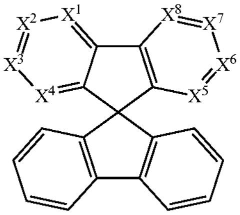
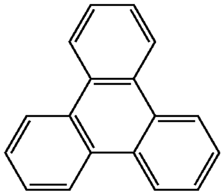
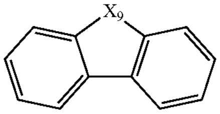
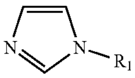
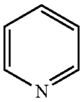
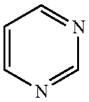
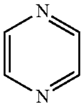
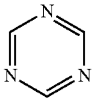
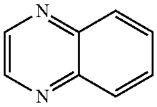
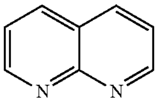
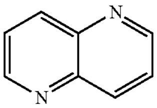
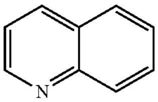
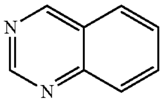
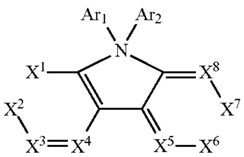
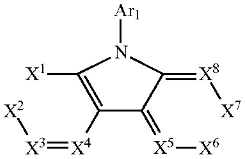
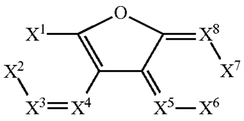
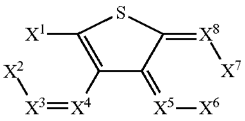
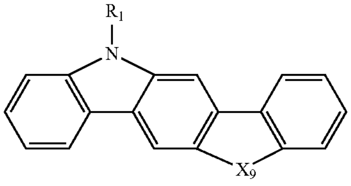
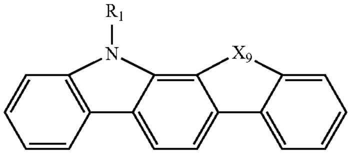
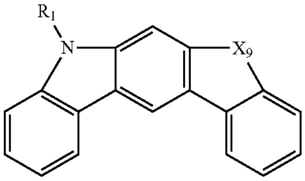
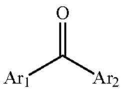
-continued
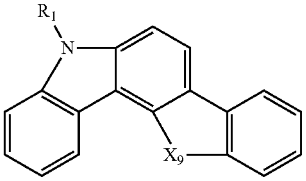
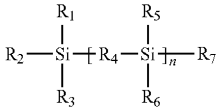
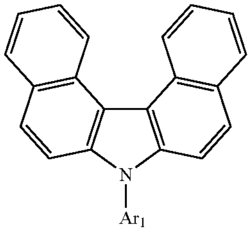
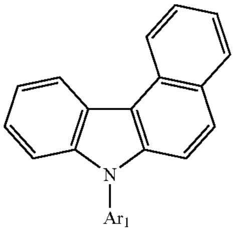
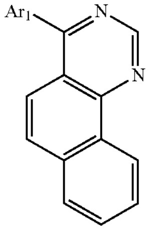
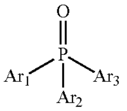
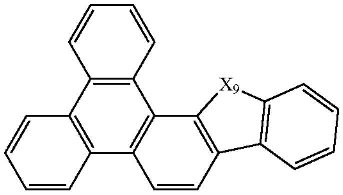
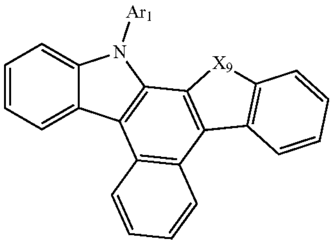
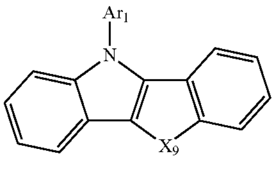
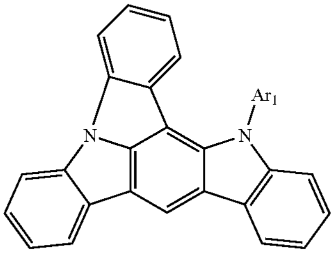
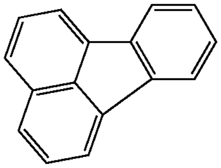

-continued
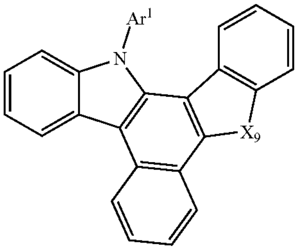
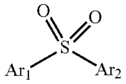
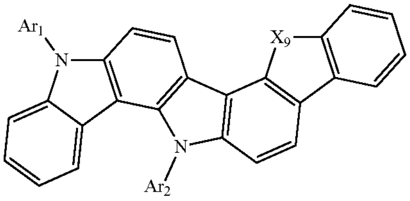
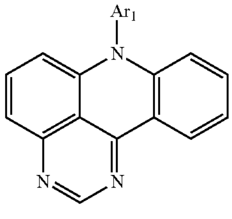
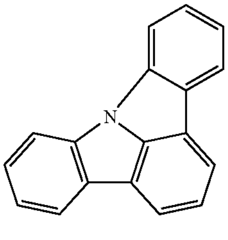
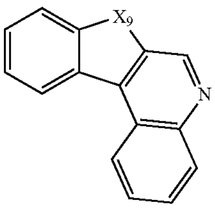
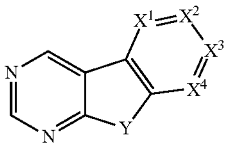
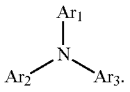
$R_2$-$R_7$ have the same definitions as $R_1$, $X_9$ is selected from $CR_1R_2$ or $NR_1$, and Y is selected from $CR_1R_2$, $NR_1$, O or S. $R_1$, n2, $X^1$-$X^8$, $Ar_1$~$Ar_3$ are defined as above.
Suitable examples of the triplet host materials are listed below, but are not limited to:
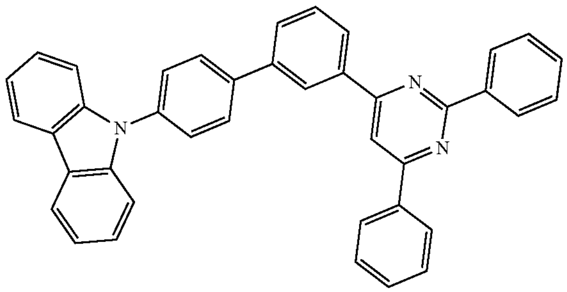
-continued
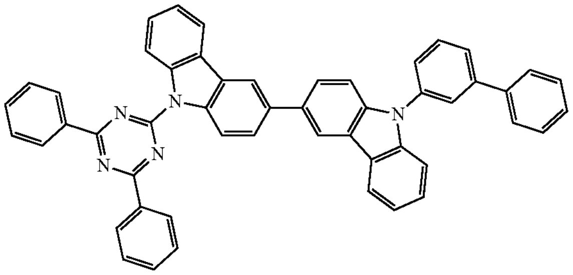
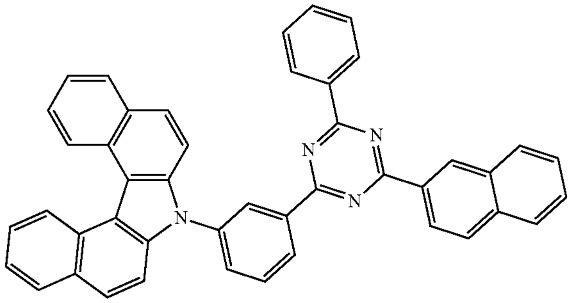
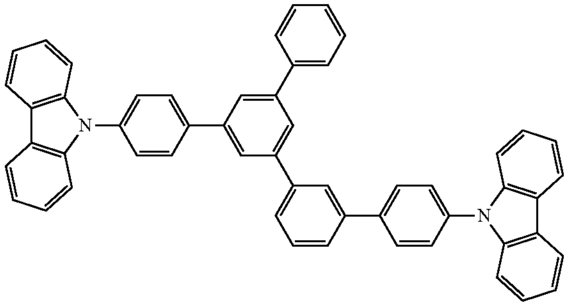
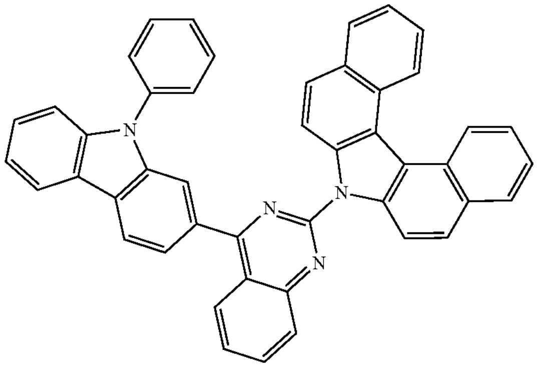
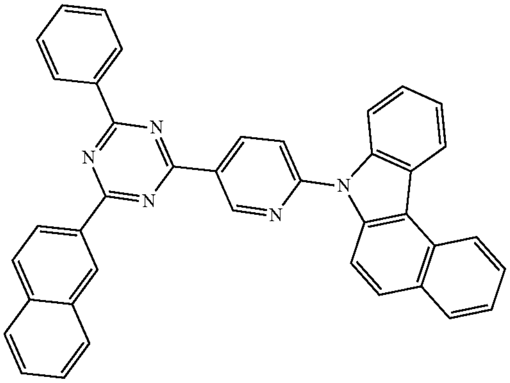

-continued
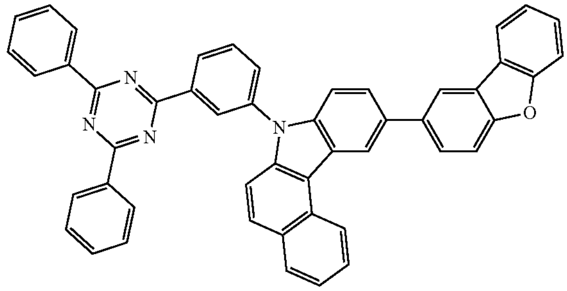
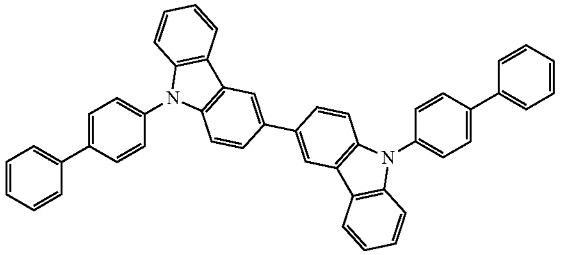
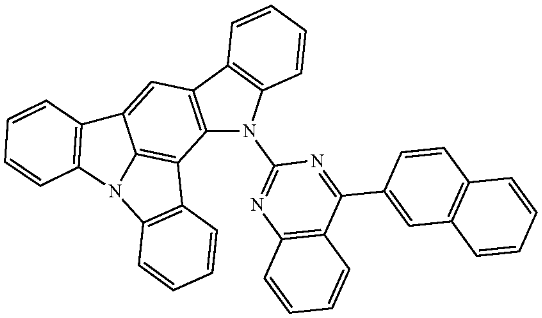
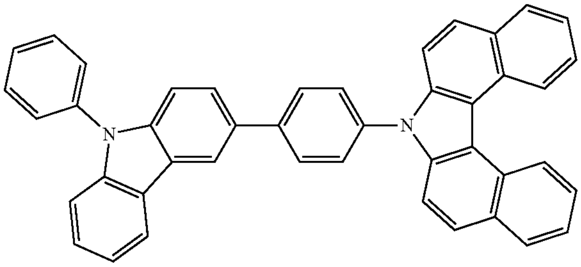
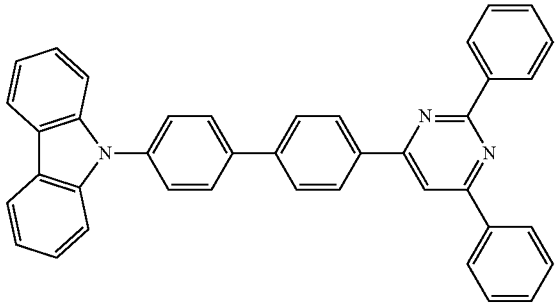
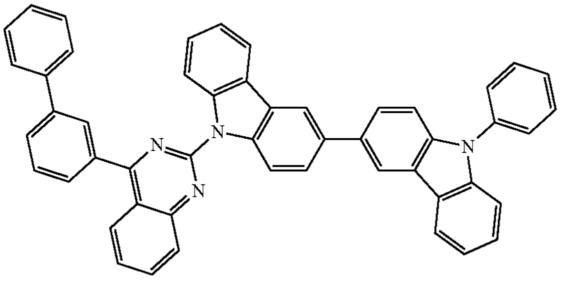
-continued
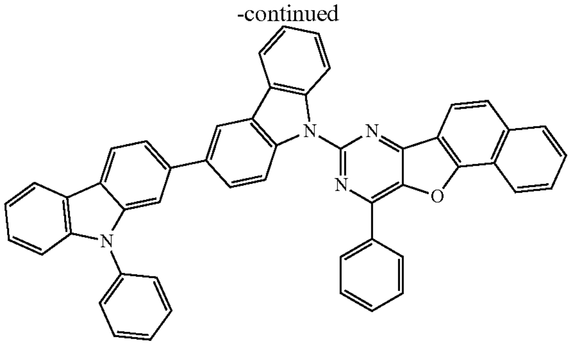
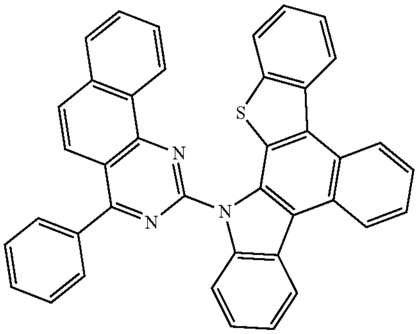
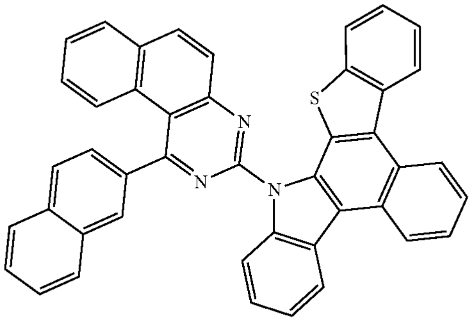
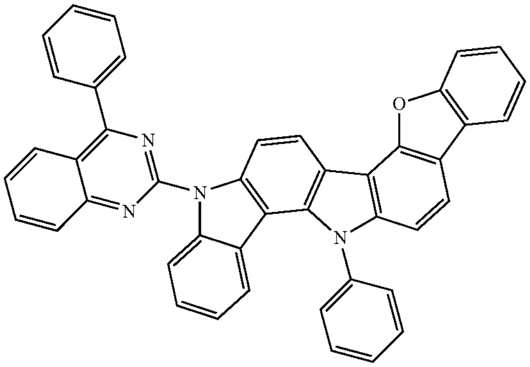
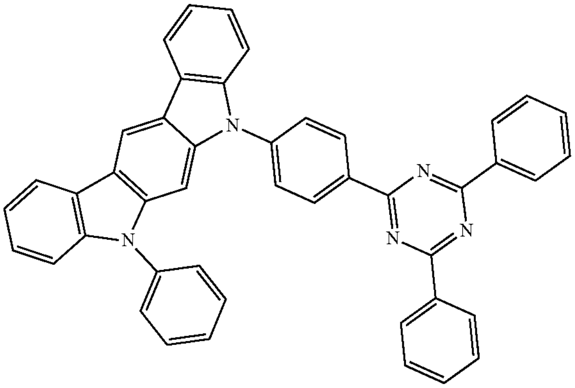

-continued

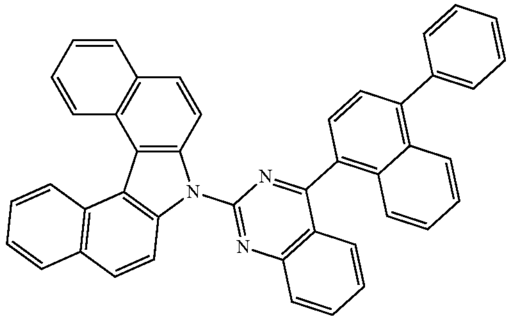

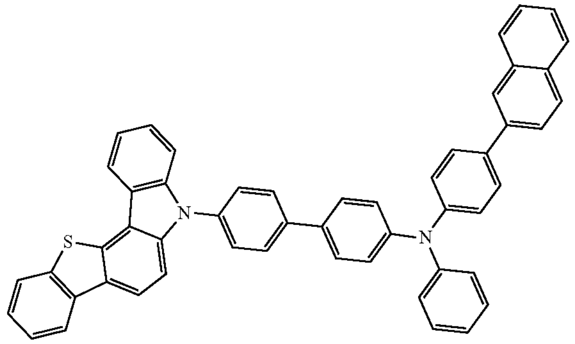

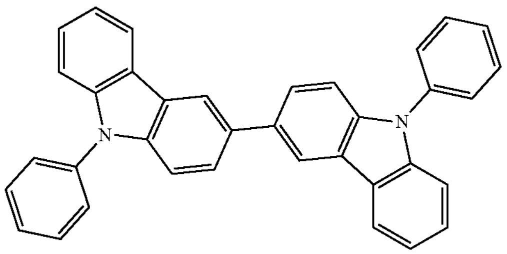

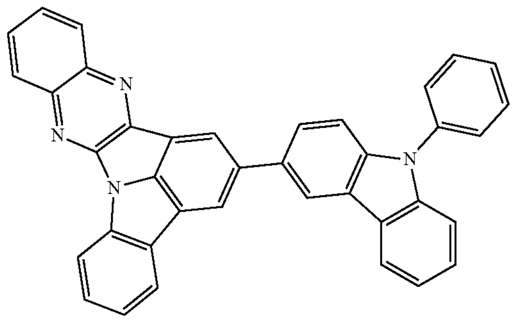

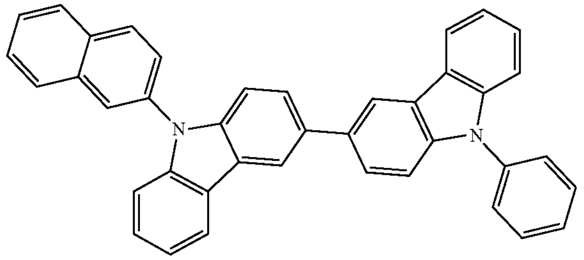

-continued

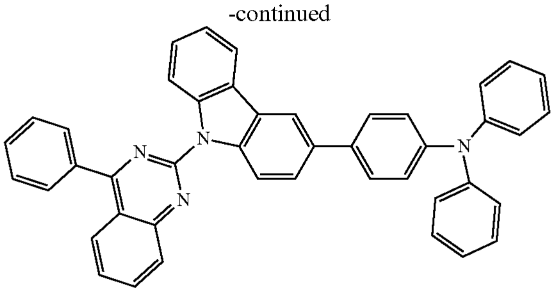

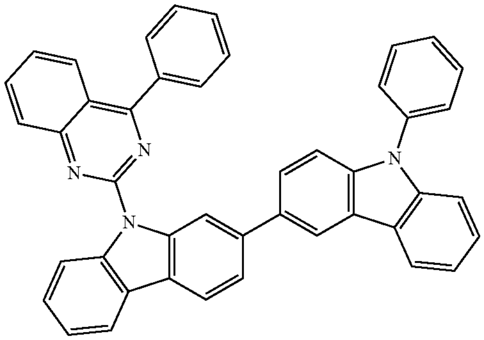

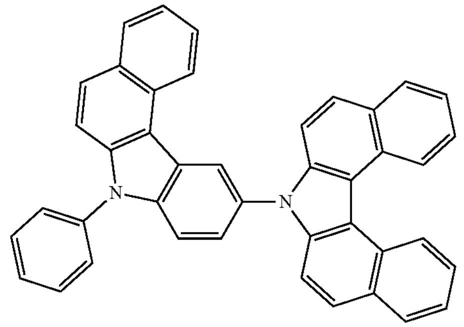

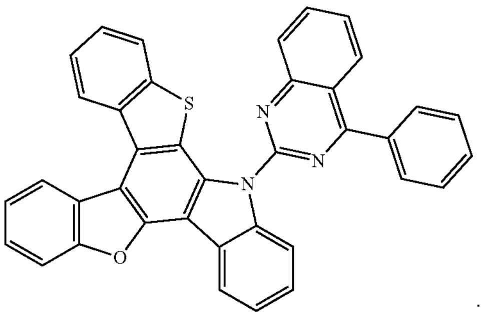 [SMILES: c1ccc(-c2nc(-n3c4ccccc4c4c5oc6ccccc6c5c5c6ccccc6sc5c43)nc3ccccc23)cc1]

2. Thermally Activated Delayed Fluorescent Materials (TADF)

Traditional organic fluorescent materials can only emit light using 25% singlet exciton formed by electric excitation, and the device prepared has lower internal quantum efficiency (up to 25%). Although the intersystem crossing is enhanced due to the strong spin-orbit coupling of the heavy atom center, phosphorescent materials can emit light by using the singlet exciton and triplet exciton formed by the electric excitation effectively, to achieve 100% internal quantum efficiency of the device. However, the use of the phosphorescent materials in OLEDs is limited by problems such as high cost, poor material stability and serious roll-off of the device efficiency. Thermally activated delayed fluorescent materials are the third generation of organic light-emitting materials developed after the organic fluorescent materials and organic phosphorescent materials. This type of materials generally have a small singlet-triplet energy level difference (ΔEst), and the triplet exciton can emit light through being converted to singlet exciton by anti-intersystem crossing, which can make full use of the singlet exciton and triplet exciton formed under electric excitation. The device can achieve 100% internal quantum efficiency. Meanwhile, the materials are controllable in structure, stable in property, have low cost and no need for precious metals, and have a promising application prospect in the OLED field.

TADF materials need to have a smaller singlet-triplet energy level difference, typically ΔEst<0.3 eV, further ΔEst<0.25 eV, still further ΔEst<0.20 eV, particularly ΔEst<0.1 eV. In one embodiment, TADF materials have a relatively smaller ΔEst, and in another embodiment, TADF materials have a better fluorescence quantum efficiency. Some TADF materials can be found in the following patent documents: CN103483332(A), TW201309696(A), TW201309778(A), TW201343874(A), TW201350558(A), US20120217869(A1), WO2013133359(A1), WO2013154064(A1), Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607, the contents of the above-listed patents or article documents are hereby incorporated by reference in their entirety.

Some suitable examples of the TADF light-emitting materials are listed below:

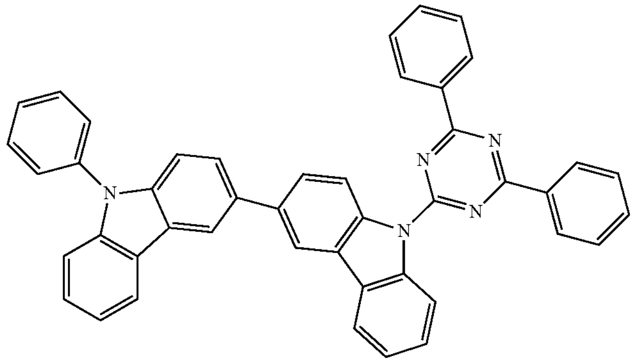

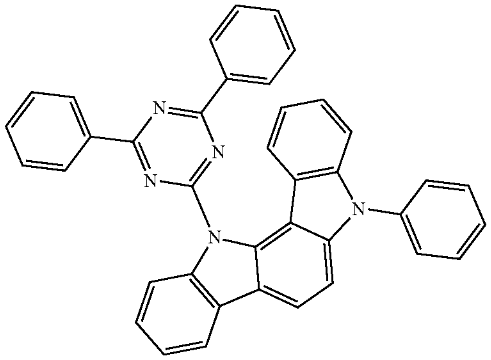

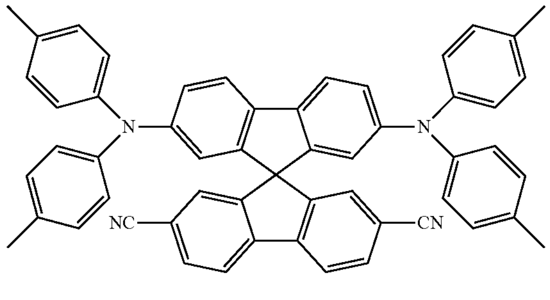

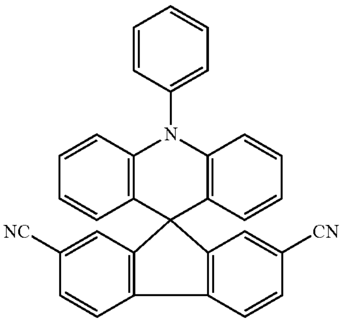

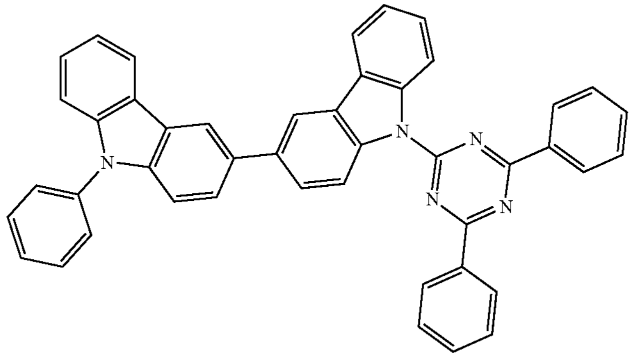

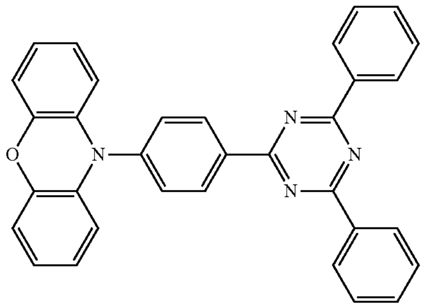

-continued
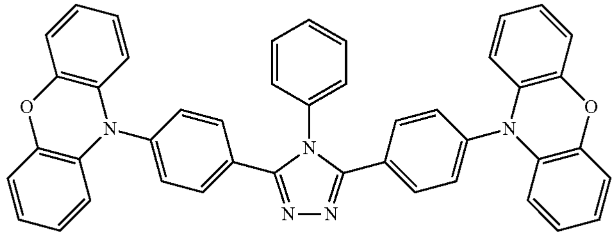
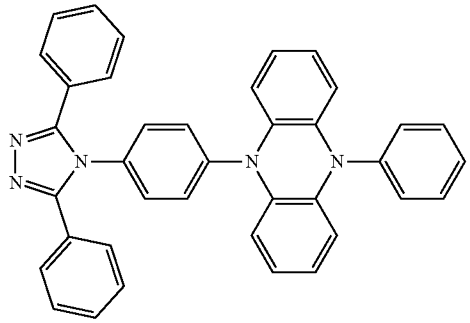
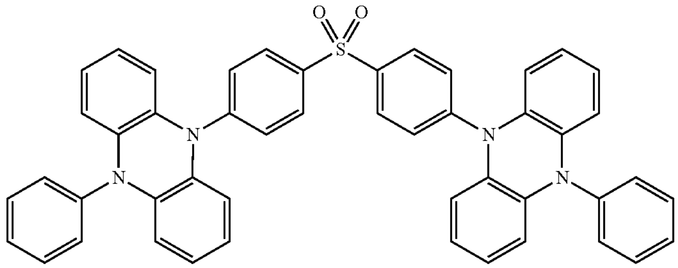
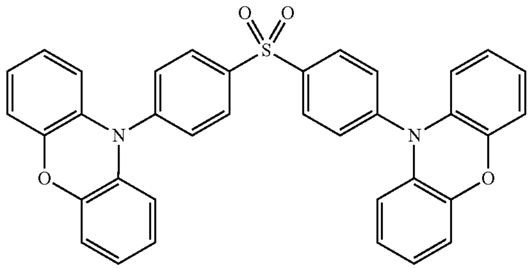
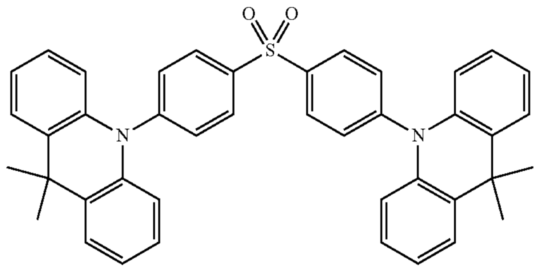
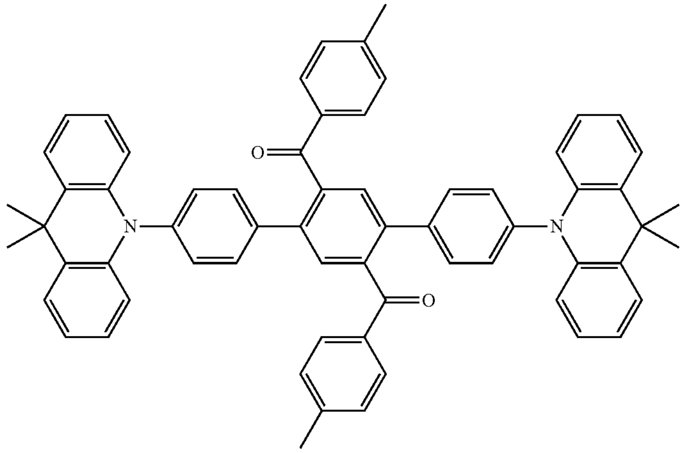
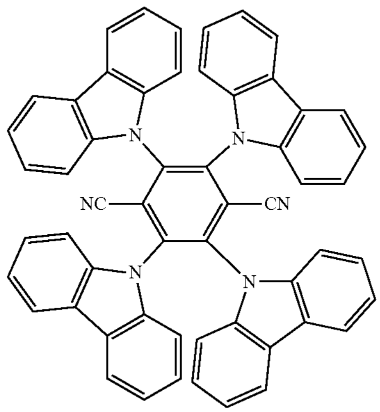

-continued
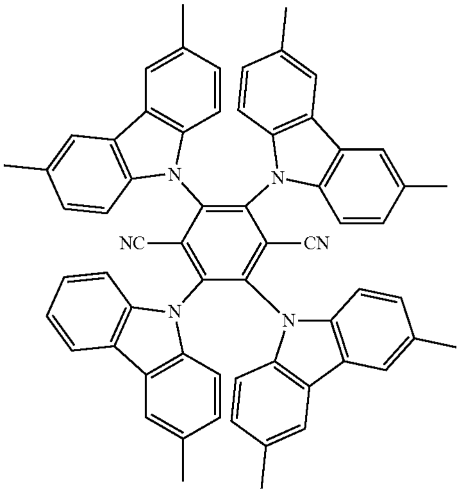
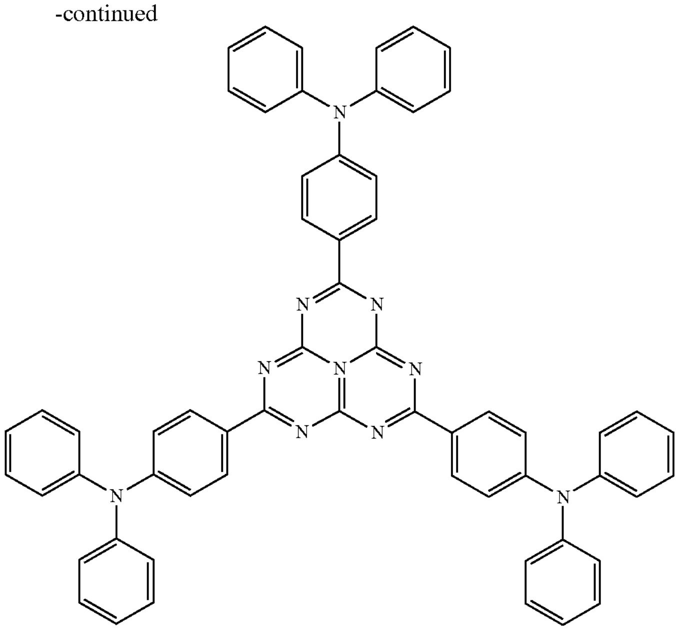
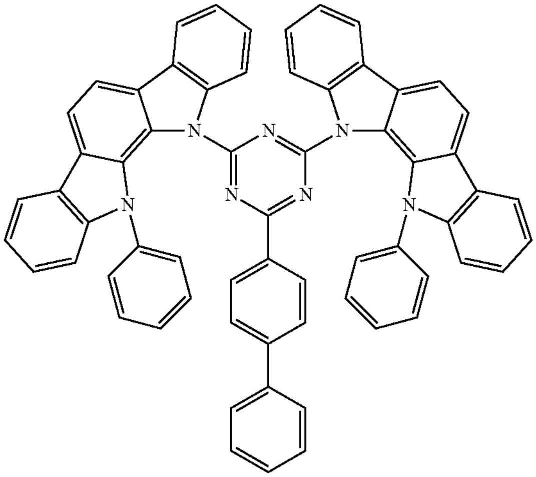
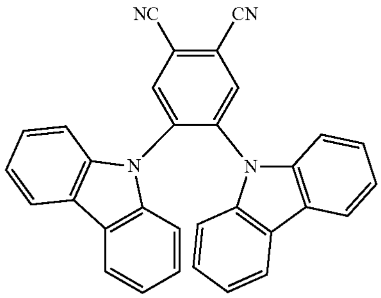
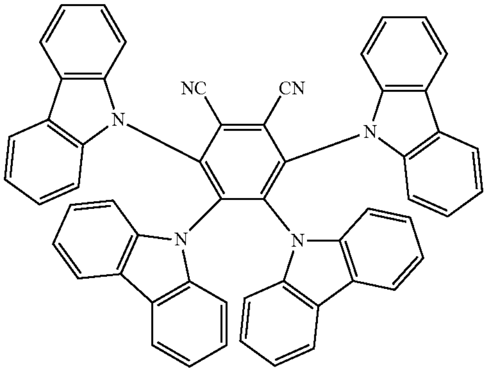
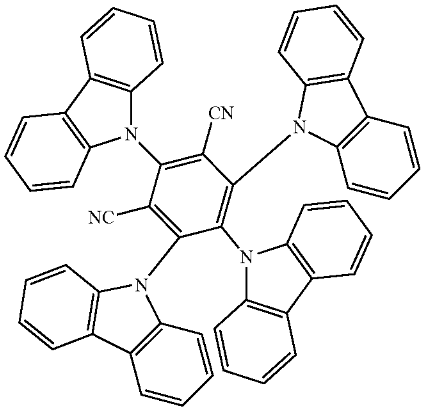

-continued
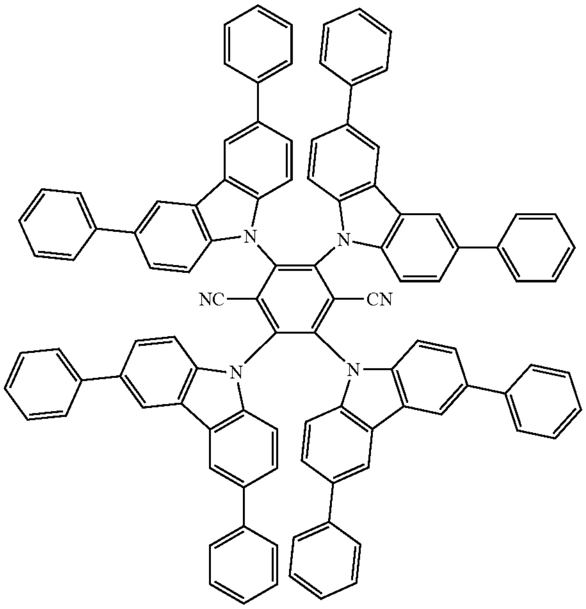
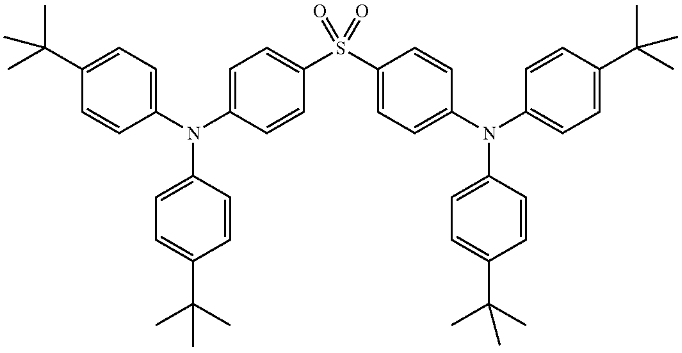
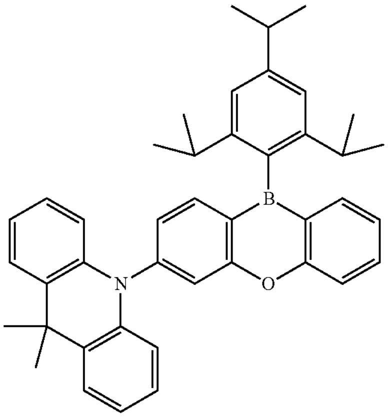
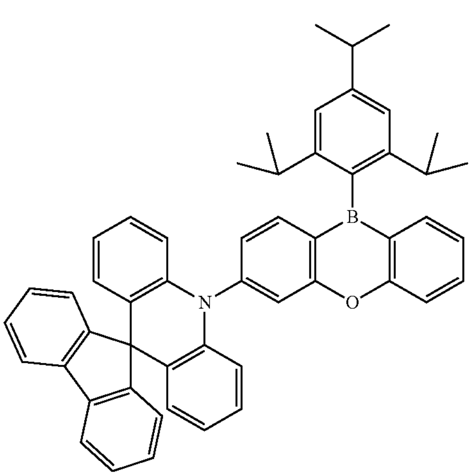
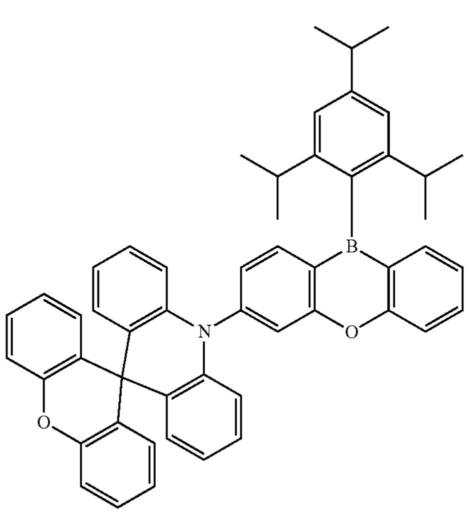

-continued
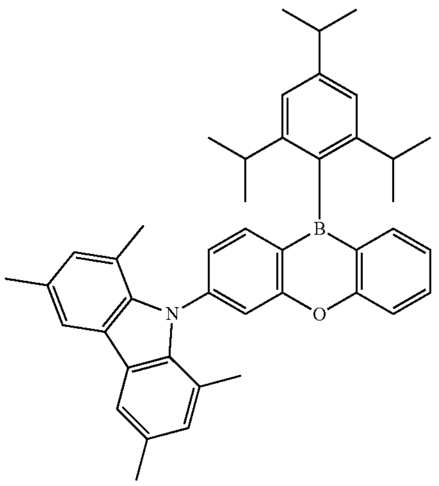
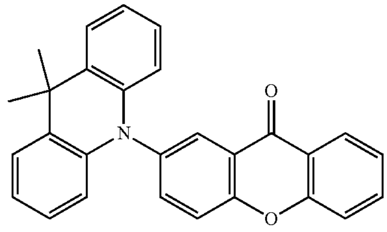
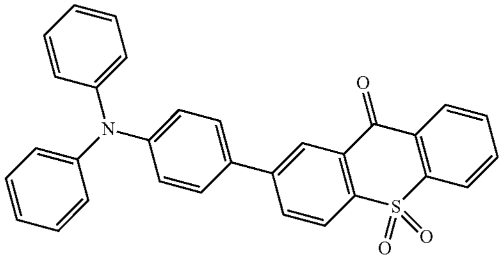
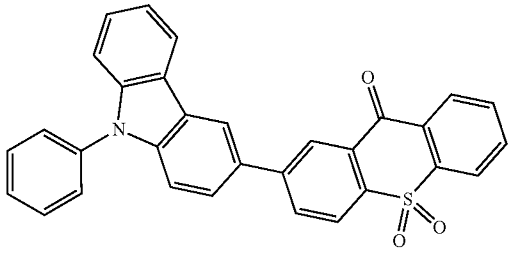
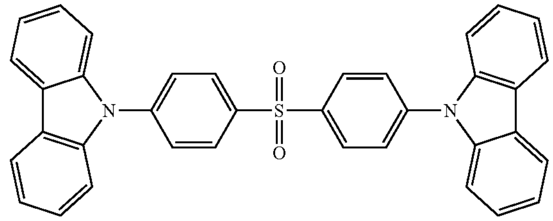
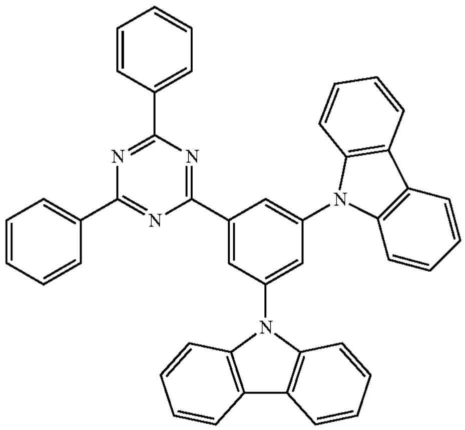
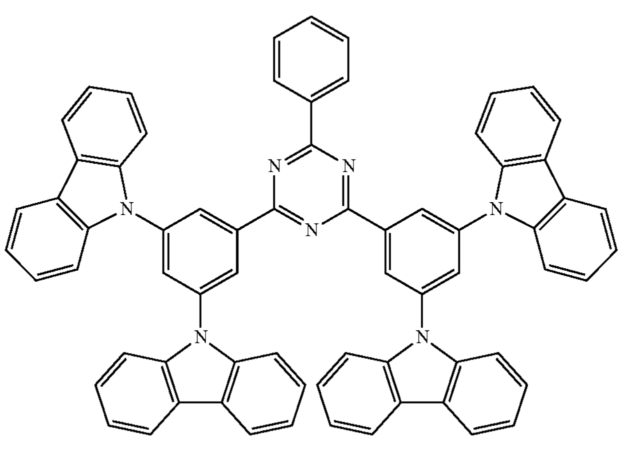
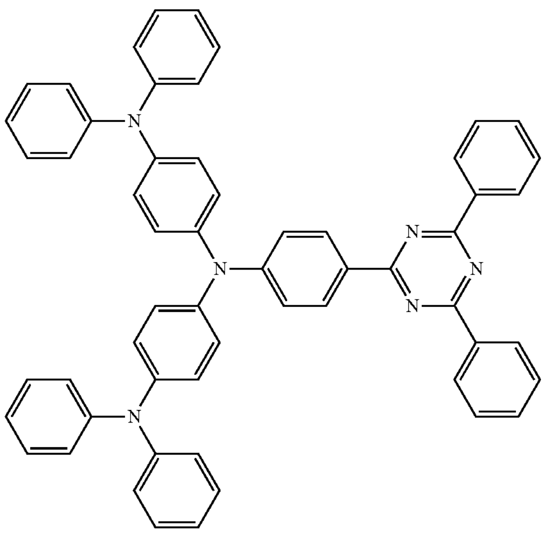

-continued
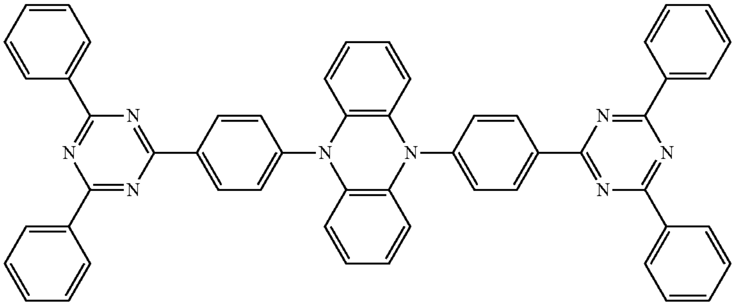
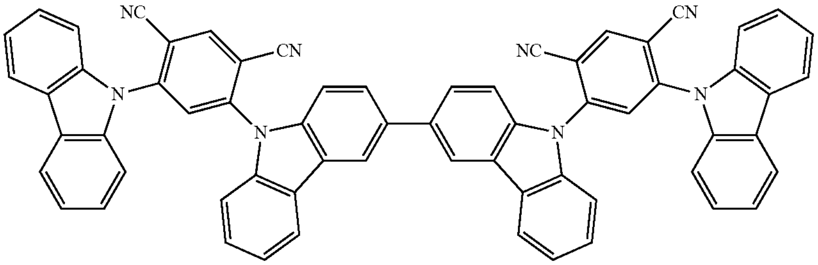
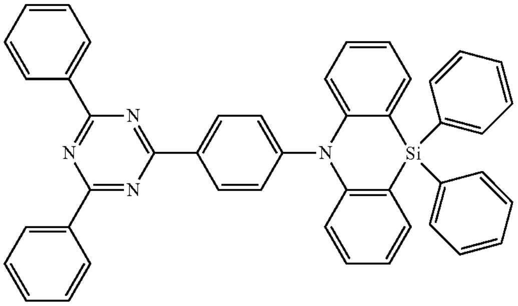
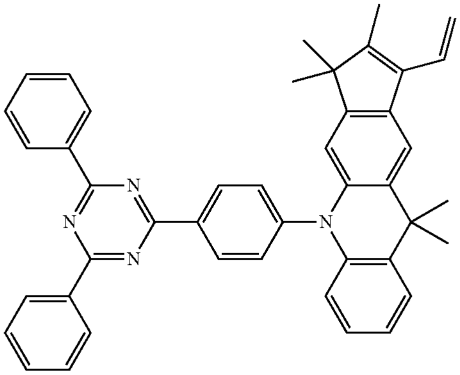
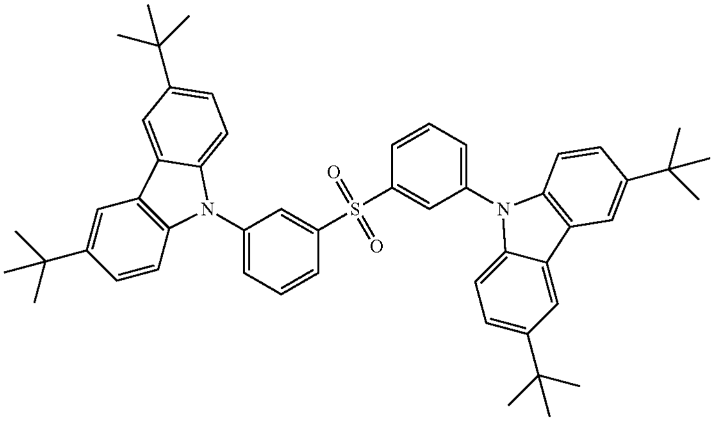
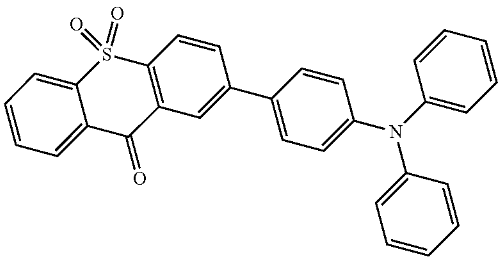
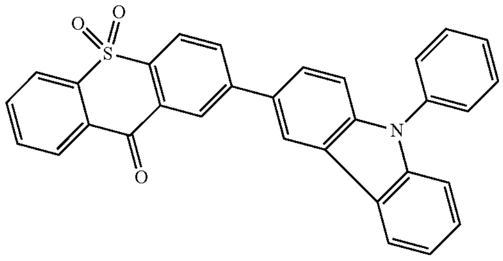

-continued
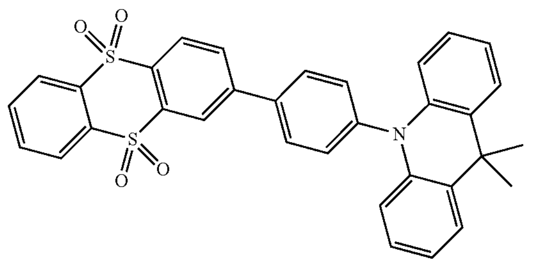
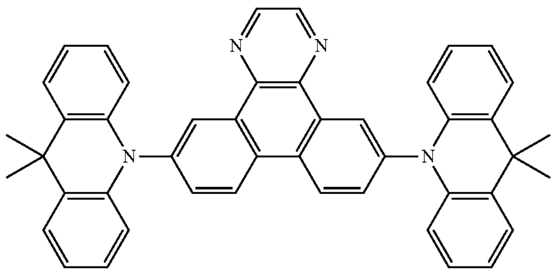
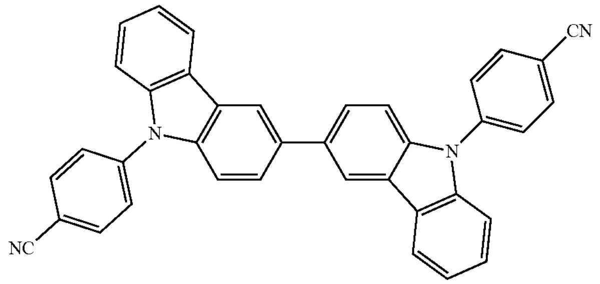
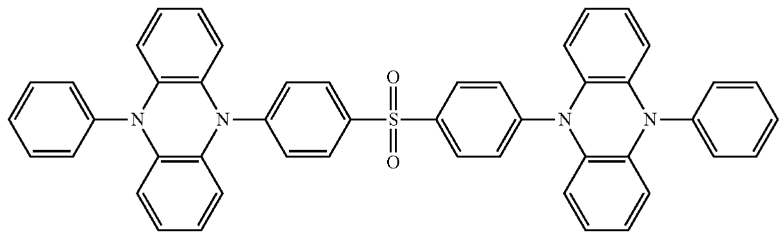
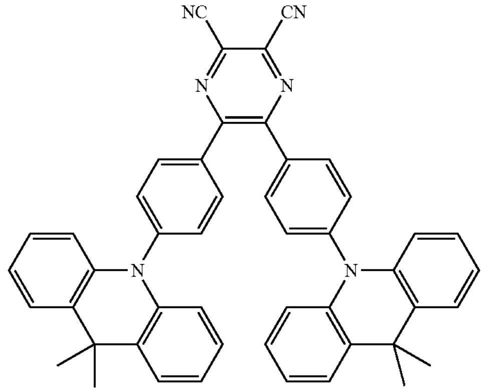
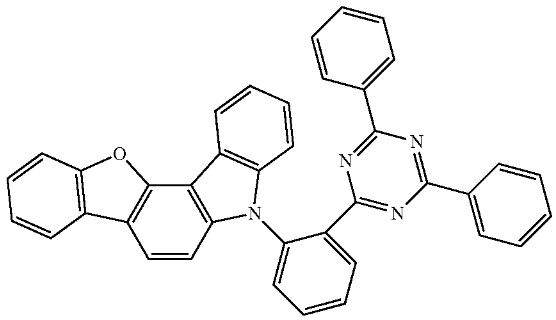

-continued
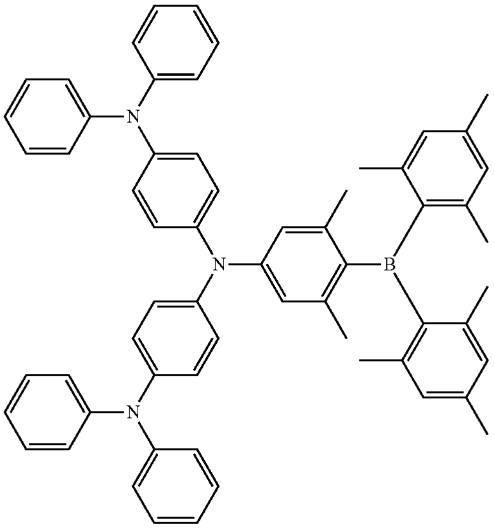
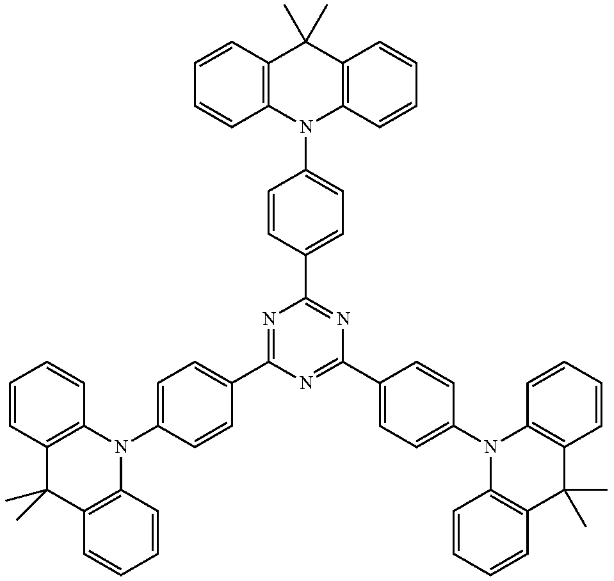
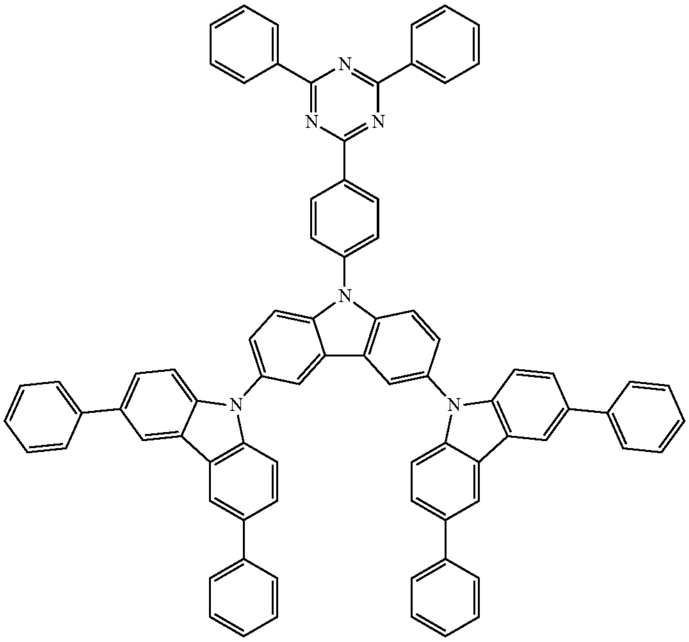
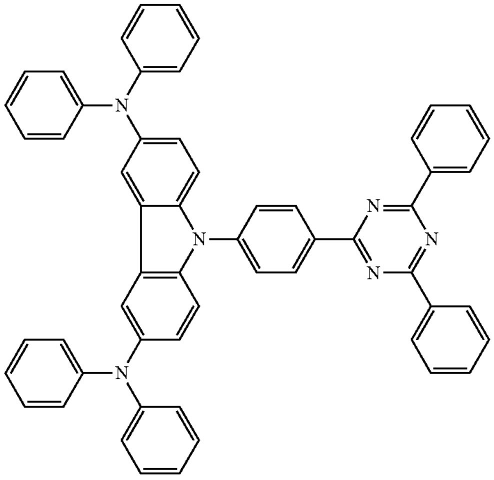
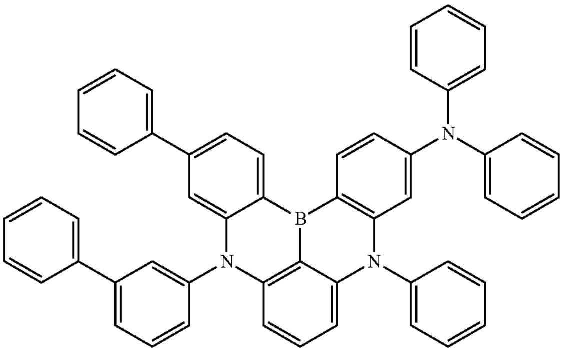
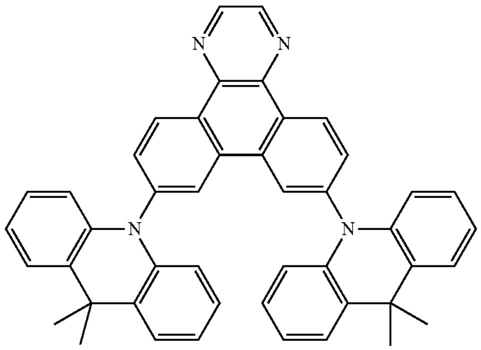

-continued

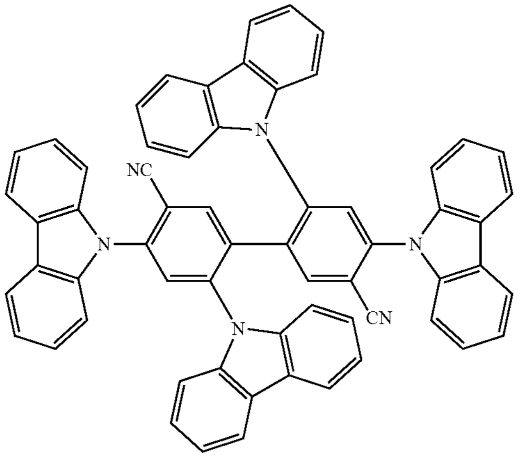

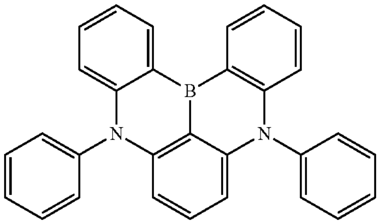

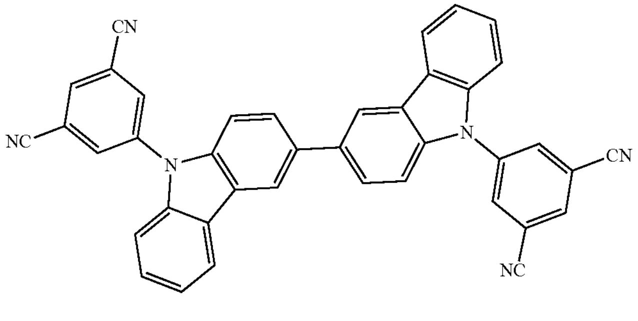

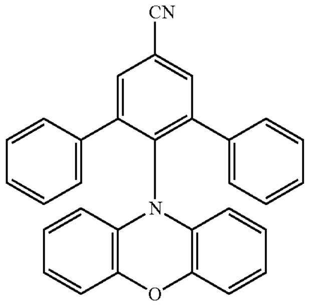

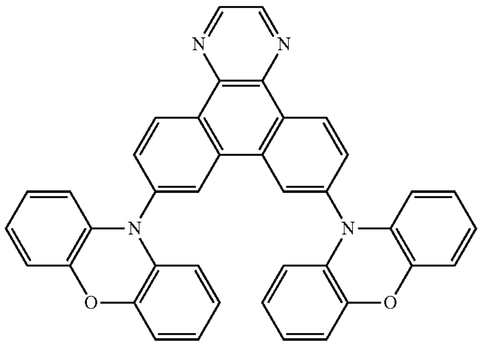

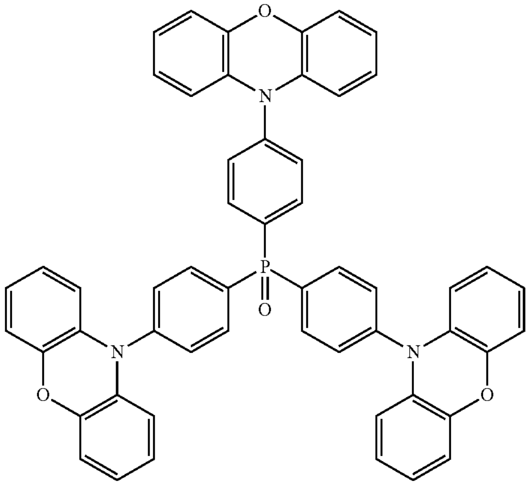

.

3. Triplet Emitters

Triplet emitters are also called phosphorescent emitters. In one embodiment, the triplet emitters are metal complexes having the general formula $M'(L)_{n'}$, wherein M' is a metal atom, and L may be the same or different at each occurrence and is an organic ligand which is bonded or coordinated to the metal atom M through one or more positions, and n' is an integer greater than 1, particularly 1, 2, 3, 4, 5 or 6. Optionally, these metal complexes are connected to a polymer through one or more positions, particularly through organic ligands.

In one embodiment, the metal atom M' is selected from transitional metal elements, lanthanide elements and actinide elements. In another embodiment, the metal atom M' is selected from the group consisting of Ir, Pt, Pd, Au, Rh, Ru, Os, Sm, Eu, Gd, Tb, Dy, Re, Cu and Ag. In a particular embodiment, the metal atom M' is selected from the group consisting of Os, Ir, Ru, Rh, Re, Pd, Au and Pt.

In one embodiment, the triplet emitters comprise chelating ligands, i.e. ligands, which are coordinated with the metal via at least two binding sites. In another embodiment, the triplet emitters comprise two or three same or different bidentate or multidentate ligands. The chelating ligands are beneficial to improve the stability of the metal complex.

Examples of the organic ligands may be selected from the group consisting of phenylpyridine derivatives, 7,8-benzoquinoline derivatives, 2 (2-thienyl) pyridine derivatives, 2 (1-naphthyl) pyridine derivatives, and 2-phenylquinoline derivatives. All of these organic ligands may be substituted, for example, by fluoromethyl or trifluoromethyl. Auxiliary ligands may be selected from acetylacetone or picric acid.

In one embodiment, the metal complexes that can be used as the triplet emitters have the following form:

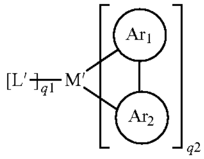

wherein M' is a metal selected from transition metal elements, lanthanide elements, and actinide elements, particularly from Ir, Pt and Au;

$Ar_1$ may be the same or different at each occurrence and is a cyclic group, wherein $Ar_1$ contains at least one donor atom, i.e. an atom with a lone pair of electrons, such as nitrogen or phosphorus, through which the cyclic group is coordinated with the metal; $Ar_2$ may be the same or different at each occurrence and is a cyclic group, wherein $Ar_2$ contains at least one carbon atom, through which the cyclic group is coordinated with the metal; $Ar_1$ and $Ar_2$ are covalently bonded together and may each carry one or more substituents which may also be bonded together by substituents again; $L^1$ may be the same or different at each occurrence and is a bidentate chelating auxiliary ligand, particularly a monoanionic bidentate chelating ligand: q1 may be 0, 1, 2 or 3, further 2 or 3; q2 may be 0, 1, 2 or 3, further 1 or 0.

Some examples of triplet emitter materials and applications thereof can be found in the following patent documents and references: WO 200070655, WO 200141512, WO 200202714, WO 200215645, EP 1191613, EP 1191612, EP 1191614, WO 2005033244, WO 2005019373, US 2005/0258742, WO 2009146770, WO 2010015307, WO 2010031485, WO 2010054731, WO 2010054728, WO 2010086089, WO 2010099852, WO 2010102709, US 20070087219 A1, US 20090061681 A1, US 20010053462 A1, Baldo, Thompson et al. Nature 403, (2000), 750-753, US 20090061681 A1, US 20090061681 A1, Adachi et al. Appl. Phys. Lett. 78 (2001), 1622-1624, J. Kido et al. Appl. Phys. Lett. 65 (1994), 2124, Kido et al. Chem. Lett. 657, 1990, US 2007/0252517 A1, Johnson et al., JACS 105, 1983, 1795, Wrighton, JACS 96, 1974, 998, Ma et al., Synth. Metals 94, 1998, 245, U.S. Pat. Nos. 6,824,895, 7,029,766, 6,835,469, 6,830,828, US 20010053462 A1, WO 2007095118 A1, US 2012004407A1, WO 2012007088A1, WO2012007087A1, WO 2012007086A1, US 2008027220A1, WO 2011157339A1, CN 102282150A, WO 2009118087A1, WO 2013107487A1, WO 2013094620A1, WO 2013174471A1, WO 2014031977A1, WO 2014112450A1, WO 2014007565A1, WO 2014038456A1, WO 2014024131A1, WO 2014008982A1, WO2014023377A1. The entire contents of the above listed patent documents and literatures are hereby incorporated herein by reference.

Some suitable examples of triplet emitters are listed below:

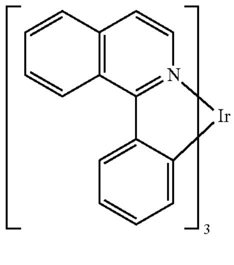

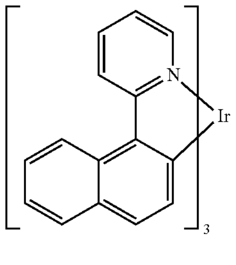

-continued

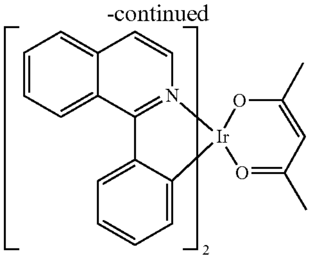

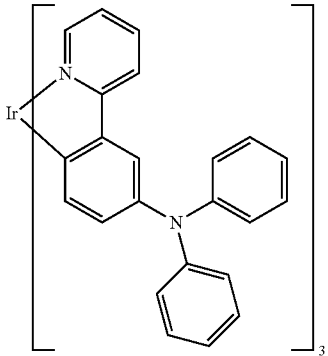

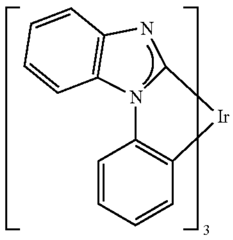

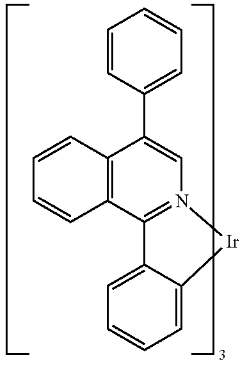

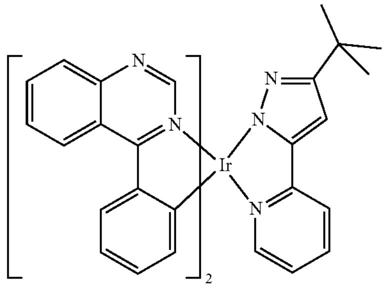

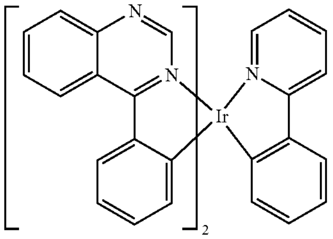

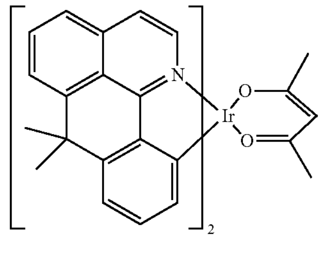

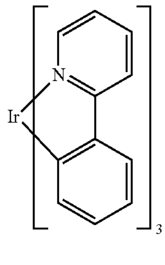

-continued
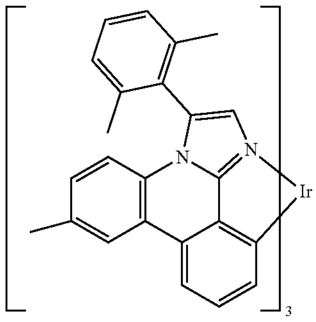
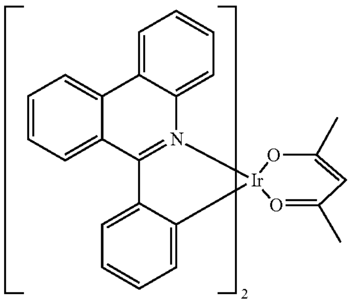
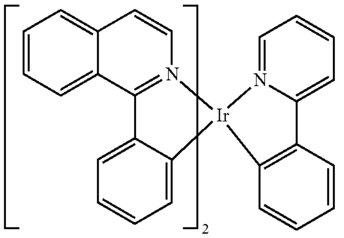
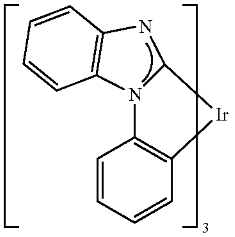
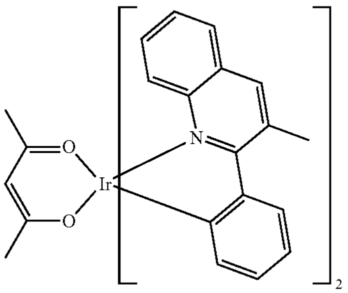
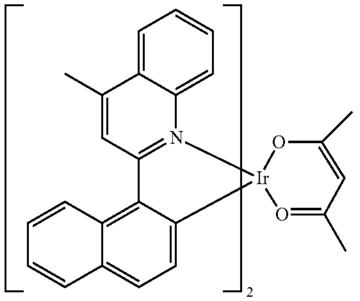
-continued
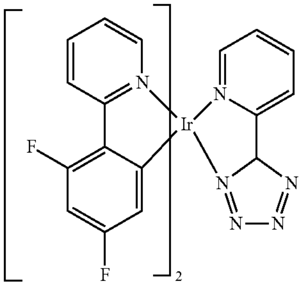
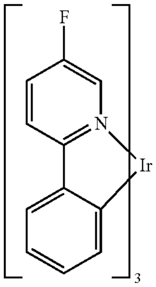
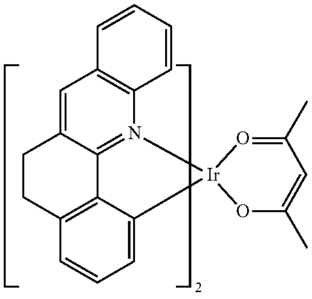
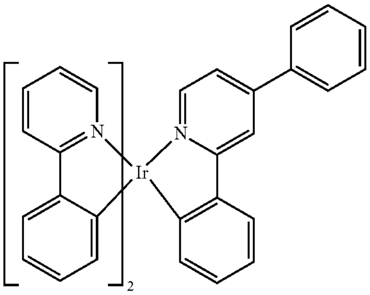
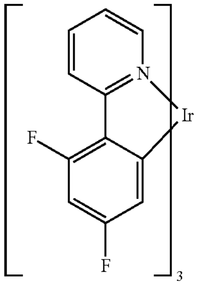
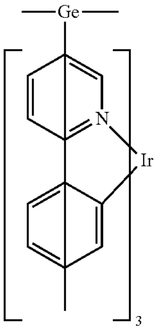
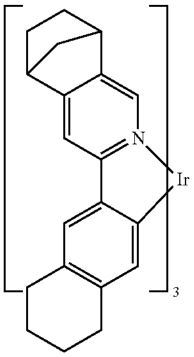
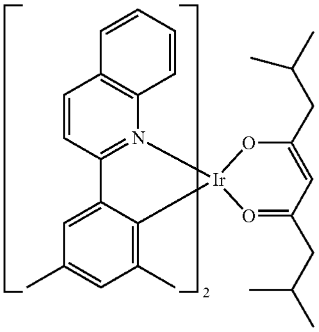

-continued
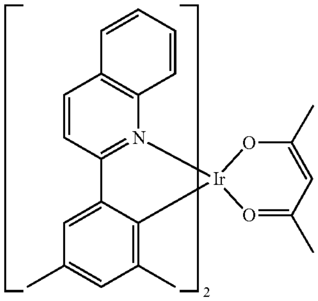
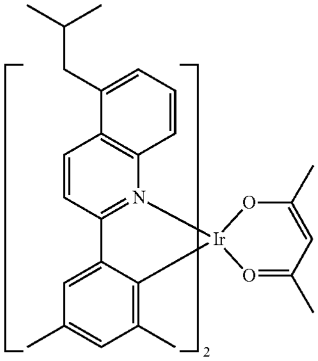
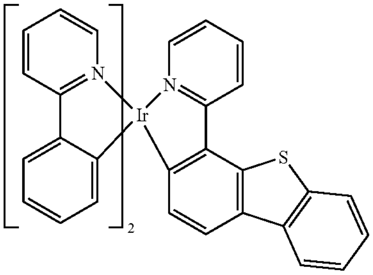
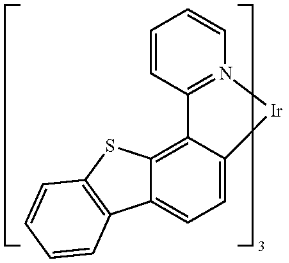
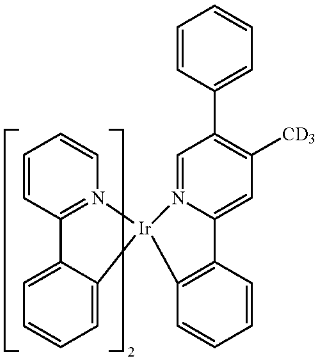
-continued
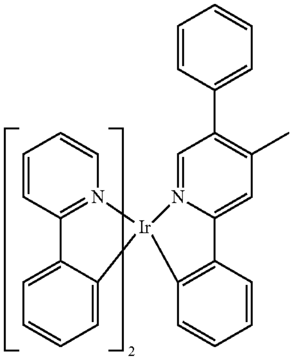
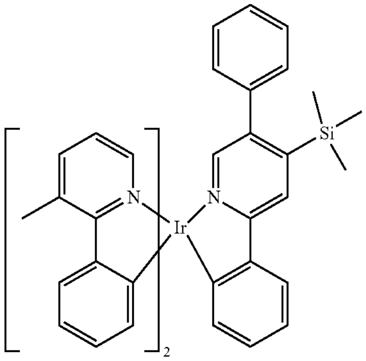
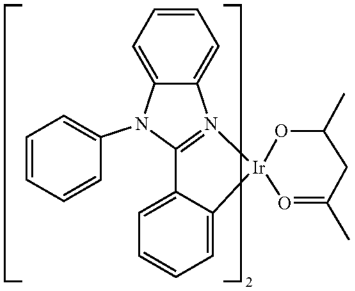
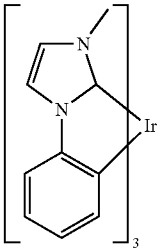
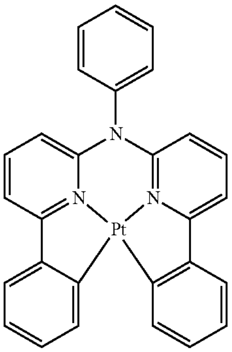
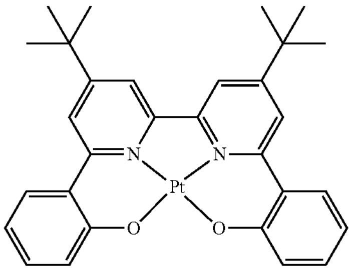

-continued

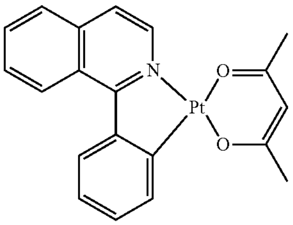

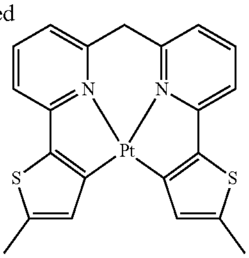

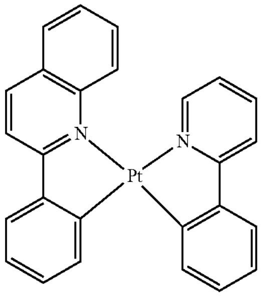

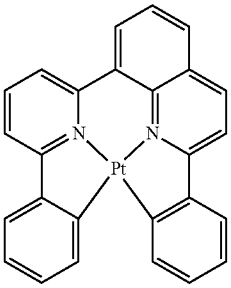

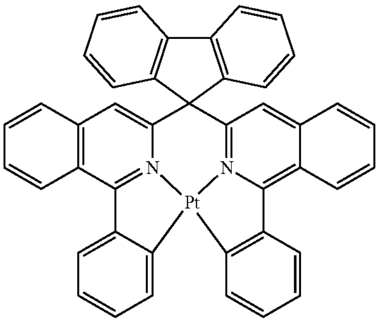

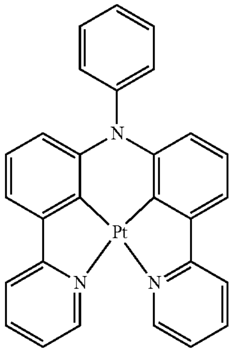

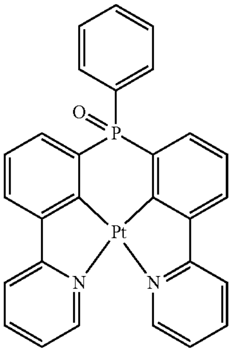

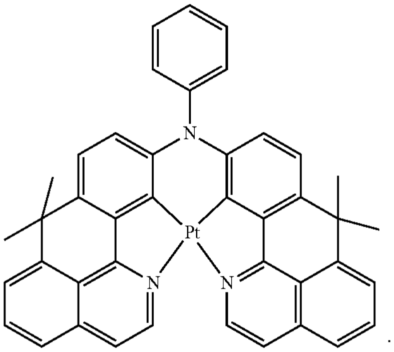

One object of the present disclosure is to provide a material solution for evaporated OLEDs.

In one embodiment, the transition metal complex according to the present disclosure is used for evaporated OLED devices. For this purpose, the metal organic complex according to the present disclosure has a molecular weight no greater than 1100 g/mol, no greater than 1000 g/mol in one embodiment, no greater than 950 g/mol in another embodiment, no greater than 900 g/mol in a particular embodiment.

Another object of the present disclosure is to provide a material solution for printing OLEDs.

In certain embodiments, the transition metal complex according to the present disclosure has a molecular weight no less than 800 g/mol, no less than 900 g/mol in one embodiment, no less than 1000 g/mol in another embodiment, no less than 1100 g/mol in a particular embodiment.

In other embodiments, the solubility of the transition metal complex according to the present disclosure in toluene at 25° C. is no less than 3 mg/ml, no less than 4 mg/ml in other embodiments, no less than 6 mg/ml in other embodiments, no less than 8 mg/ml in particular embodiments.

The present disclosure further relates to a formulation or a printing ink comprising the transition metal complex or the transition metal polymer or the mixture comprising the same as described above, and at least one organic solvent.

The present disclosure further provides a thin film prepared from a solution, wherein the thin film comprises the transition metal complex or the transition metal polymer according to the present disclosure.

The viscosity and surface tension of inks are important parameters for printing process. Suitable surface tension parameters of ink are suitable for a particular substrate and a particular printing method.

In one embodiment, the surface tension of the ink at working temperature or at 25° C. is in the range of approximately 19 dyne/cm to 50 dyne/cm. In another embodiment, the surface tension of the ink at working temperature or at 25° C. is in the range of 22 dyne/cm to 35 dyne/cm. In another embodiment, the surface tension of the ink at working temperature or at 25° C. is in the range of 25 dyne/cm to 33 dyne/cm.

In one embodiment, the viscosity of the ink at working temperature or at 25° C. is in the range of approximately 1 cps to 100 cps. In another embodiment, the viscosity of the ink at working temperature or at 25° C. is in the range of 1 cps to 50 cps. In another embodiment, the viscosity of the ink at working temperature or at 25° C. is in the range of 1.5 cps to 20 cps. In another embodiment, the viscosity of the ink at working temperature or at 25° C. is in the range of about 4.0 cps to 20 cps. The as-prepared formulation will be suitable for inkjet printing.

The viscosity can be adjusted by different methods, such as by selection of appropriate solvents and the concentration of functional materials in the ink. The ink according to the present disclosure comprising the metal organic complex or polymer described can facilitate the adjustment of the printing ink in an appropriate range according to the printing method used. In general, the weight ratio of the functional material contained in the formulation according to the present disclosure is in the range of 0.3 wt % to 30 wt %. In one embodiment, the weight ratio of the functional material contained in the formulation according to the present disclosure is in the range of 0.5 wt % to 20 wt %. In another embodiment, the weight ratio of the functional material contained in the formulation according to the present disclosure is in the range of 0.5 wt % to 15 wt %. In another embodiment, the weight ratio of the functional material contained in the formulation according to the present disclosure is in the range of 0.5 wt % to 10 wt %. In another embodiment, the weight ratio of the functional material contained in the formulation according to the present disclosure is in the range of 1 wt % to 5 wt %.

In some embodiments, according to the ink of the present disclosure, the at least one organic solvent is selected from solvents based on aromatics or heteroaromatics, particularly aliphatic chain/ring substituted aromatic solvents, or aromatic ketone solvents, or aromatic ether solvents.

Examples suitable for solvents of the present disclosure include, but are not limited to, the solvents based on aromatics or heteroaromatics: p-diisopropylbenzene, pentylbenzene, tetrahydronaphthalene, cyclohexyl benzene, chloronaphthalene, 1,4-dimethylnaphthalene, 3-isopropylbiphenyl, p-cymene, dipentylbenzene, tripentylbenzene, pentyltoluene, o-xylene, m-xylene, p-xylene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diisopropylbenzene, 1-methoxynaphthalene, cyclohexylbenzene, dimethylnaphthalene, 3-isopropylbiphenyl, p-cymene, 1-methylnaphthalene, 1,2,4-trichlorobenzene, 1,3-dipropoxybenzene, 4,4-difluorodiphenylmethane, 1,2-dimethoxy-4-(1-propenyl) benzene, diphenylmethane, 2-phenylpyridine, 3-phenylpyridine, N-methyldiphenylamine, 4-isopropylbiphenyl, $\alpha,\alpha$-dichlorodiphenylmethane, 4-(3-phenylpropyl) pyridine, benzylbenzoate, 1,1-di(3,4-dimethylphenyl)ethane, 2-isopropylnaphthalene, dibenzylether, and the like; solvents based on ketones: 1-tetralone, 2-tetralone, 2-(phenylepoxy)tetralone, 6-(methoxyl)tetralone, acetophenone, phenylacetone, benzophenone, and derivatives thereof, such as 4-methylacetophenone, 3-methylacetophenone, 2-methylacetophenone, 4-methylphenylacetone, 3-methylphenylacetone, 2-methylphenylacetone, isophorone, 2,6,8-trimethyl-4-nonanone, fenchone, 2-nonanone, 3-nonanone, 5-nonanone, 2-decanone, 2,5-hexanedione, phorone, di-n-amyl ketone; aromatic ether solvents: 3-phenoxytoluene, butoxybenzene, benzylbutylbenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenetole, 1,2,4-trimethoxybenzene, 4-(1-propenyl)-1,2-dimethoxybenzene, 1,3-dimethoxybenzene, glycidyl phenyl ether, dibenzyl ether, 4-tert-butyanisole, trans-p-propenylanisole, 1,2-dimethoxybenzene, 1-methoxynaphthalene, diphenyl ether, 2-phenoxymethyl ether, 2-phenoxytetrahydrofuran, ethyl-2-naphthyl ether, amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether; and ester solvents: alkyl octoate, alkyl sebacate, alkyl stearate, alkyl benzoate, alkyl phenylacetate, alkyl cinnamate, alkyl oxalate, alkyl maleate, alkyl lactone, alkyl oleate, and the like.

Further, according to the ink of the present disclosure, the at least one solvent may be selected from the group consisting of: aliphatic ketones, such as 2-nonanone, 3-nonanone, 5-nonanone, 2-decanone, 2,5-hexanedione, 2,6,8-trimethyl-4-nonanone, phorone, di-n-amyl ketone, and the like; and aliphatic ethers, such as amyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, and the like.

In other embodiments, the printing ink further comprises another organic solvent. Examples of the another organic solvent include, but are not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 3-phenoxy toluene, 1,1,1-trichloroethane, 1,1,2,2-tetrachloroethane, ethyl acetate, butyl acetate, dimethylformamide, dimethylacetamide, dimethyl sulfoxide, tetrahydronaphthalene, decalin, indene, and/or mixtures thereof.

In one embodiment, the transition metal formulation according to the present disclosure is a solution.

In another embodiment, the transition metal formulation according to the present disclosure is a suspension.

The present disclosure further relates to the use of the transition metal formulation as a coating or printing ink in the preparation of organic electronic devices, especially by the preparation method of printing or coating.

Wherein, the appropriate printing technology or coating technology includes, but is not limited to inkjet printing, nozzle printing, typography, screen printing, dip coating, spin coating, blade coating, roller printing, twist roller printing, lithography, flexography, rotary printing, spray coating, brush coating or pad printing, nozzle printing, slot die coating, and the like. The first option is inkjet printing, slot die coating, nozzle printing and gravure printing. The solution or suspension may additionally comprise one or more components such as surface-active compounds, lubricants, wetting agents, dispersants, hydrophobic agents, binders, etc., to adjust viscosity and film-forming property, and to enhance adhesion property, and the like. For more information on printing technology and related requirements for solutions, such as solvent and concentration, viscosity, etc., see Helmut Kipphan, et al., Handbook of Print Media: Technologies and Production Methods, ISBN 3-540-67326-1.

Based on the above organometallic complex, the present disclosure also provides a use of the transition metal complex or the transition metal polymer as described above in an organic electronic device. The organic electronic device may be selected from, but is not limited to, organic light-emitting diodes (OLEDs), organic photovoltaic cells (OPVs), organic light-emitting electrochemical cells (OLEECs), organic field effect transistors (OFETs), organic light-emitting field effect transistors, organic lasers, organic spintronic devices, organic sensors, and organic plasmon emitting diodes, and the like, specially OLEDs. In an embodiment of the present disclosure, the organometallic complex is particularly used in the light-emitting layer of the OLE D device.

The present disclosure further relates to an organic electronic device comprising at least the organometallic complex or polymer as described above. Generally, such organic electronic device comprises at least one cathode, one anode, and one functional layer located between the cathode and the anode, wherein the functional layer comprises at least the organometallic complex or polymer as described above. The organic electronic device may be selected from, but is not limited to, organic light-emitting diodes (OLEDs), organic photovoltaic cells (OPVs), organic light-emitting electrochemical cells (OLEECs), organic field effect transistors (OFETs), organic light-emitting field effect transistors, organic lasers, organic spintronic devices, organic sensors, and organic plasmon emitting diodes.

In a particular embodiment, the organic electronic device is an electroluminescent device, particularly an IDLED, comprising a substrate, an anode, at least one light-emitting layer, and a cathode.

The substrate may be opaque or transparent. A transparent substrate may be used to fabricate a transparent light-emitting device. For example, see Bulovic et al. Nature 1996, 380, p29 and Gu et al. Appl. Phys. Lett. 1996, 68, p2606. The substrate may be rigid or elastic. The substrate may be plastic, metal, a semiconductor wafer or glass. Particularly, the substrate has a smooth surface. The substrate without surface defect is a particular desirable choice. In one embodiment, the substrate is flexible and may be selected from a polymer thin film or plastic which has a glass transition temperature $T_g$ greater than 150° C., greater than 200° C. in another embodiment, greater than 250° C. in another embodiment, greater than 300° C. in a particular embodiment. Suitable examples of the flexible substrate are poly(ethylene terephthalate) (PET) and polyethylene(2,6-naphthalate) (PEN).

The anode may comprise a conductive metal or a metal oxide, or a conductive polymer. The anode can inject holes easily into the hole injection layer (HIL), or the hole transport layer (HTL), or the light-emitting layer. In one embodiment, the absolute value of the difference between the work function of the anode and the HOMO energy level or the valence band energy level of the emitter in the light-emitting layer or of the p-type semiconductor material as the HIL or HTL or the electron blocking layer (EBL) is less than 0.5 eV, further less than 0.3 eV, particularly less than 0.2 eV. Examples of anode materials include, but are not limited to, Al, Cu, Au, Ag, Mg, Fe, Co, Ni, Mn, Pd, Pt, ITO, aluminum doped zinc oxide (AZO), and the like. Other suitable anode materials are known and may be easily selected by one of ordinary skilled in the art. The anode material may be deposited by any suitable technology, such as a suitable physical vapor deposition method, which includes radio frequency magnetron sputtering, vacuum thermal evaporation, e-beam, and the like. In some embodiments, the anode is patterned and structured. Patterned ITO conductive substrates are commercially available and can be used to prepare the device according to the present disclosure.

The cathode may comprise a conductive metal or a metal oxide. The cathode can inject electrons easily into the EIL or ETL, or directly into the light-emitting layer. In one embodiment, the absolute value of the difference between the work function of the cathode and the LUMO energy level or the valence band energy level of the emitter in the light-emitting layer or of the n-type semiconductor material as the electron injection layer (EIL) or the electron transport layer (ETL) or the hole blocking layer (HBL) is less than 0.5 eV, further less than 0.3 eV, particularly less than 0.2 eV. In principle, all materials that can be used as the cathode of the OLED may be used as the cathode materials of the devices of the present disclosure. Examples of the cathode materials include, but are not limited to: Al, Au, Ag, Ca, Ba, Mg, LiF/Al, MgAg alloy, $BaF_2$/Al, Cu, Fe, Co, Ni, Mn, Pd, Pt, ITO, and the like. The cathode material may be deposited by any suitable technologies, such as a suitable physical vapor deposition method, which includes radio frequency magnetron sputtering, vacuum thermal evaporation, e-beam, and the like.

The OLED may further comprise other functional layers such as hole injection layer (HIL), hole transport layer (HTL), electron blocking layer (EBL), electron injection layer (EIL), electron transport layer (ETL), and hole blocking layer (HBL). The materials suitable for use in such functional layers have been described in detail above.

In one embodiment, in the light-emitting device according to the present disclosure, the light-emitting layer comprises the organometallic complex or the polymer according to the present disclosure and is prepared by a vacuum evaporation or solution processing method.

The light-emitting wavelength of the light-emitting device according to the present disclosure is between 300 nm and 1000 nm. In one embodiment, the light-emitting wavelength of the light-emitting device according to the present disclosure is between 350 nm and 900 mu. In a particular embodiment, the light-emitting wavelength of the light-emitting device according to the present disclosure is between 400 nm and 800 nm.

The present disclosure also relates to the application of the organic electronic device according to the present disclosure in various electronic equipments which include, but are not limited to, display equipments, lighting equipments, light sources, and sensors, and the like.

The present disclosure will be described below with reference to the preferred embodiments, but the present disclosure is not limited to the following embodiments. It should be understood that the appended claims summarized the scope of the present disclosure. Those skilled in the art should realize that certain changes to the embodiments of the present disclosure that are made under the guidance of the concept of the present disclosure will be covered by the spirit and scope of the claims of the present disclosure.

DETAILED EXAMPLES

1. Transition Metal Complexes and Energy Structures Thereof (Ir-1)

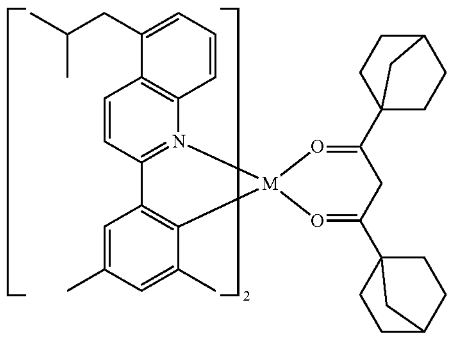

(Ir-47)

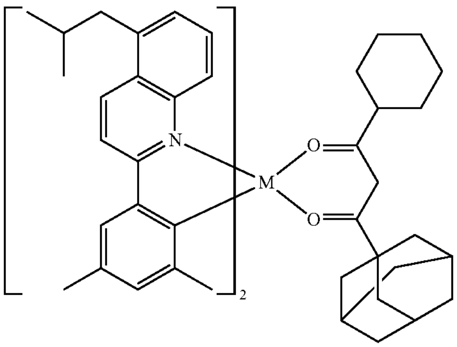

-continued (Ir-52)

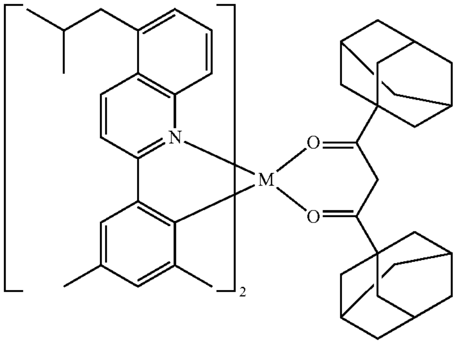

(c-Ir-1)

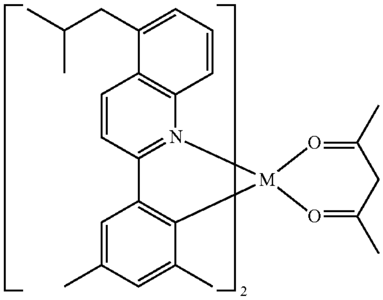

(c-Ir-2)

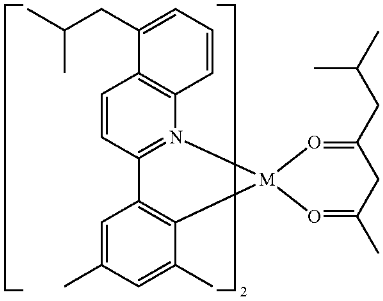

(c-Ir-3)

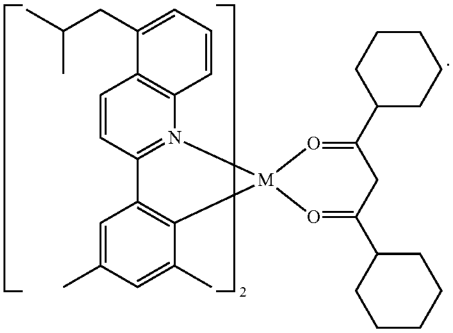

The energy levels of the metal organic complexes can be obtained by quantum calculations, for example, by using TD-DFT (Time Dependent-Density Functional Theory) through Gaussian03W (Gaussian Inc.), and the specific simulation methods can be found in WO2011141110. Firstly, the molecular geometry is optimized by semi-empirical method "Ground State/Hartree-Fock/Default Spin/LanL2MB" (Charge 0/Spin Singlet), and then the energy structure of organic molecules is calculated by TD-DFT (Time Dependent-Density Functional Theory) method "TD-SCF/DFT/Default Spin/B3PW91/gen geom=connectivity pseudo=lanl2" (Charge 0/Spin Singlet). The HOMO and LUMO energy levels are calculated according to the following calibration formulas, S1 and T1 are used directly.

$$HOMO(eV)=((HOMO(Gaussian)\times 27.212)-0.9899)/1.1206$$

$$LUMO(eV)=((LUMO(Gaussian)\times 27.212)-2.0041)/1.385$$

wherein, HOMO(G) and LUMO(G) in the unit of Hartree are the direct calculation results of Gaussian 03W. The results were shown in Table 1:

TABLE 1

| Materials | HOMO [eV] | LUMO [eV] | T1 [eV] | S1 [eV] |
|---|---|---|---|---|
| Ir-1 | -5.16 | -2.76 | 2.09 | 2.54 |
| Ir-47 | -5.17 | -2.77 | 2.09 | 2.55 |
| Ir-52 | -5.19 | -2.78 | 2.10 | 2.55 |
| c-Ir-1 | -4.95 | -2.58 | 2.06 | 2.41 |
| c-Ir-2 | -5.11 | -2.71 | 2.07 | 2.38 |
| c-Ir-3 | -5.13 | -2.73 | 2.08 | 2.51 |

2. Synthesis of Metal Organic Complexes

Synthesis of Example 1: Synthesis of Complex Ir-1

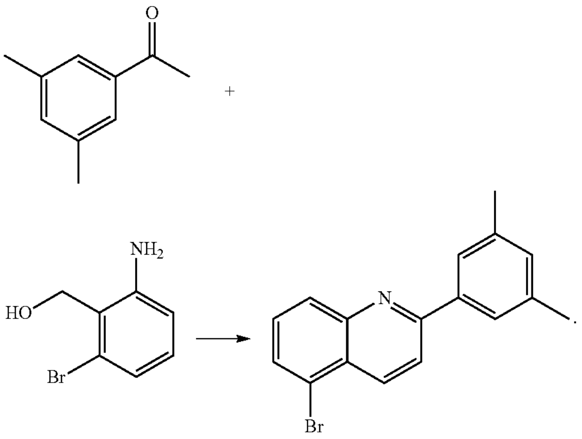

A

Synthesis of Intermediate A 3,5-dimethylacetophenone (1.72 g, 1.1 eq), 2-bromo-6-aminobenzyl alcohol (2 g, 1 eq), $RuCl_2(pph_3)_3$ (0.12 g, 0.01 eq), and potassium hydroxide (1.43 g, 2 eq) were placed into a dry 250 mL two-neck flask, which was then vacuumed and filled with nitrogen repeatedly for three times. Then anhydrous toluene (100 mL) was added, and the mixture was reacted under stirring at 120° C. for 24 hours. The reaction solution was spin-dried, and then extracted by the addition of DCM, concentrated, and then purified by column chromatography with EA/PE=1:2 to obtain a light white intermediate A (with a yield of 80%).

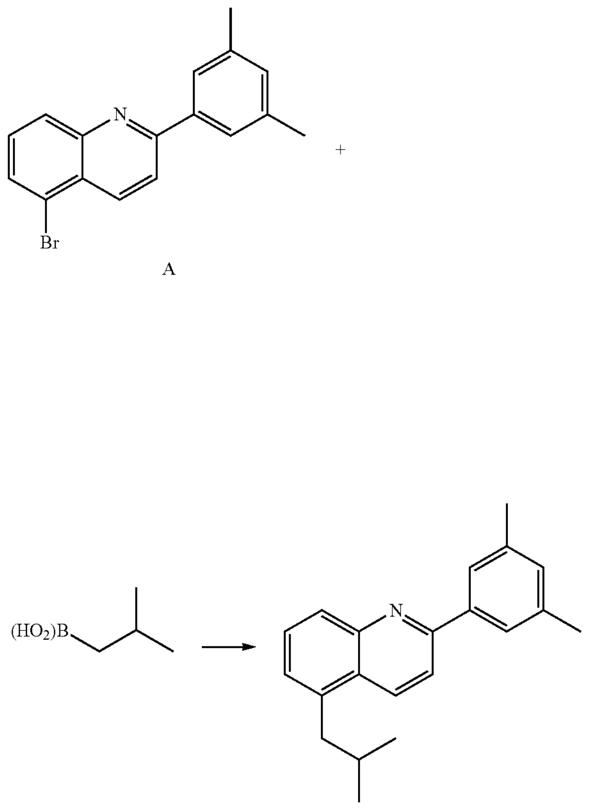

A

B

Synthesis of Intermediate B

Intermediate A (1.04 g, 1 eq), isobutaneboronic acid (0.49 g, 1.5 eq), $Pd_2(dba)_3$ (0.09 g, 0.03 eq), S-phos (0.12 g, 0.06 eq), and $K_3PO_4$ (2.73 g, 4 eq) were placed into a dry 250 mL two-neck flask, which was then vacuumed and filled with nitrogen repeatedly for three times. Then anhydrous toluene (60 mL) was added, and the mixture was reacted under stirring at 120° C. for 24 hours. The reaction solution was spin-dried, and then extracted by the addition of DCM, concentrated, and then purified by silica gel column chromatography with DCM/PE=1:4 to obtain a light white intermediate B (with a yield of 58%).

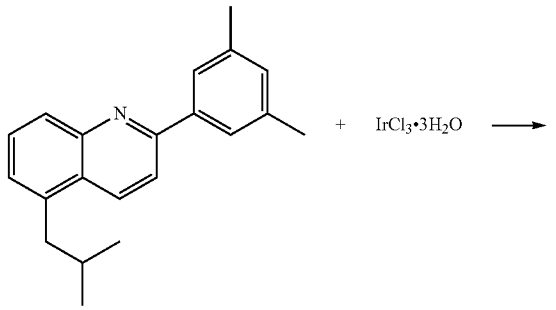

B

-continued

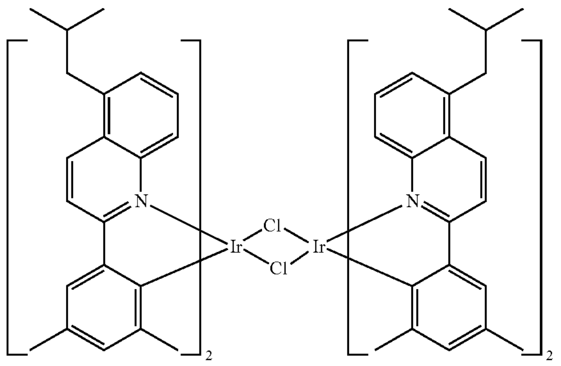

C

Synthesis of Intermediate C

Intermediate B (1.50 g, 2.2 eq) and iridium trichloride trihydrate (0.83 g, 1 eq) were placed into a dry 250 ml flask, which was then vacuumed and filled with nitrogen repeatedly for three times. Then a mixed solution (120 mL) of glycol ether and water in a ratio of 3:1 was added, and the mixture was reacted under stirring at 110° C. for 24 hours. After adding water (1000 mL), the solid was filtered to obtain the red-brown intermediate C (with a yield of 34%).

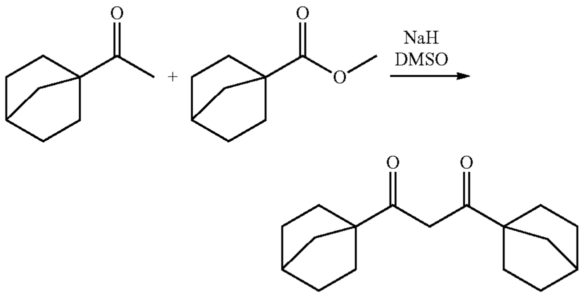

D

Synthesis of Intermediate D

A dry 250 ml flask was vacuumed and filled with nitrogen repeatedly for three times, and then sodium hydrogen (20 g, 5 eq), DMSO (150 mL), and 1-norbornanone (20 g, 1 eq) were added in order. The mixture was stirred at room temperature for 40 minutes, then norbornane-1-carboxylate (15.78 g, 0.7 eq) was slowly added, and the mixture was heated to 60° C. and reacted for 4 hours, then the reaction was completed. Then ice water (1000 mL) was slowly added to quench the remaining sodium hydrogen. The reaction solution was then extracted three times with the addition of PE (1000 mL), and concentrated to obtain a red-brown liquid, which was then distilled to obtain a transparent liquid intermediate D (with a yield of 25%).

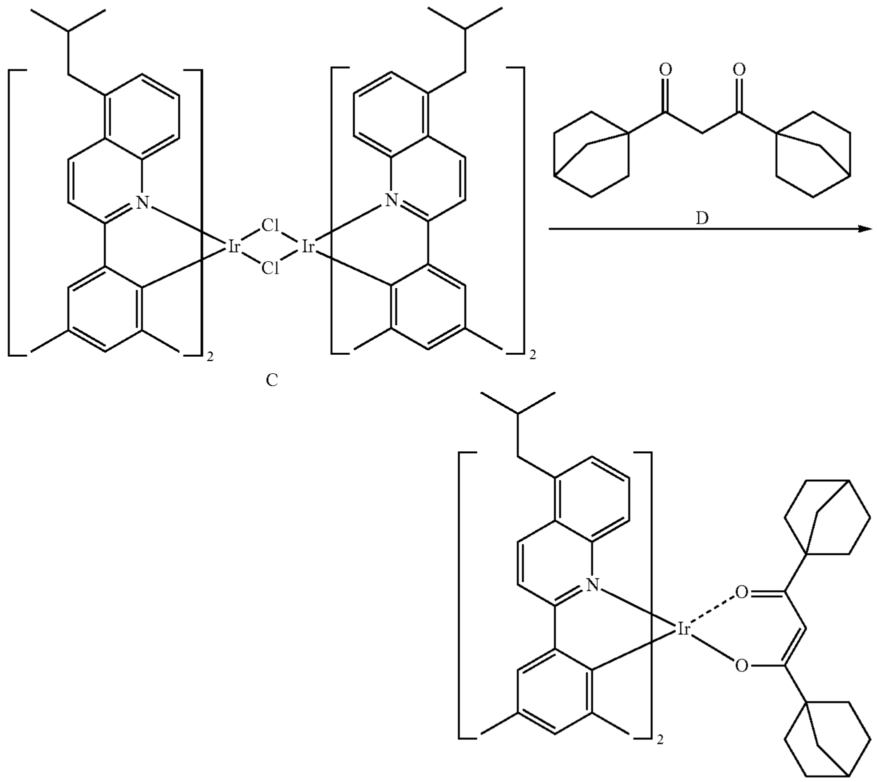

C

Ir-1

Synthesis of Complex Ir-1

Under an atmosphere filled with nitrogen, intermediate C (4.00 g, 1 eq), intermediate D (5.9 g, 10 eq) and potassium carbonate (6.86 g, 20 eq) were placed into a 100 mL three-neck flask, and then ethylene glycol ethyl ether (10 mL) was added. The mixture was stirred at 120° C. for 24 hours. Then water and dichloromethane were added for extraction, and the lower organic solution was collected, concentrated with distillation under reduced pressure, then purified by silica gel with a mixed solvent of petroleum ether and ethyl acetate in a ratio of 20:1. The most red component was collected, and the fraction was concentrated under reduced pressure, and recrystallized by adding appropriate amount of ethanol to obtain red compound Ir-1 (with a yield of 40%).

Synthesis of Example 2: Synthesis of Complex Ir-47

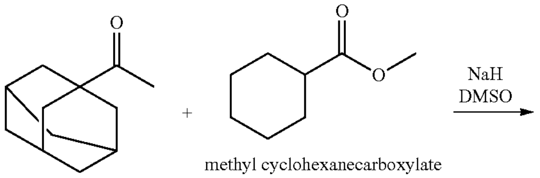

methyl cyclohexanecarboxylate

-continued

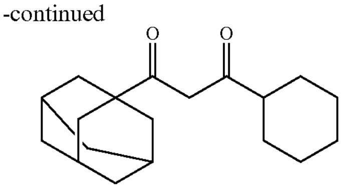
E

Synthesis of Intermediate E

A dry 250 ml flask was vacuumed and filled with nitrogen repeatedly for three times, and then sodium hydrogen (20 g, 5 eq), DMSO (150 mL), and methyl cyclohexanecarboxylate (20 g, 1 eq) were added in order. The mixture was stirred at room temperature for 40 minutes, then 1-adamantyl methyl ketone (22.3 g, 0.7 eq) was slowly added, and the mixture was heated to 60° C. and reacted for 4 hours, then the reaction was completed. Then ice water (1000 mL.) was slowly added to quench the remaining sodium hydrogen. The reaction solution was then extracted three times with the addition of PE (1000 mL), and concentrated to obtain a red-brown liquid, which was then distilled to obtain a transparent liquid intermediate E (with a yield of 23%)

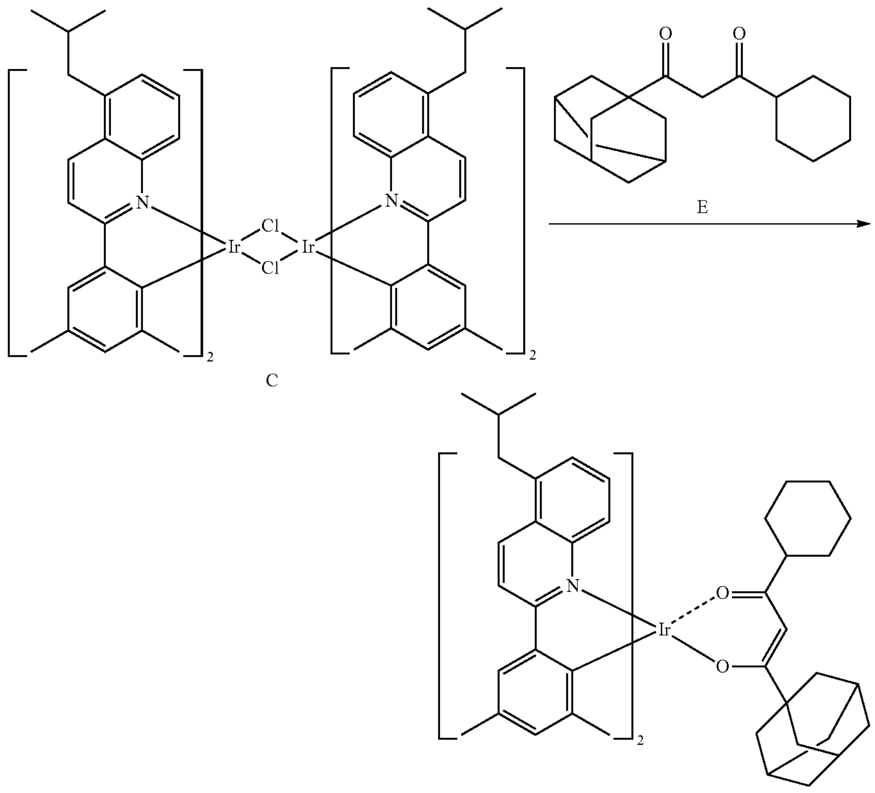
C
E
Ir-47

Synthesis of Complex Ir-47

Under an atmosphere filled with nitrogen, intermediate C (4.00 g, 1 eq), intermediate E (7.2 g, 10 eq) and potassium carbonate (6.86 g, 20 eq) were placed into a 100 mL three-neck flask, and then ethylene glycol ethyl ether (10 mL) was added. The mixture was stirred at 120° C. for 24 hours. Then water and dichloromethane were added for extraction, and the lower organic solution was collected, concentrated with distillation under reduced pressure, then purified by silica gel with a mixed solvent of petroleum ether and ethyl acetate in a ratio of 20:1. The most red component was collected, and the fraction was concentrated under reduced pressure, and recrystallized by adding appropriate amount of ethanol to obtain red compound Ir-47 (with a yield of 29%).

Synthesis of Example 3: Synthesis of Complex Ir-52

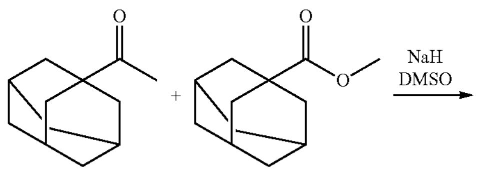

-continued

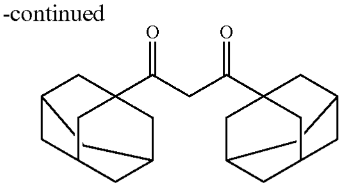
F

Synthesis of Intermediate F

A dry 250 ml flask was vacuumed and filled with nitrogen repeatedly for three times, and then sodium hydrogen (20 g, 5 eq), DMSO (150 mL), and 1-adamantyl formate (27.32 g, 1 eq) were added in order. The mixture was stirred at room temperature for 40 minutes, then 1-adamantyl methyl ketone (22.3 g, 0.7 eq) was slowly added, and the mixture was heated to 60° C. and reacted for 4 hours, then the reaction was completed. Then ice water (1000 mL) was slowly added to quench the remaining sodium hydrogen. The reaction solution was then extracted three times with the addition of PE (1000 mL), and concentrated to obtain a red-brown liquid, which was then distilled to obtain a transparent liquid intermediate F (with a yield of 23%)

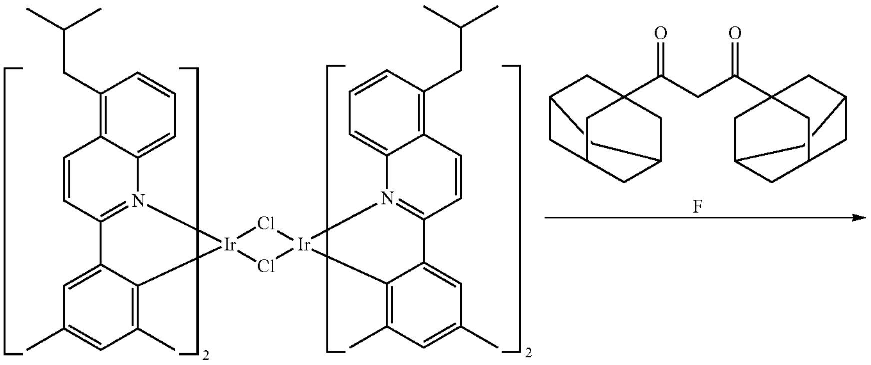

C

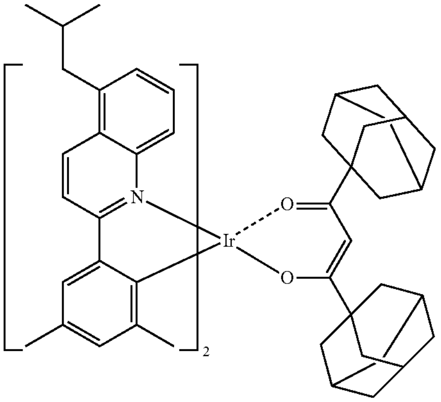

Ir-52

Synthesis of Complex Ir-52

Under an atmosphere filled with nitrogen, intermediate C (4.00 g, 1 eq), intermediate IF (10.37 g, 10 eq) and potassium carbonate (6.86 g, 20 eq) were placed into a 100 mL three-neck flask, and then ethylene glycol ethyl ether (10 mL) was added. The mixture was stirred at 120° C. for 24 hours. Then water and dichloromethane were added for extraction, and the lower organic solution was collected, concentrated with distillation under reduced pressure, then purified by silica gel with a mixed solvent of petroleum ether and ethyl acetate in a ratio of 20:1. The most red component was collected, and the fraction was concentrated under reduced pressure, and recrystallized by adding appropriate amount of ethanol to obtain red compound Ir-52 (with a yield of 55%).

Synthesis of Comparative Example 1: Synthesis of Complex c-Ir-1

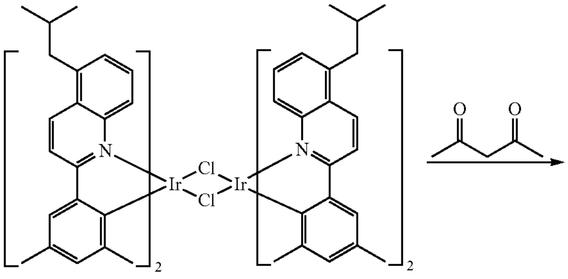

C

-continued

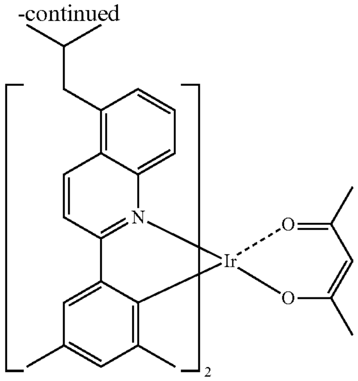

c-Ir-1

Synthesis of Complex c-Ir-1

Under an atmosphere filled with nitrogen, intermediate C (4.00 g, 1 eq), acetylacetone (2.5 g, 10 eq) and potassium carbonate (6.86 g, 20 eq) were placed into a 100 mL three-neck flask and then ethylene glycol ethyl ether (10 mL) was added into the flask. The reaction was carried out at 120° C. for 24 hours with stirring. Then water and dichloromethane were added for extraction, and the lower organic solution was collected, concentrated with distillation under reduced pressure, then purified by silica gel with a mixed solvent of petroleum ether and ethyl acetate in a ratio of 20:1. The most red component was collected, and the fraction was concentrated under reduced pressure, and recrystallized by adding appropriate amount of ethanol to obtain orange red compound c-Ir-1 (with a yield of 25%).

Synthesis of Comparative Example 2: Synthesis of Complex c-Ir-2

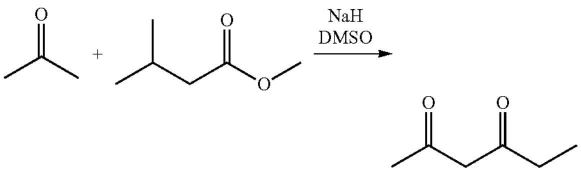

G

Synthesis of Intermediate G

A dry 250 ml flask was vacuumed and filled with nitrogen repeatedly for three times, and then sodium hydrogen (20 g, 5 eq), DMSO (150 mL), and methyl isovalerate (16.3 g, 1 eq) were added in order. The mixture was stirred at room temperature for 40 minutes, then acetone (7.26 g, 0.7 eq) was slowly added, and the mixture was heated to 60° C. and reacted for 4 hours, then the reaction was completed. Then ice water (1000 mL) was slowly added to quench the remaining sodium hydrogen. The reaction solution was then extracted three times with the addition of PE (1000 mL), and concentrated to obtain a red-brown liquid, which was then distilled to obtain a transparent liquid intermediate G (with a yield of 20%).

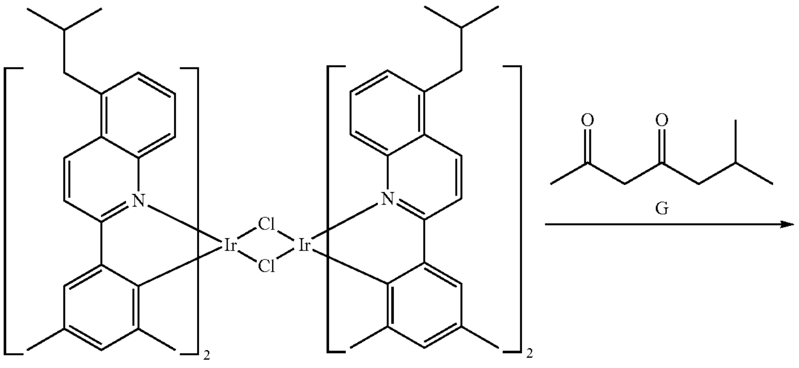

C

G

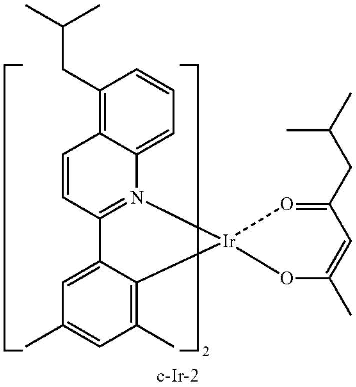

c-Ir-2

Synthesis of Complex c-Ir-2

Under an atmosphere filled with nitrogen, intermediate C (4.00 g, 1 eq), intermediate G (2.5 g, 10 eq) and potassium carbonate (6.86 g, 20 eq) were placed into a 100 mL three-neck flask, and then ethylene glycol ethyl ether (10 mL) was added. The mixture was stirred at 120° C. for 24 hours. Then water and dichloromethane were added for extraction, and the lower organic solution was collected, concentrated with distillation under reduced pressure, then purified by silica gel with a mixed solvent of petroleum ether and ethyl acetate in a ratio of 20:1. The most red component was collected, and the fraction was concentrated under reduced pressure, and recrystallized by adding appropriate amount of ethanol to obtain orange red compound c-Ir-2 (with a yield of 53%).

3. Photophysical Properties of Complexes

As shown in the FIGURE, it can be seen from the PL spectra of Ir-47, Ir-52, c-Ir-2 and c-Ir-3 in dichloromethane solution, the spectra of all complexes exhibit narrow emission with a maximum peak of the emission spectrum between 550 nm and 650 nm, indicating that such complexes are suitable for red-emitting electronic devices. The maximum luminescent spectrum and half peak width of each example material are listed in Table 2:

TABLE 2

| Materials | $\lambda_{MAX}$/nm | FWHM/nm |
|---|---|---|
| Ir-47 | 613 | 43 |
| Ir-52 | 616 | 42 |
| c-Ir-1 | 607 | 32 |
| c-Ir-2 | 614 | 46 |
| c-Ir-3 | 610 | 40 |

4. Preparation and Characterization of OLED Devices

Preparation steps of OLED devices with a structure of ITO/NPD(60 nm) 15% dopant (for example, Ir-1, Ir-47, Ir-52, c-Ir-1, c-Ir-2, or c-Ir-3): mCP (45 nm)/TPBi (35 nm)/LiF (1 nm)/A1 (150 nm)/cathode are as follows:

a. Cleaning of conductive glass substrate: when it was used for the first time, the conductive glass substrate may be cleaned with various solvents such as chloroform, ketone and isopropanol, and then ultraviolet ozone treatment and plasma treatment were performed;

b. HTL (60 nm), EML(45 nm) and ETL (35 nm) were formed by thermal evaporation in high vacuum ($1\times10^{-6}$ mbar);

c. Cathode: LiF/Al (1 nm/150 nm) was formed by thermal evaporation in high vacuum ($1\times10^{-6}$ mbar);

d. Encapsulating: the device was encapsulated with UV-curable resin in a glove box filled with nitrogen gas.

OLED1: EML material is 15% Ir-1: mCP (45 nm); 15% Ir-1 represents 15% wt of Ir-1 in EML material.

OLED2: EML material is 15% Ir-47: mCP (45 nm); 15% Ir-47 represents 15% wt of Ir-47 iii EML material.

OLED3: EML material is 15% Ir-52: mCP (45 nm); 15% Ir-52 represents 15% wt of Ir-52 in EML material.

OLED4: EML material is 15% c-Ir-1: mCP (45 nm); 15% c-Ir-1 represents 15% wt of c-Ir-1 in EML material.

OLED5: EML material is 15% c-Ir-2: mCP (45 nm); 15% c-Ir-2 represents 15% wt of c-Ir-2 in EML material.

OLED6: EML material is 15% c-Ir-3: mCP (45 nm); 15% c-Ir-3 represents 15% wt of c-Ir-3 in EML material.

The current-voltage-luminance (JVL) characteristics of the OLED devices are characterized by characterization equipment and important parameters such as efficiency and external quantum efficiency are recorded. After detection, compared with the phosphorescent dopants c-Ir-1, c-Ir-2 and c-Ir-3, parameters such as relative external quantum efficiency and lifetime of the OLED devices prepared from Ir-1, Ir-47 and Ir-52 are shown in Table 3 and Table 4:

TABLE 3

| Relative external quantum efficiency data | |
|---|---|
| Dopants of OLED devices | Relative external quantum efficiency |
| Ir-1 | 108% |
| Ir-47 | 110% |
| Ir-52 | 115% |
| c-Ir-1 | 100% |
| c-Ir-2 | 105% |
| c-Ir-3 | 106% |

TABLE 4

| Relative lifetime parameters of devices | |
|---|---|
| Dopants of OLED devices | Relative lifetime of devices |
| Ir-1 | 98% |
| Ir-47 | 105% |
| Ir-52 | 108% |
| c-Ir-1 | 100% |
| c-Ir-2 | 105% |
| c-Ir-3 | 103% |

Further optimization, such as optimization of device structure, optimization of the combination of HTM, ETM and host materials can further improve the properties of the device, especially efficiency, driving voltage and lifetime.

The technical features of the embodiments described above may be arbitrarily combined. For the sake of brevity of description, not all possible combinations of the technical features in the aforementioned embodiments are described. However, as long as there is no contradiction between the combinations of these technical features, all should be considered as the scope of this specification.

The above embodiments only represent several examples of the present invention, and the description thereof is more specific and detailed, but it should not be construed as restricting the scope of the present invention. It should be understood that, the applications of the present disclosure are not limited to the above-described examples, and those skilled in the art can make modifications and changes in accordance with the above description, all of which are within the protection scope of the present disclosure. Therefore, the protection scope of the present disclosure shall be defined by the appended claims.

The invention claimed is:

1. A transition metal complex having a general structural formula represented by Chemical Formula (1):

Chemical Formula (1)

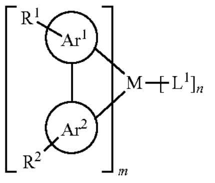

wherein:

M is selected from the group consisting of iridium, ruthenium, gold, platinum, chromium, molybdenum, rhodium, osmium, rhenium, nickel, copper, silver, zinc, tungsten and palladium;

m is selected from 1 or 2;

$L^1$ is an auxiliary ligand coordinated to the M; when a plurality of $L^1$ exist, the plurality of $L^1$ are the same or different from each other, wherein $L^1$ has a structure represented by Chemical Formula (2):

Chemical Formula (2)

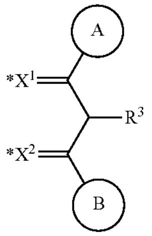

wherein, * shown in the Chemical Formula (2) represents the points bonding to the M;

$X^1$ and $X^2$ are each bonded to the M; $X^1$ and $X^2$ are each independently selected from oxygen atom, sulfur atom, nitrogen atom or phosphorus atom;

A and B are each independently selected from the groups consisting of

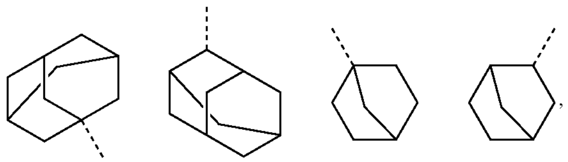

wherein the dashed bond shown in the groups represents the bonding to the carbon atom of the double bond in the Chemical Formula (2);

n is 1 or 2;

when a plurality of $Ar^1$ exist, the plurality of $Ar^1$ are the same or different from each other; the $Ar^1$ is selected from the group consisting of an aromatic group containing 5 to 20 ring atoms, a heteroaromatic group containing 5 to 20 ring atoms, and a non-aromatic group containing 5 to 20 ring atoms; the $Ar^1$ is substituted by one or a plurality of $R^1$ groups, and when the $Ar^1$ is substituted by the plurality of $R^1$ groups, the plurality of $R^1$ groups are the same or different from each other;

when a plurality of $Ar^2$ exist, the plurality of $Ar^2$ are the same or different from each other; the $Ar^2$ is selected from the group consisting of an aromatic ring system containing 5 to 20 ring atoms, a heteroaromatic ring system containing 5 to 20 ring atoms, and a non-aromatic ring system containing 5 to 20 ring atoms; the $Ar^2$ is substituted by one or a plurality of $R^2$ groups, and when the $Ar^2$ is substituted by the plurality of $R^2$ groups, the plurality of $R^2$ groups are the same or different from each other;

$R^1$ and $R^2$ are each independently selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group; and $R^3$ is selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group.

2. A transition metal complex having a general structural formula represented by Chemical Formula (1):

Chemical Forumla (I)

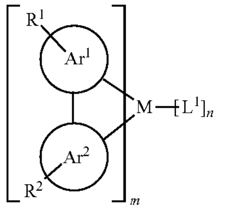

wherein:

M is selected from the group consisting of iridium, ruthenium, gold, platinum, chromium, molybdenum, rhodium, osmium, rhenium, nickel, copper, silver, zinc, tungsten and palladium;

m is selected from 1 or 2;

$L^1$ is an auxiliary ligand coordinated to the M; when a plurality of $L^1$ exist, the plurality of $L^1$ are the same or different from each other; wherein $L^1$ has a structure represented by Chemical Formula (3):

Chemical Formula (3)

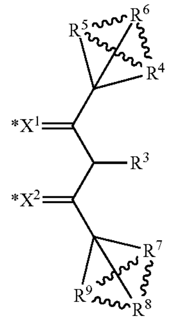

wherein, * shown in the Chemical Formula (3) represents the points bonding to the M; $R^4$, $R^5$, $R^6$, $R^7$, $R^8$ and $R^9$ are each independently selected from the group consisting of a linear alkane containing 1 to 20 carbon atoms, a branched alkane containing 1 to 20 carbon atoms, a linear alkene containing 1 to 20 carbon atoms, a branched alkene containing 1 to 20 carbon atoms, and an alkane ether containing 1 to 6 carbon atoms;

at least two of $R^4$, $R^5$, and $R^6$ bridge each other; at least two of $R^7$, $R^8$, and $R^9$ bridge each other;

$X^1$ and $X^2$ are each bonded to the M; $X^1$ and $X^2$ are each independently selected from oxygen atom, sulfur atom, nitrogen atom or phosphorus atom;

$R^3$ is selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group;

n is 1 or 2;

when a plurality of $Ar^1$ exist, the plurality of $Ar^1$ are the same or different from each other; the $Ar^1$ is selected from the group consisting of an aromatic group containing 5 to 20 ring atoms, a heteroaromatic group containing 5 to 20 ring atoms, and a non-aromatic group containing 5 to 20 ring atoms; the $Ar^1$ is substituted by one or a plurality of $R^1$ groups, and when the $Ar^1$ is substituted by the plurality of $R^1$ groups, the plurality of $R^1$ groups are the same or different from each other;

when a plurality of $Ar^2$ exist, the plurality of $Ar^2$ are the same or different from each other; the $Ar^2$ is selected from the group consisting of an aromatic ring system containing 5 to 20 ring atoms, a heteroaromatic ring system containing 5 to 20 ring atoms, and a non-aromatic ring system containing 5 to 20 ring atoms; the $Ar^2$ is substituted by one or a plurality of $R^2$ groups, and when the $Ar^2$ is substituted by the plurality of $R^2$ groups, the plurality of $R^2$ groups are the same or different from each other; and $R^1$ and $R^2$ are each independently selected from the group consisting of hydrogen, deuterium, halogen atom, a linear alkane substituent containing 1 to 20 carbon atoms, a branched alkane substituent containing 1 to 20 carbon atoms, a linear alkene substituent containing 1 to 20 carbon atoms, a branched alkene substituent containing 1 to 20 carbon atoms, an alkane ether substituent containing 1 to 20 carbon atoms, an aromatic group, a heteroaromatic group and a non-aromatic group.

3. The transition metal complex according to claim 2, wherein any two of $R^4$, $R^5$, and $R^6$ bridge each other; any two of $R^7$, $R^8$, and $R^9$ bridge each other.

4. The transition metal complex according to claim 2, wherein the $Ar^1$ has a structure represented by any one of the following structural formulas:

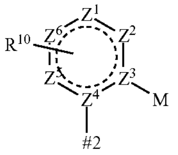
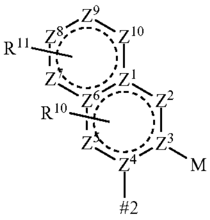
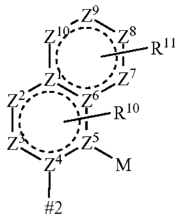
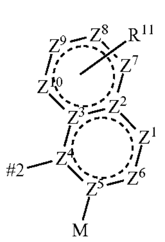
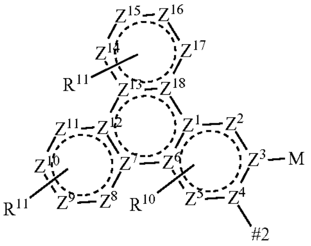
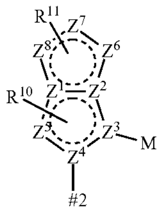
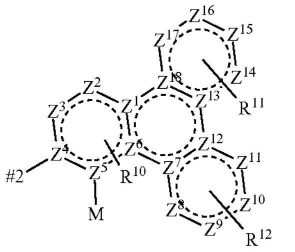
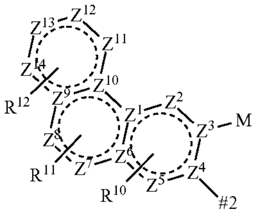
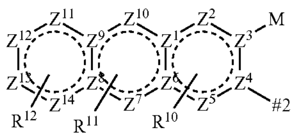
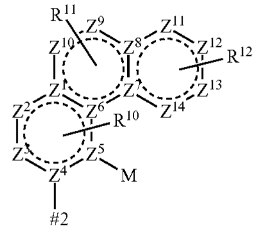
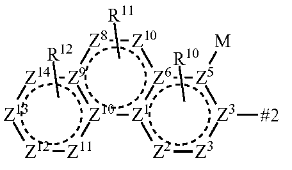
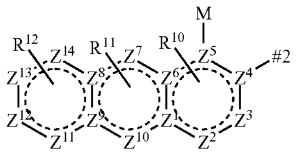
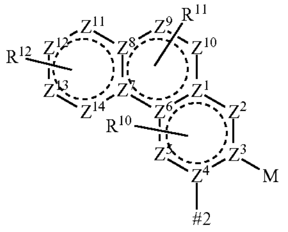

-continued

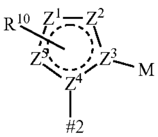
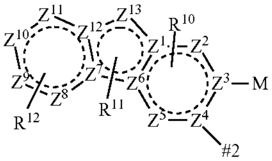
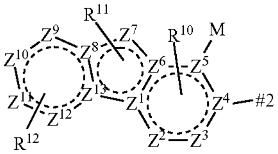
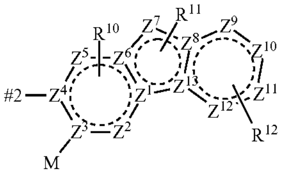
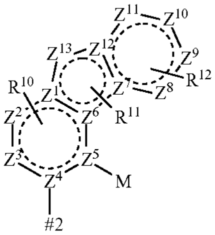
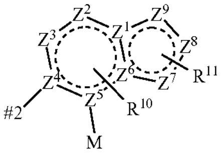
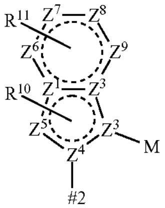
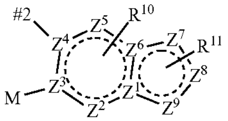

wherein, #2 represents a bonding to any position of the $Ar^2$ in the Chemical Formula (1);

$Z^1$-$Z^{18}$ are each independently selected from the group consisting of carbon atom, nitrogen atom, oxygen atom, silicon atom, boron atom, sulfur atom and phosphorus atom;

$R^{10}$, $R^{11}$ and $R^{12}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

5. The transition metal complex according to claim 2, wherein the $Ar^2$ has a structure represented by any one of the following structural formulas:

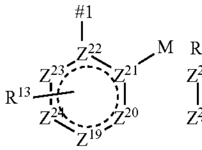
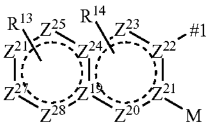
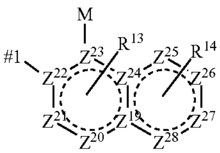
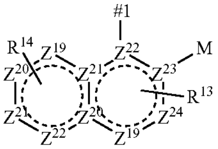

-continued

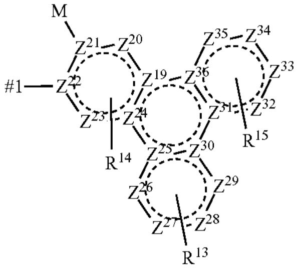
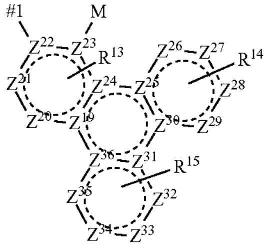
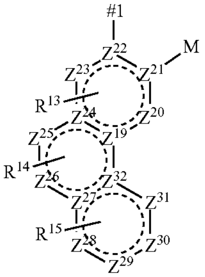
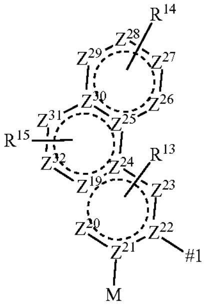
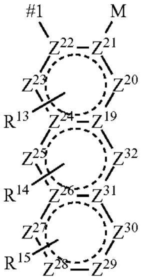
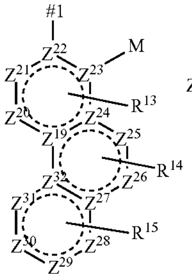
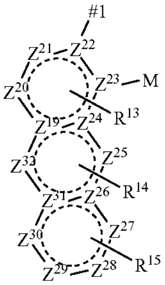
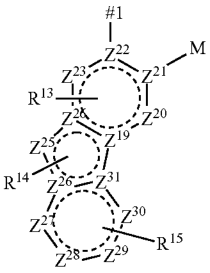
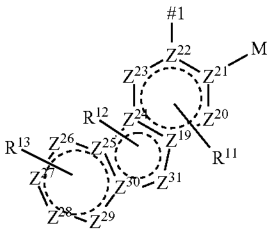
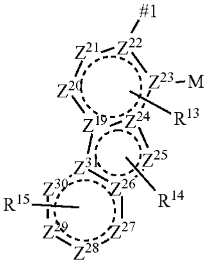
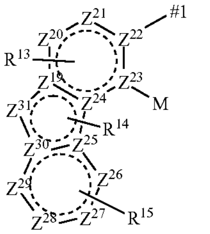
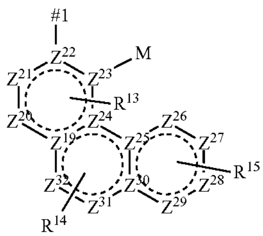
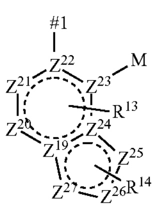
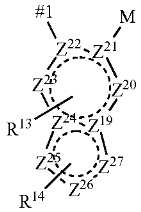

-continued

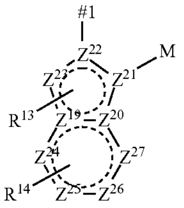

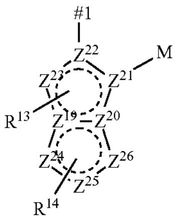

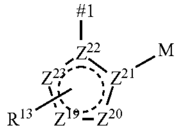

wherein, #1 represents a bonding to any position of the $Ar^1$ in the Chemical Formula (1);

$Z^{19}$-$Z^{36}$ are each independently selected from the group consisting of carbon atom, nitrogen atom, oxygen atom, silicon atom, boron atom, sulfur atom and phosphorus atom;

$R^{13}$, $R^{14}$ and $R^{15}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

6. The transition metal complex according to claim 2, having a structure represented by any one of Chemical Formula (I-1) to Chemical Formula (I-12):

Chemical Formula (I-1)

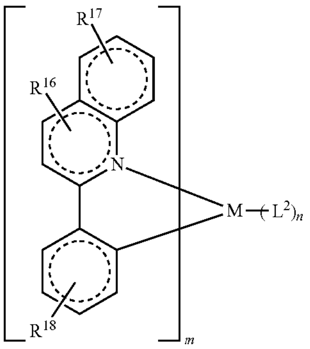

Chemical Formula (I-2)

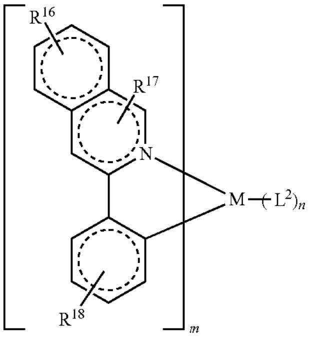

-continued (Chemical Formula (I-3)

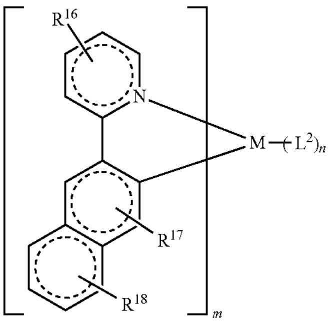

Chemical Formula (I-4)

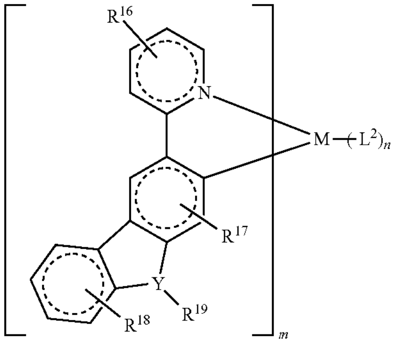

Chemical Formula (I-5)

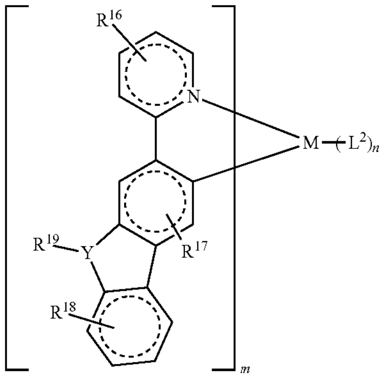

Chemical Formula (I-6)

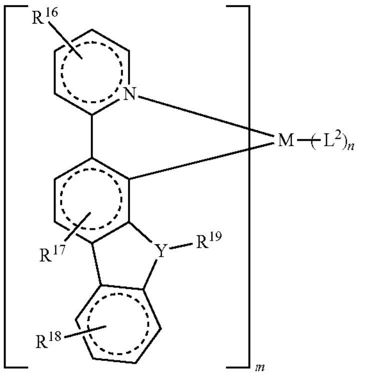

-continued

Chemical Formula (I-7)

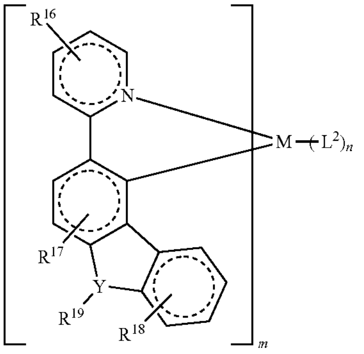

Chemical Formula (I-8)

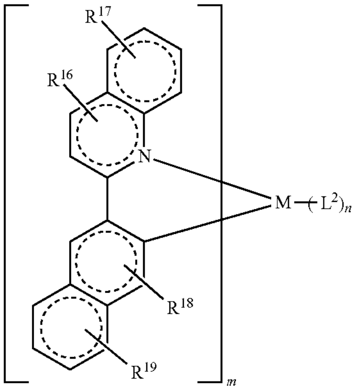

Chemical Formula (I-9)

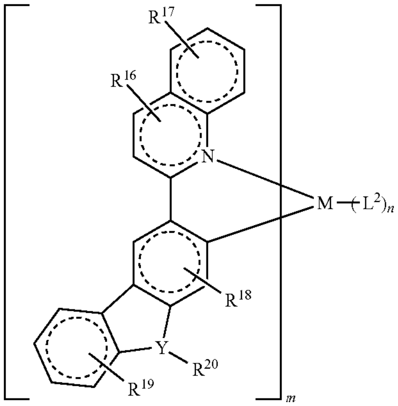

-continued

Chemical Formula (I-10)

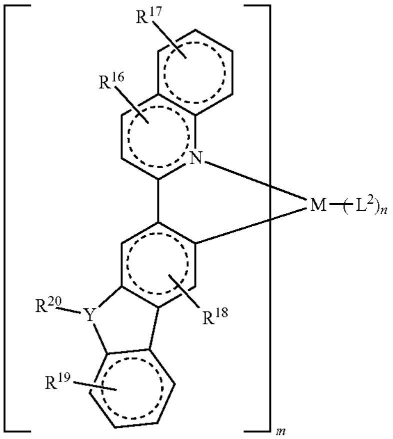

Chemical Formula (I-11)

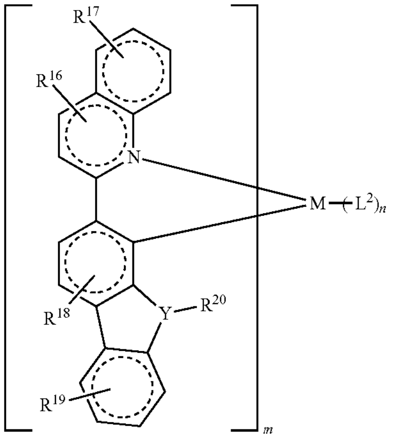

Chemical Formula (I-12)

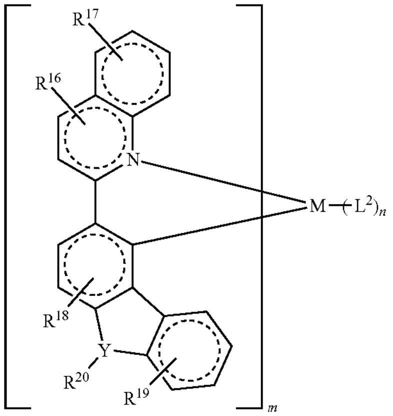

wherein, m is 1 or 2;

n is 1 or 2;

$L^2$ has the same definition as $L^1$;

Y is a two-bridge group containing at least one nitrogen atom, oxygen atom, carbon atom, silicon atom, boron atom, sulfur atom or phosphorus atom;

$R^{16}$, $R^{17}$, $R^{18}$, $R^{19}$ and $R^{20}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

7. The transition metal complex according to claim 1, having a structure represented by Chemical Formula (I-13):

Chemical Formula (I-13)

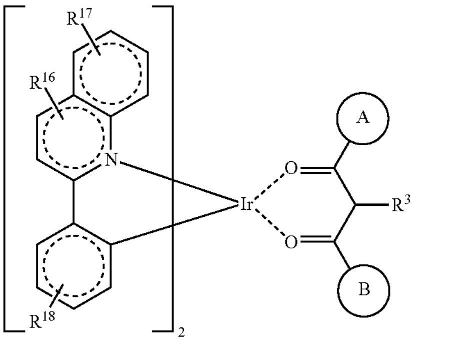

wherein R16, R17 and R18 are each independently selected from H, C1-C6 alkyl or silicyl, and R3 is independently selected from H or C1-C6 alkyl.

8. A transition metal mixture comprising at least the transition metal complex of claim 2 and at least one organic functional material selected from the group consisting of hole injection materials, hole transport materials, electron transport materials, electron injection materials, electron blocking materials, hole blocking materials, emitters, host materials, and doping materials.

9. An organic electronic device comprising the transition metal complex of claim 2.

10. The transition metal complex according to claim 1, wherein the $Ar^1$ has a structure represented by any one of the following structural formulas:

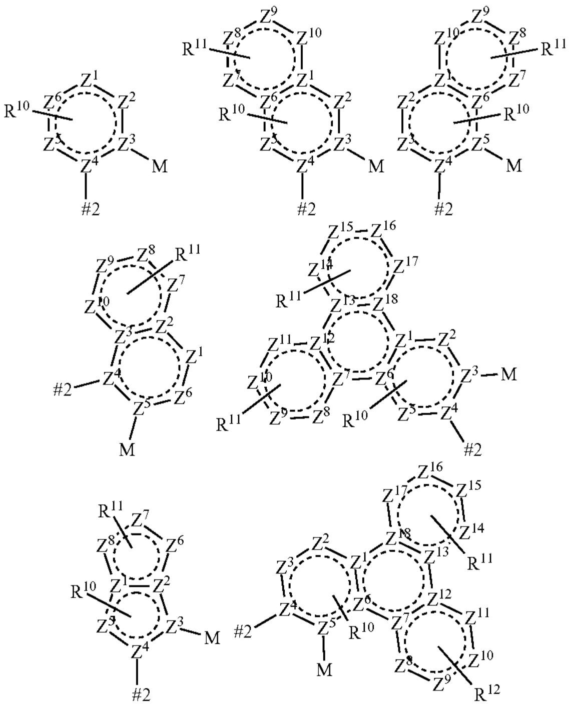

-continued

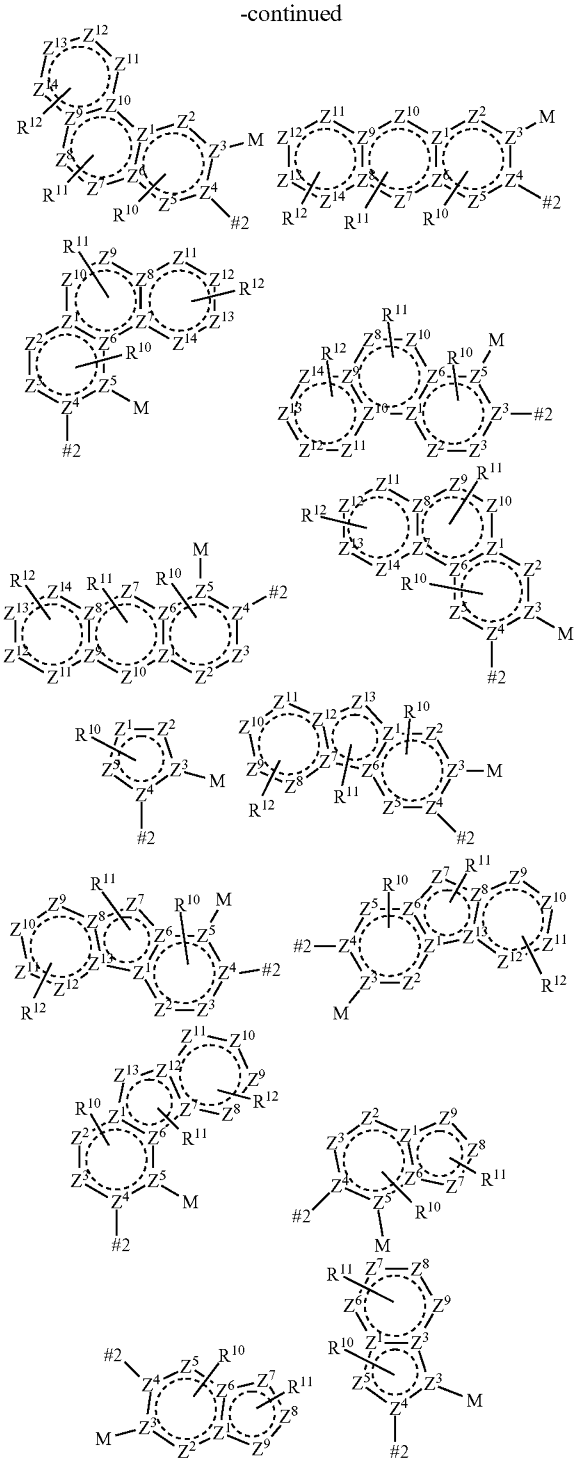

wherein, #2 represents a bonding to any position of the $Ar^2$ in the Chemical Formula (1);

$Z^1$-$Z^{18}$ are each independently selected from the group consisting of carbon atom, nitrogen atom, oxygen atom, silicon atom, boron atom, sulfur atom and phosphorus atom; and $R^{10}$, $R^{11}$ and $R^{12}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

11. The transition metal complex according to claim 1, wherein the $Ar^2$ has a structure represented by any one of the following structural formulas:

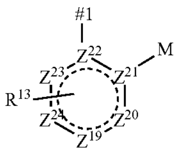
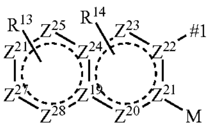
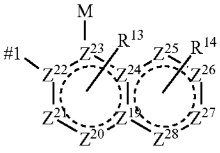
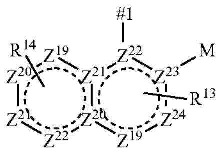
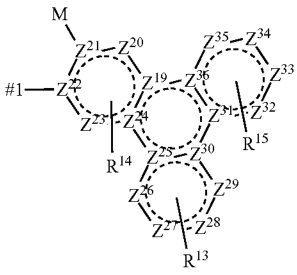
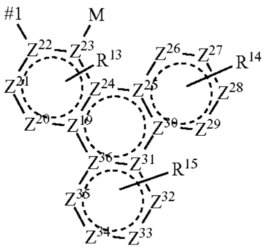
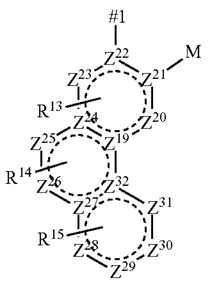
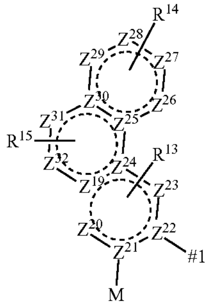
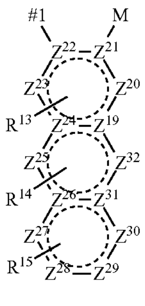
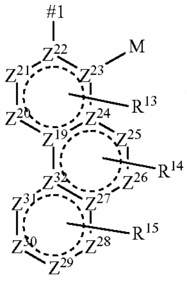
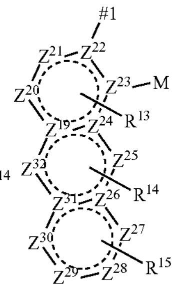
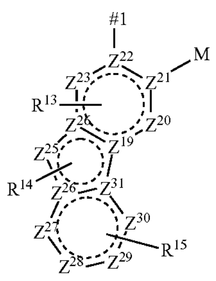
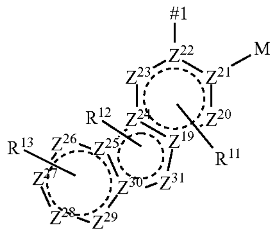

-continued

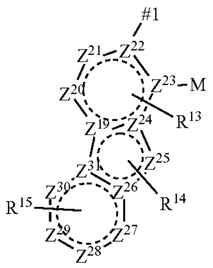
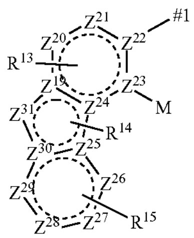
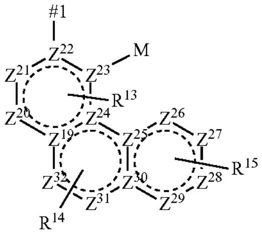
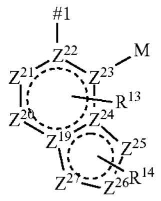
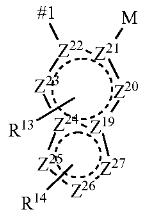
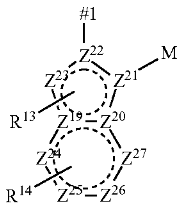
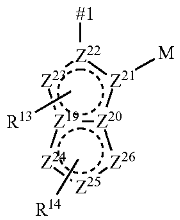
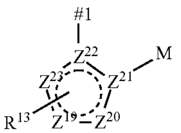

wherein, #1 represents a bonding to any position of the $Ar^1$ in the Chemical Formula (1);

$Z^{19}$-$Z^{36}$ are each independently selected from the group consisting of carbon atom, nitrogen atom, oxygen atom, silicon atom, boron atom, sulfur atom and phosphorus atom; and $R^{13}$, $R^{14}$ and $R^{15}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

12. The transition metal complex according to claim 1, having a structure represented by any one of Chemical Formula (I-1) to Chemical Formula (I-12):

Chemical Formula (I-1)

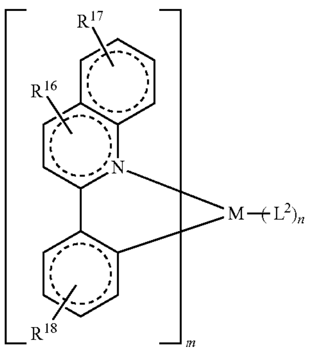

-continued
Chemical Formula (I-2)
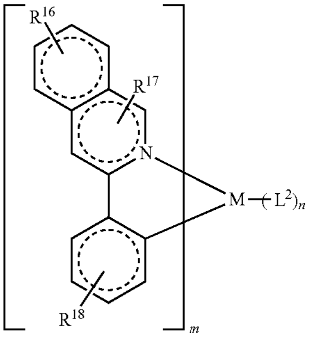
(Chemical Formula (I-3)
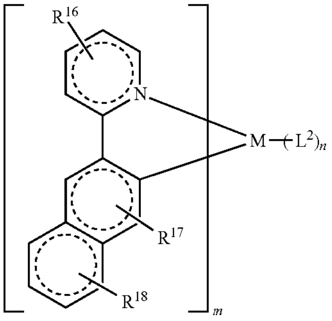
Chemical Formula (I-4)
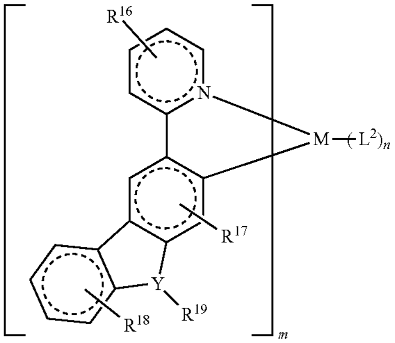
Chemical Formula (I-5)
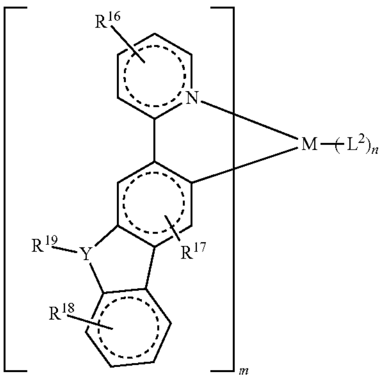
-continued
Chemical Formula (I-6)
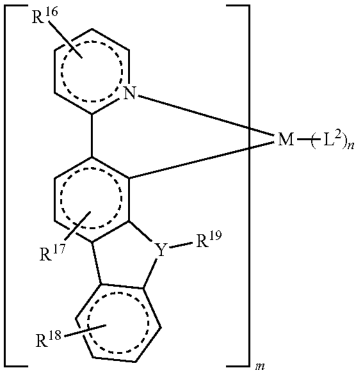
Chemical Formula (I-7)
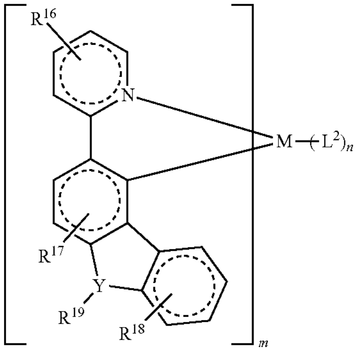
Chemical Formula (I-8)
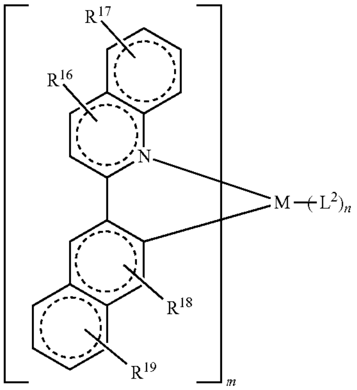
Chemical Formula (I-9)
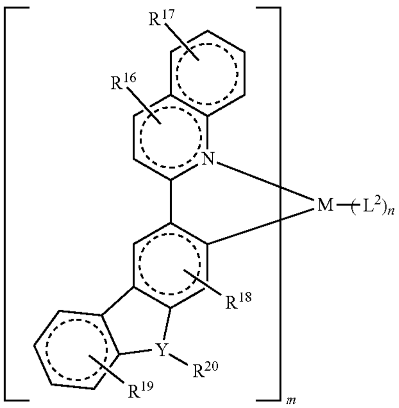

-continued

Chemical Formula (I-10)

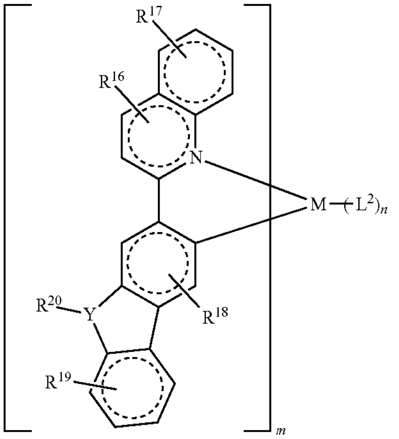

Chemical Formula (I-11)

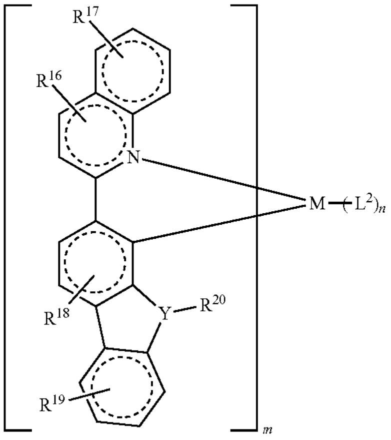

Chemical Formula (I-12)

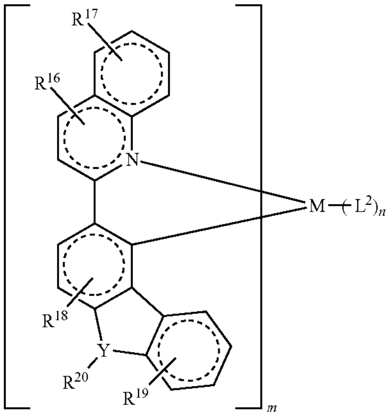

wherein, m is 1 or 2;

n is 1 or 2;

$L^2$ has the same definition as $L^1$;

Y is a two-bridge group containing at least one nitrogen atom, oxygen atom, carbon atom, silicon atom, boron atom, sulfur atom or phosphorus atom;

$R^{16}$, $R^{17}$, $R^{18}$, $R^{19}$ and $R^{20}$ are each independently selected from the group consisting of hydrogen, deuterium, a halogen atom, a linear alkane substituent, a branched alkane substituent, a linear alkene substituent, a branched alkene substituent, an alkane ether substituent, an aromatic group, a heteroaromatic group and a non-aromatic group.

13. The transition metal complex according to claim 4, wherein the $Ar^1$ has a structure represented by any one of the following structural formulas:

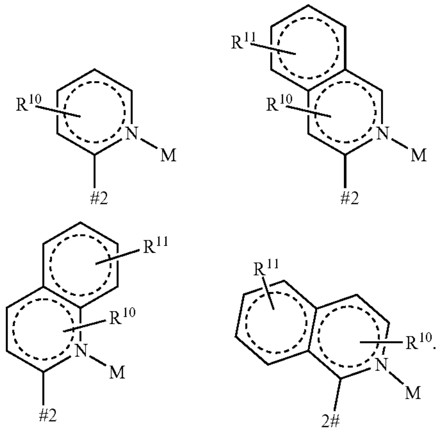

14. The transition metal complex according to claim 5, wherein the $Ar^2$ has a structure represented by any one of the following structural formulas:

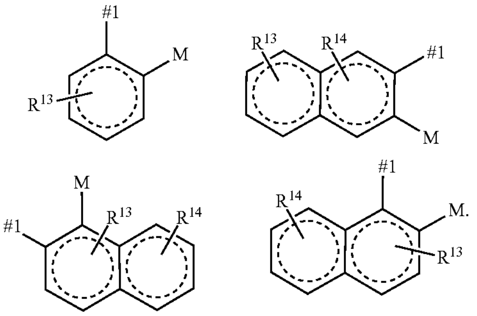

15. The transition metal complex according to claim 7, having a structure represented by following Formula:

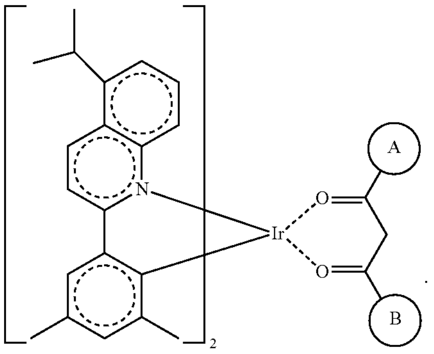

16. The transition metal complex according to claim 10, wherein the $Ar^1$ has a structure represented by any one of the following structural formulas:

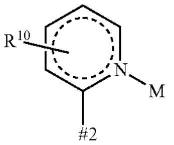

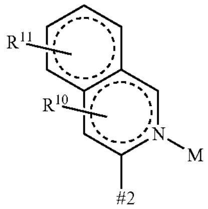

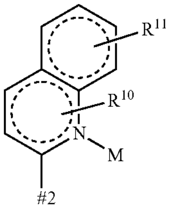

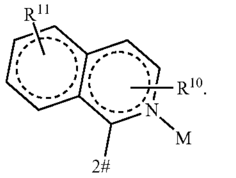

17. The transition metal complex according to claim 11, wherein the $Ar^2$ has a structure represented by any one of the following structural formulas:

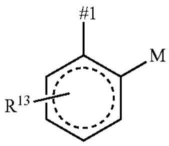

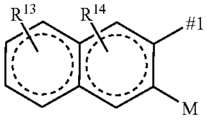

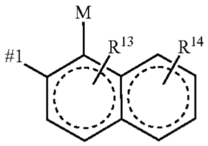

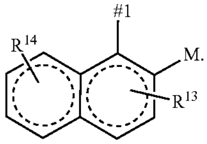

18. A transition metal mixture comprising at least the transition metal complex of claim 1 and at least one organic functional material selected from the group consisting of hole injection materials, hole transport materials, electron transport materials, electron injection materials, electron blocking materials, hole blocking materials, emitters, host materials, and doping materials.

19. An organic electronic device comprising the transition metal complex of claim 1.

* * * * *